US011493476B2

(12) United States Patent
Balijepalli et al.

(10) Patent No.: US 11,493,476 B2
(45) Date of Patent: Nov. 8, 2022

(54) CHARGE DETECTOR AND PROCESS FOR SENSING A CHARGED ANALYTE

(71) Applicant: Government of the United States of America, as represented by the Secretary of Commerce, Gaithersburg, MD (US)

(72) Inventors: Arvind Kumar Balijepalli, Washington, DC (US); Curt Andrew Richter, Olney, MD (US); Son Truong Le, Germantown, MD (US); John S. Suehle, Baltimore, MD (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 358 days.

(21) Appl. No.: 16/867,590

(22) Filed: May 6, 2020

(65) Prior Publication Data

US 2020/0264129 A1   Aug. 20, 2020

Related U.S. Application Data

(63) Continuation of application No. 16/220,866, filed on Dec. 14, 2018, now abandoned, which is a continuation-in-part of application No. 15/452,810, filed on Mar. 8, 2017, now abandoned.

(Continued)

(51) Int. Cl.
*G01N 27/414* (2006.01)
*G01N 27/62* (2021.01)
(Continued)

(52) U.S. Cl.
CPC .... *G01N 27/4145* (2013.01); *B01L 3/502715* (2013.01); *G01N 27/62* (2013.01); *H01L 29/1029* (2013.01); *H01L 29/16* (2013.01)

(58) Field of Classification Search
None
See application file for complete search history.

(56) References Cited

U.S. PATENT DOCUMENTS

| 4,853,639 | A  | 8/1989 | Vosteen et al. |
| 7,053,439 | B2 | 5/2006 | Kan et al. |

(Continued)

FOREIGN PATENT DOCUMENTS

CN          103095369          6/2017

OTHER PUBLICATIONS

Ma, N. et al., "Carrier statistics and quantum capacitance effects on mobility extraction in two-dimensional crystal semiconductor field-effect transistors", 2D Materials, 2015, p. 015003, vol. 2.

(Continued)

*Primary Examiner* — Xiaoyun R Xu
(74) *Attorney, Agent, or Firm* — Office of Chief Counsel for National Institute of Standards and Technology

(57) ABSTRACT

A charge detector includes: a charge sensor that senses a charged analyte and produces a charge signal in response to contact with the charged analyte; a transducer in electrical communication with the charge sensor and that: receives the charge signal from the charge sensor, receives a feedback control signal; and produces a transduction signal in response to receipt of the charge signal and the feedback control signal; and a sensitivity controller in electrical communication with the transducer and that: receives the transduction signal from the transducer; produces the feedback control signal in response to receipt of the transduction signal from the transducer; and produces a charge readout in response to receipt of the transduction signal from the transducer.

14 Claims, 71 Drawing Sheets

Related U.S. Application Data

(60) Provisional application No. 62/307,406, filed on Mar. 11, 2016.

(51) Int. Cl.
  *H01L 29/10* (2006.01)
  *B01L 3/00* (2006.01)
  *H01L 29/16* (2006.01)

(56) References Cited

U.S. PATENT DOCUMENTS

| | | | |
|---|---|---|---|
| 2004/0029310 | A1 | 2/2004 | Bernds et al. |
| 2006/0038222 | A1 | 2/2006 | Kan et al. |
| 2011/0215314 | A1 | 9/2011 | De Leeuw et al. |
| 2016/0178569 | A1 | 6/2016 | Hoffman et al. |

OTHER PUBLICATIONS

Perera, M.M., et al., "Improved Carrier Mobility in Few-Layer MoS2 Field-Effect Transistors with Ionic-Liquid Gating", ACS Nano, 2013, p. 4449-4458, vol. 7, No. 5.

Wu, T., et al., "Experimental Study of the Detection Limit in Dual-Gate Biosensors Using Ultrathin Silicon Transistors", ACS Nano, 2017, p. 7142-7147, vol. 11.

Rothberg, J.M.,et al., "An integrated semiconductor device enabling non-optical genome sequencing", Nature, 2011, p. 348-352, vol. 475.

Chu, L., et al., "Charge transport in ion-gated mono-, bi-, and trilayer MoS2 field effect transistors", Scientific Reports, 2014, p. 7293, vol. 4.

Bhalla, N., et al., "Protein phosphorylation detection using dual-mode field-effect devices and nanoplasmonic sensors", Scientific Reports, 2015, p. 8687, vol. 5.

Xie, P., et al., "Local electrical potential detection of DNA by nanowire-nanopore sensors", Nature Nanotechnology, 2011, p. 119-125, vol. 7.

Late, D.,et al., "Sensing behavior of atomically thin-layered mos2 transistors", ACS Nano, 2013, p. 4879-4891, vol. 7 No. 6.

Sarkar, D., et al., "A subthermionic tunnel field-effect transistor with an atomically thin channel", Nature, Oct. 2015, p. 91-95, vol. 526.

Sarkar, D., et al., "Mos2 field-effect transistor for next-generation label-free biosensors", ACS Nano, 2014, A-L.

Sarkar, D.,et al., "Proposal for tunnel-field-effect-transistor as ultra-sensitive and label-free biosensors", Applied Physics Letters, 2012, p. 143108-143108-4, vol. 100.

Margulies, M., et al., "Genome sequencing in microfabricated high-density picolitre reactors", Nature, 2005, p. 376-380, vol. 437.

Jimenez-Jorquera, C., et al., "ISFET vased microsensors for enviromental monitoring", Sensors, 2009, p. 61-83.

Tarasov, A., et al., "Gold-coated graphene field-effect transistors for quantitative analysis of protein-antibody interactions", 2D Mater, 2015, p. 1-7.

Komsa, H., et al., "Two-Dimensional Transition Metal Dichalcogenide Alloys: Stability and Electronic Properties", 2012, The Journal of Physical Chemistry Letters, p. 3652-3656, vol. 3.

(A) 246

(B) 246

(A)  246

(B)  246

(A) 246

(B) 246

(A)

(B)

(A)

(B)

(A)

(B)

(C)

(A)

VG1 < VG2 < VG3

(B)

VD1 < VD2 < VD3

CHARGE DETECTOR AND PROCESS FOR SENSING A CHARGED ANALYTE

CROSS REFERENCE TO RELATED APPLICATIONS

This application is a continuation application of U.S. patent application Ser. No. 16/220,866, filed Dec. 14, 2018, which is a continuation-in-part of U.S. patent application Ser. No. 15/452,810, filed Mar. 8, 2017, that claims the benefit of U.S. Provisional Patent Application No. 62/307,406, filed Mar. 11, 2016, the disclosure of each of which is incorporated herein by reference in their entirety.

STATEMENT REGARDING FEDERALLY SPONSORED RESEARCH

This invention was made with United States Government support from the National Institute of Standards and Technology (NIST), an agency of the United States Department of Commerce. The Government has certain rights in the invention. Licensing inquiries may be directed to the Technology Partnerships Office, NIST, Gaithersburg, Md., 20899; voice (301) 301-975-2573; email tpo@nist.gov; reference NIST Docket Number 19-003CON 1.

BRIEF DESCRIPTION

Disclosed is a charge detector to operate a dual-gated field effect transistor at a quantum capacitance limit for performing ultrasensitive biosensing, the charge detector comprising: a charge sensor that senses a charged analyte and produces a charge signal in response to contact with the charged analyte; a transducer in electrical communication with the charge sensor and that: receives the charge signal from the charge sensor, receives a feedback control signal; and produces a transduction signal in response to receipt of the charge signal and the feedback control signal; and a sensitivity controller in electrical communication with the transducer and that: receives the transduction signal from the transducer; produces the feedback control signal in response to receipt of the transduction signal from the transducer; and produces a charge readout in response to receipt of the transduction signal from the transducer.

Disclosed is a process for sensing a charged analyte, the process comprising: contacting the charge sensor with the charged analyte; producing, by the charge sensor, the charge signal; communicating the charge signal from the charge sensor to the transducer, receiving, by the transducer, the charge signal from the charge sensor, receiving, by the transducer, the feedback control signal from the sensitivity controller; producing, by the transducer, the transduction signal in response to receipt of the charge signal; receiving, by the sensitivity controller, the transduction signal from the transducer; and producing, by the sensitivity controller, the charge readout in response to receipt of the transduction signal to sense the charged analyte.

Disclosed is a dual gate field effect transistor to sense an analyte, the dual gate field effect transistor comprising: an analyte gate; a transition metal dichalcogenide layer disposed on the analyte gate and comprising a transition metal dichalcogenide; a source electrode disposed on the two-dimensional active layer and in electrical communication with the two-dimensional active layer; a drain electrode disposed on the two-dimensional active layer and in electrical communication with the two-dimensional active layer and in electrical communication with the source electrode via the two-dimensional active layer; and a control gate disposed on the two-dimensional active layer and controlling the communication of electrical current in the two-dimensional active layer between the source electrode and the drain electrode, wherein the electrical current communicated in the two-dimensional active layer is changed in response to a change in an electrical charge present at the analyte gate due to the analyte.

Also disclosed is a process for sensing an analyte, the process comprising: providing the dual gate field effect transistor; subjecting the source electrode and the drain electrode with a first potential difference comprising a drain voltage; subjecting the control gate with a gate voltage; and monitoring a drain current to sense a presence of the analyte at the analyte gate.

BRIEF DESCRIPTION OF THE DRAWINGS

The following descriptions should not be considered limiting in any way. With reference to the accompanying drawings, like elements are numbered alike.

DETAILED DESCRIPTION

Figure 1:
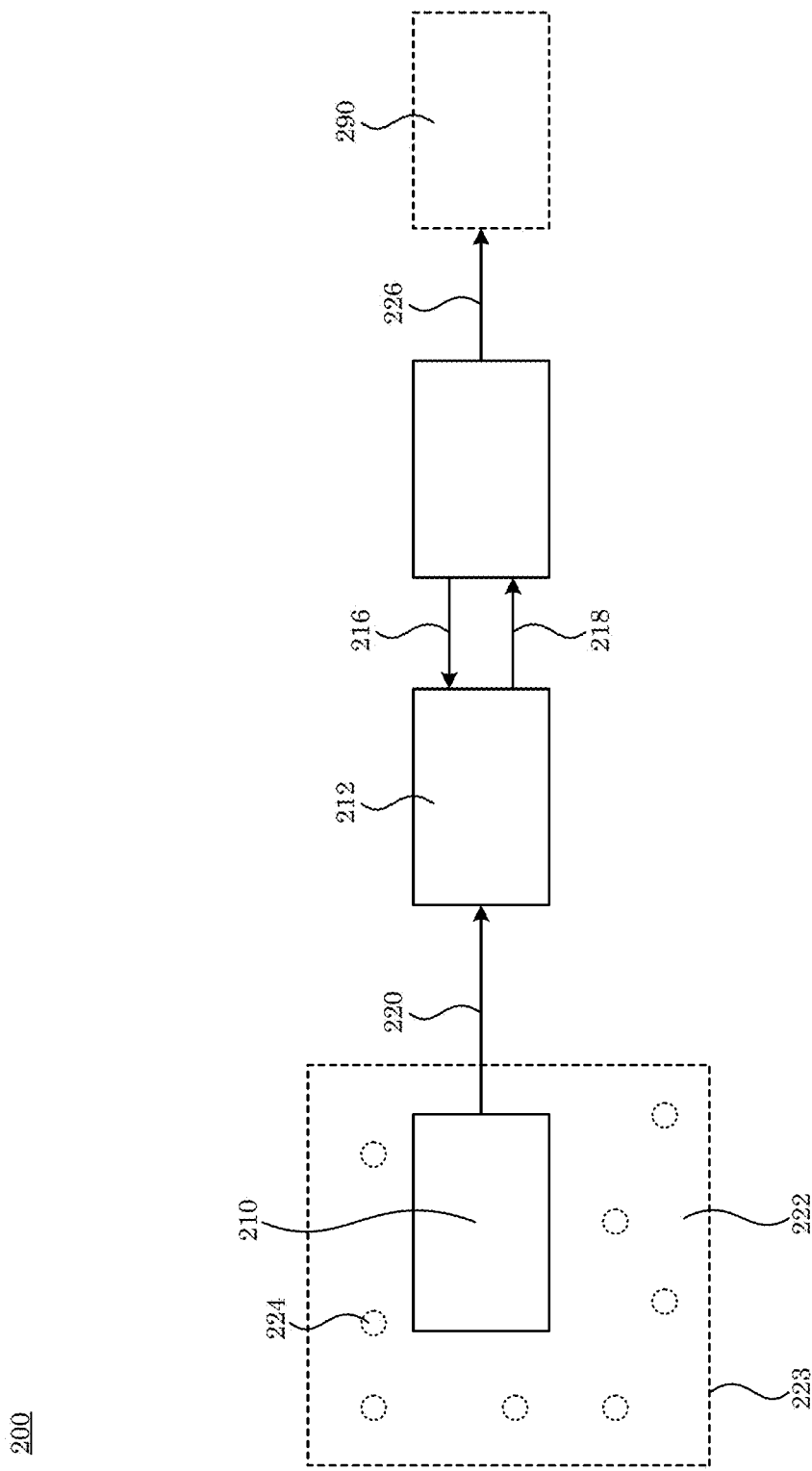
FIG. 1 shows a charge detector.

A detailed description of one or more embodiments is presented herein by way of exemplification and not limitation.

It has been discovered that a charge sensor provides an integrated system for chip-scale operation of a dual-gated field-effect transistor (FET) at a quantum capacitance limit and provides an ultrasensitive charge measurement for biophysics applications. The charge sensor improves performance of dual-gated FETs and can include gates with asymmetric capacitances such that a first gate, also referred to as a top gate, capacitance is greater than a second gate, also referred to as a back gate. For selected voltage bias applied to the gates, a voltage applied to the top gate is amplified at the back gate, e.g., can be amplified by 200×. Voltage amplification can be limited by an intrinsic quantum capacitance of a semiconducting channel of the dual gate FET. The charge sensor provides measurement of pH and charged analytes with a sensitivity greater than a Nernst value of 59 mV/pH and can be 100× greater than conventional devices. The charge sensor also provides measurement of an activity or kinetics during a biological process such as an enzyme catalyzed phosphorylation of a substrate protein. The charge sensor also provides measurement of the interaction of charged analytes such as charged biological molecules, e.g., a protein, DNA, and the like, and quantifies their function.

In an embodiment, with reference to FIG. 1, FIG. 2, FIG. 3, FIG. 4, FIG. 5, FIG. 6, FIG. 7, FIG. 8, and FIG. 9, charge detector 200 operates dual gate field effect transistor 246 at a quantum capacitance limit to perform ultrasensitive biosensing. Charge detector 200 includes charge sensor 210 that senses charged analyte 224 and produces charge signal 220 in response to contact with the charged analyte 224 and transducer 212 in electrical communication with charge sensor 210. Transducer 212 receives charge signal 220 from charge sensor 210; receives feedback control signal 216; and produces transduction signal 218 in response to receipt of charge signal 220 and feedback control signal 216. Charge detector 200 also includes sensitivity controller 214 in electrical communication with transducer 212. Sensitivity controller 214 receives transduction signal 218 from transducer 212; produces feedback control signal 216 in response to receipt of transduction signal 218 from transducer 212; and produces charge readout 226 in response to receipt of transduction signal 218 from transducer 212. It is contemplated that charged analyte 224 can be disposed in fluid 222. Also, charged analyte 224 or fluid 222 can be disposed in container 223. Charge detector 200 can include processor 290 in communication with sensitivity controller 214 to receive charge readout 226 from sensitivity controller 214. Processor 290 can analyze charge readout 226 to provide information about charged analyte 224 that contacts charge sensor 210.

In an embodiment, charge sensor 210 includes sensing electrode 228 in communication with transducer 212 such that charge sensor 210 produces charge signal 220; and reference electrode 230 by which sensing electrode 228 is electrically referenced and that receives reference potential 232. Charge sensor 210 can include high impedance amplifier 234 in communication with sensing electrode 228 and transducer 212. High impedance amplifier 234 receives charge signal 220 from sensing electrode 228; produces charge signal 220; and communicates charge signal 220 to transducer 212.

According to an embodiment, with reference to FIG. 10, FIG. 11, FIG. 12, and FIG. 13, charge sensor 210 further includes microfluidic chamber 250 in which sensing electrode 228 and reference electrode 230 are disposed. Microfluidic chamber 250 includes chamber wall 256 that bounds microfluidic well 258 in which inlet port 260 and outlet port 262 are disposed such that microfluidic chamber 250 receives a microfluidic flow of charged analyte 224. It is contemplated that charged analyte 224 can be disposed in fluid 222.

In an embodiment, transducer 212 includes adder 240 in electrical communication with charge sensor 210. Transducer 212 receives charge signal 220; receives gate voltage 248; and produces sum voltage 270 from charge signal 220 and gate voltage 248. Transducer 212 also includes gate voltage source 242 that produces gate voltage 248 that is communicated to adder 240 and dual gate field effect transistor 246 in electrical communication with adder 240. Dual gate field effect transistor 246 receives sum voltage 270 from adder 240; receives drain voltage 252; receives feedback control signal 216 from sensitivity controller 214; and produces transduction signal 218 from sum voltage 270, drain voltage 252, and feedback control signal 216. Drain voltage source 244 produces drain voltage 252.

In an embodiment, with reference to FIG. 14, FIG. 15, FIG. 16, FIG. 17, and FIG. 18, dual gate field effect transistor 246 includes analyte gate 4; two-dimensional active layer 6 disposed on analyte gate 4; source electrode 8 disposed on two-dimensional active layer 6 and in electrical communication with two-dimensional active layer 6; drain electrode 10 disposed on two-dimensional active layer 6 and in electrical communication with two-dimensional active layer 6 and in electrical communication with source electrode 8 via two-dimensional active layer 6; and control gate 2 disposed on two-dimensional active layer 6 and controlling the communication of electrical current in two-dimensional active layer 6 between source electrode 8 and drain electrode 10. Here, the electrical current communicated in two-dimensional active layer 6 is changed in response to a change in sum voltage 270 due to a change in a presence of charged analyte 224 at sensing electrode 228. Dual gate field effect transistor 246 further includes ionic liquid 288 in electrical communication with source electrode 8, control gate 2, and drain electrode 10 and is disposed on source electrode 8, control gate 2, and drain electrode 10 drain electrode 10.

Sensitivity controller 214 includes control loop feedback device 272 in electrical communication with dual gate field effect transistor 246 of transducer 212. Control loop feedback device 272 receives process signal 274 that is based on transduction signal 218; receives hold signal 278; produces feedback control signal 216 based on process signal 274 and hold signal 278; and produces charge readout 226 from transduction signal 218 based on process signal 274. Sensitivity controller 214 also can include phase-sensitive detector 284 in electrical communication with transducer 212 and control loop feedback device 272 and electrically interposed between transducer 212 and control loop feedback device 272. Phase-sensitive detector 284 receives transduction signal 218 and produces process signal 274 from transduction signal 218; and produces phase signal 276. Adder 280 is in electrical communication with phase-sensitive detector 284 and receives phase signal 276 from phase-sensitive detector 284. It is contemplated also that adder 280 can be in electrical communication with dual gate field effect transistor 246 of transducer 212 and in electrical communication with control loop feedback device 272, such that adder 280 produces feedback control signal 216 from phase signal 276 and from controller signal 286 received from control loop feedback device 272 and communicates feedback control signal 216 to transducer 212.

In an embodiment, adder 280 is in electrical communication with dual gate field effect transistor 246 of transducer 212 and in electrical communication with control loop feedback device 272, wherein adder 280 produces feedback control signal 216 from phase signal 276 and from controller signal 286 received from control loop feedback device 272 and communicates feedback control signal 216 to transducer 212.

In an embodiment, sensitivity controller 214 also includes phase-sensitive detector 284 in electrical communication with transducer 212 and control loop feedback device 272 and electrically interposed between transducer 212 and control loop feedback device 272. Here, sensitivity controller 214 receives transduction signal 218; produces process signal 274 from transduction signal 218; and produces phase signal 276. To interface with sensitivity controller 214, transducer 212 further can include adder 280 in electrical communication with phase-sensitive detector 284, wherein phase-sensitive detector 284 receives phase signal 276 from phase-sensitive detector 284 and produces drain voltage 252 from phase signal 276.

In transducer 212, dual gate field effect transistor 246, includes a field effect transistor (FET) having an analyte gate and a control gate that provides a reduction in noise and improved sensitivity as compared with a conventional FET. Dual gate field effect transistor 246 detects, identifies, or characterizes charged analyte 224 via charge signal 220 or sum voltage 270 and generates transduction signal 218 in response to presence of charged analyte 224 proximate to sensing electrode 228. Transduction signal 218 can be, e.g., a change in a drain current across two-dimensional active layer 6 of dual gate field effect transistor 246. The change in the drain current can be proportional to an amount of charge due to a concentration of charged analyte 224 in contact with sensing electrode 228. Transduction signal 218 can be scaled to provide a gain characteristic of dual gate field effect transistor 246 to provide a high signal-to-noise ratio for sensing charged analyte 224.

Figure 19:
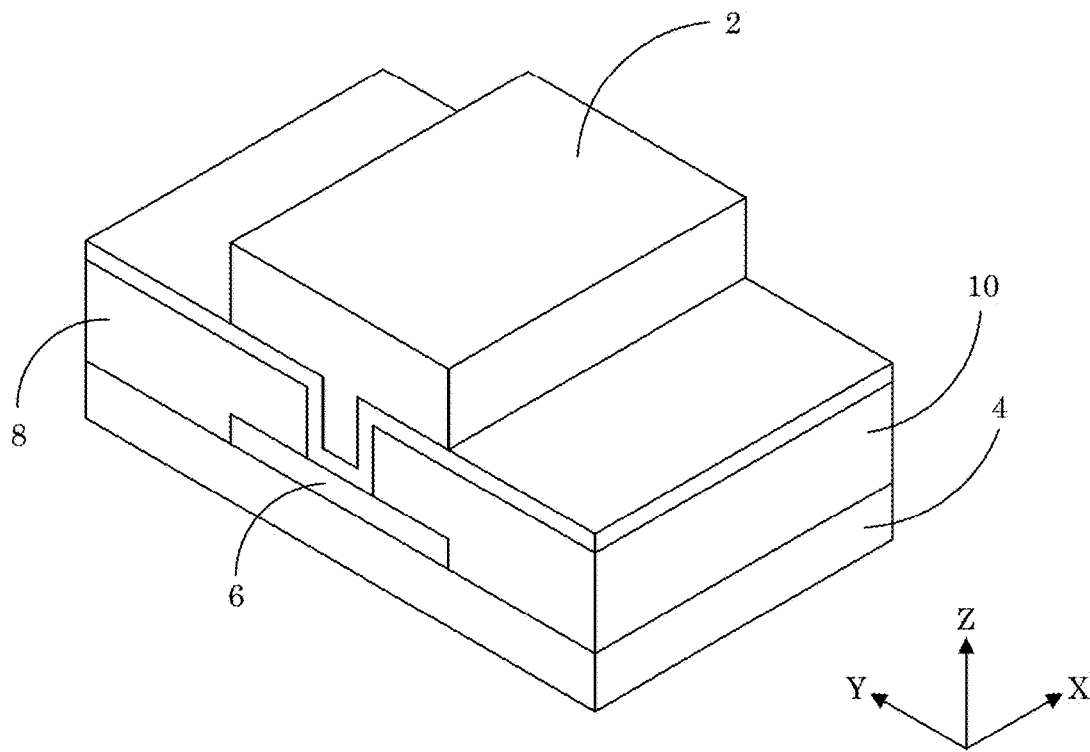
FIG. 19 shows a perspective view of a dual gate field effect transistor in panel A and a top view of the dual gate field effect transistor in panel B.
Figure 19:
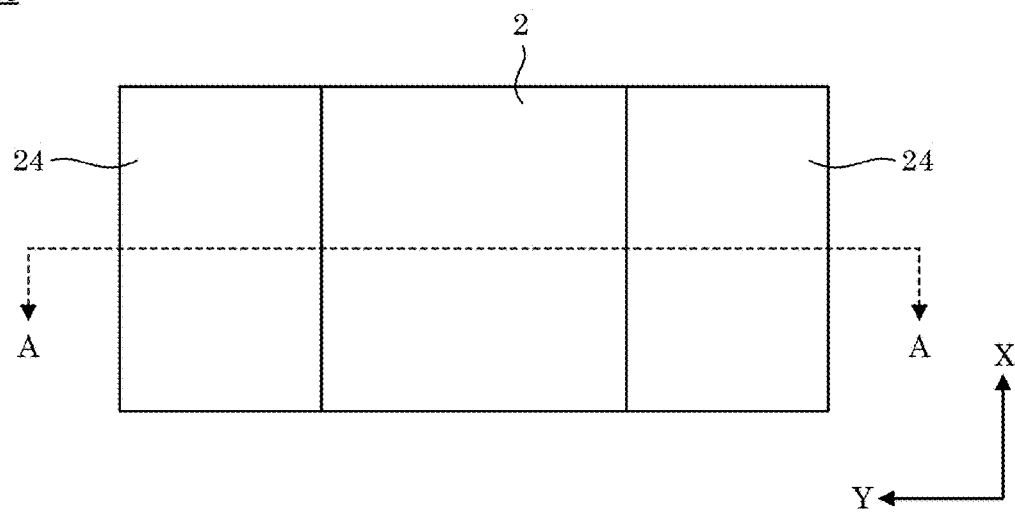
Figure 20:
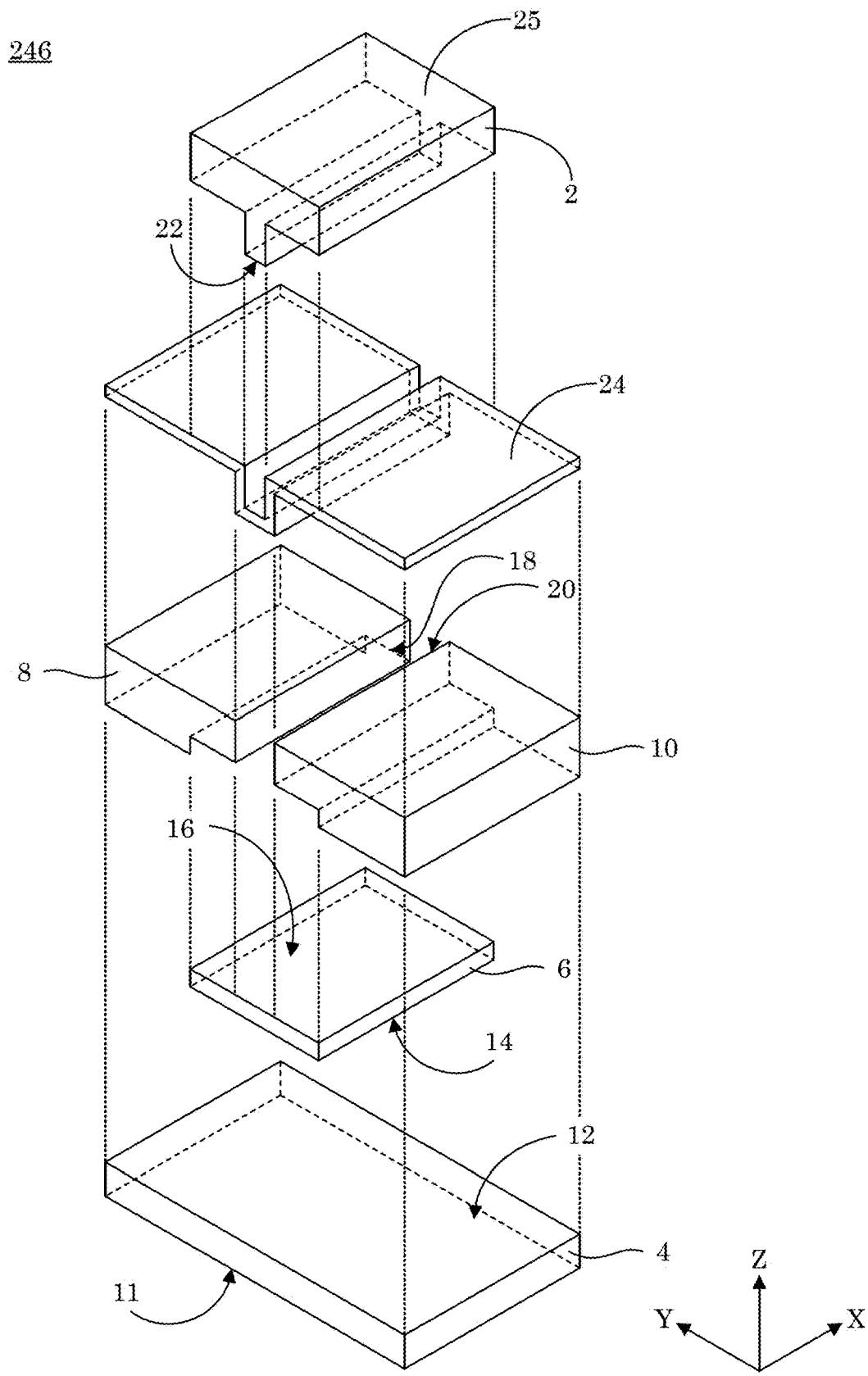
FIG. 20 shows an exploded view of the dual gate field effect transistor shown in FIG. 1.
Figure 21:
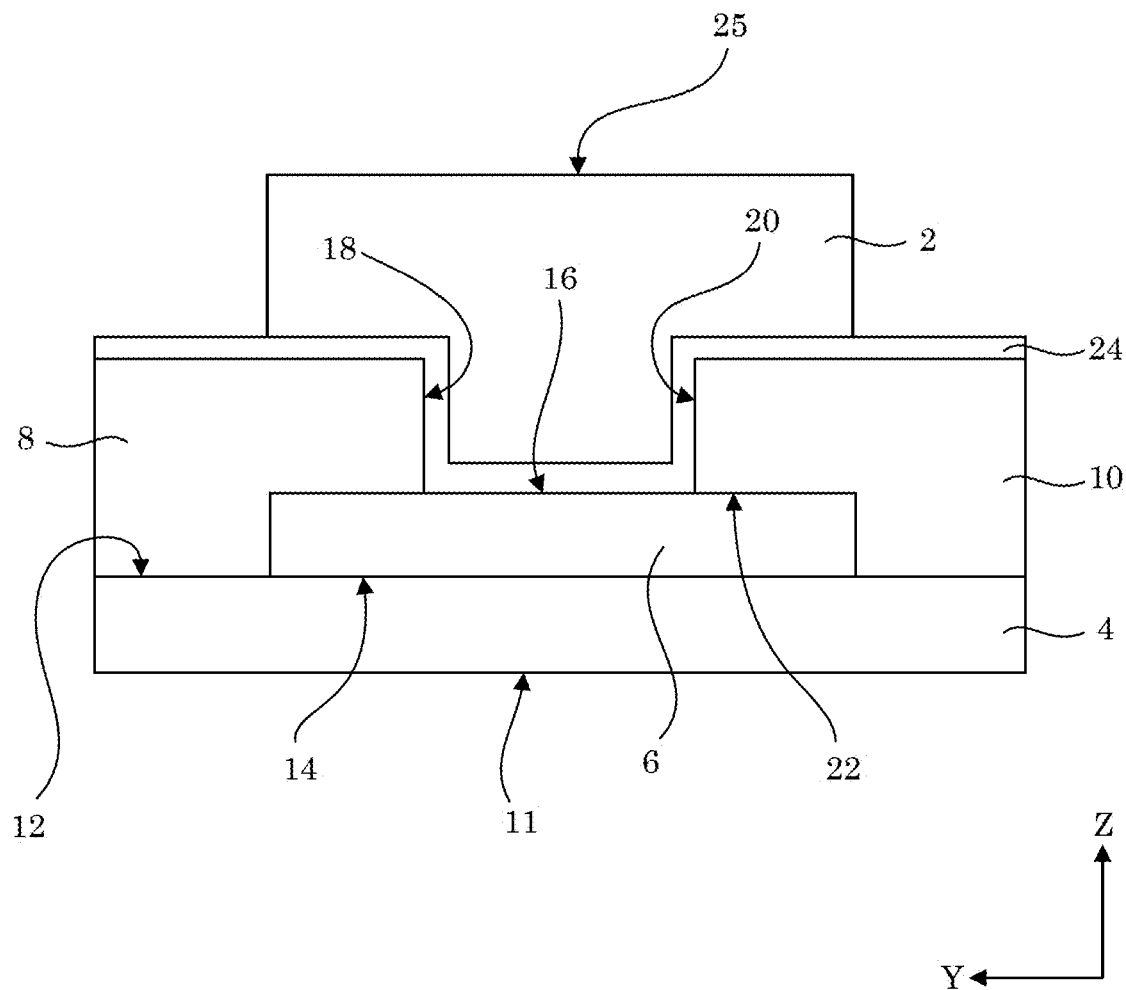
FIG. 21 shows a cross-section along line A-A of the dual gate field effect transistor shown in panel B of FIG. 1.

Dual gate field effect transistor 246 senses a change in an electric charge at control gate 2 due to the electric charge of charged analyte 224. In an embodiment, with reference to FIG. 19 (perspective view in panel A and top view in panel B), FIG. 20 (exploded view), and FIG. 21 (cross-section along line A-A in panel B of FIG. 19); dual gate field effect transistor 246 includes analyte gate 4; two-dimensional active layer 6 disposed on analyte gate 4 and including a transition metal dichalcogenide; source electrode 8 disposed on two-dimensional active layer 6 and in electrical communication with two-dimensional active layer 6; drain electrode 10 disposed on two-dimensional active layer 6 and in electrical communication with two-dimensional active layer 6 and in electrical communication with source electrode 8 via two-dimensional active layer 6; and control gate 2 disposed on two-dimensional active layer 6 and controlling the communication of electrical current in two-dimensional active layer 6 between source electrode 8 and drain electrode 10, wherein the electrical current communicated in two-dimensional active layer 6 is changed in response to a change in an electrical charge present at analyte gate 4 due to charged analyte 224.

In an embodiment, dual gate field effect transistor 246 includes gate insulating layer 24 interposed between control gate 2 and two-dimensional active layer 6 such that control gate 2 is bounded at channels surface 22 by wall 18 of source electrode 8, wall 20 of drain electrode 10, and control gate surface of two-dimensional active layer 6. Here, control gate 2 includes free surface 25. Moreover, analyte gate surface 14 that opposes channel surface 12 of analyte gate 4. Further, analyte gate 4 includes analyte surface 11 on which charged analyte 224 can interact in some embodiments.

Figure 22:
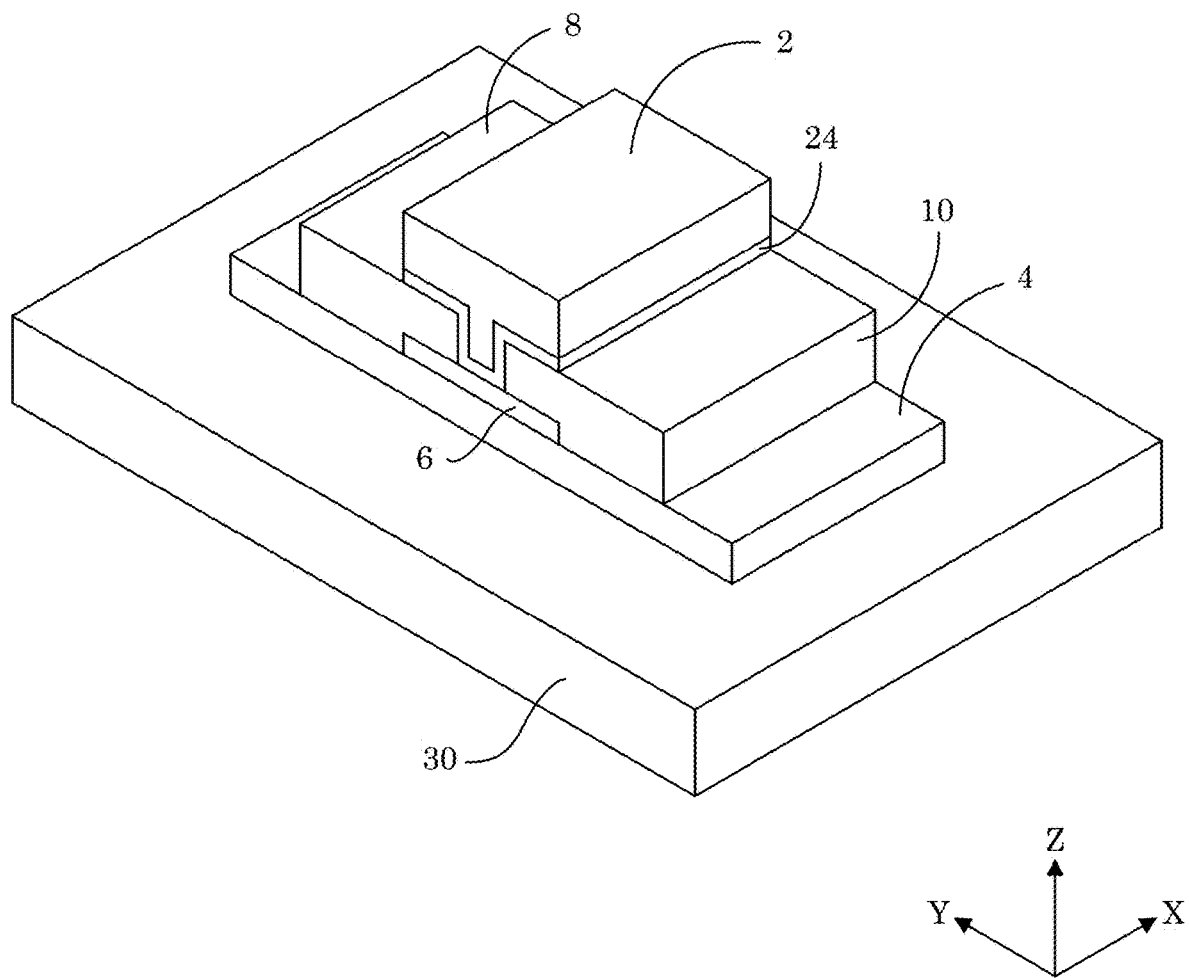
FIG. 22 shows a perspective view of a dual gate field effect transistor.
Figure 23:
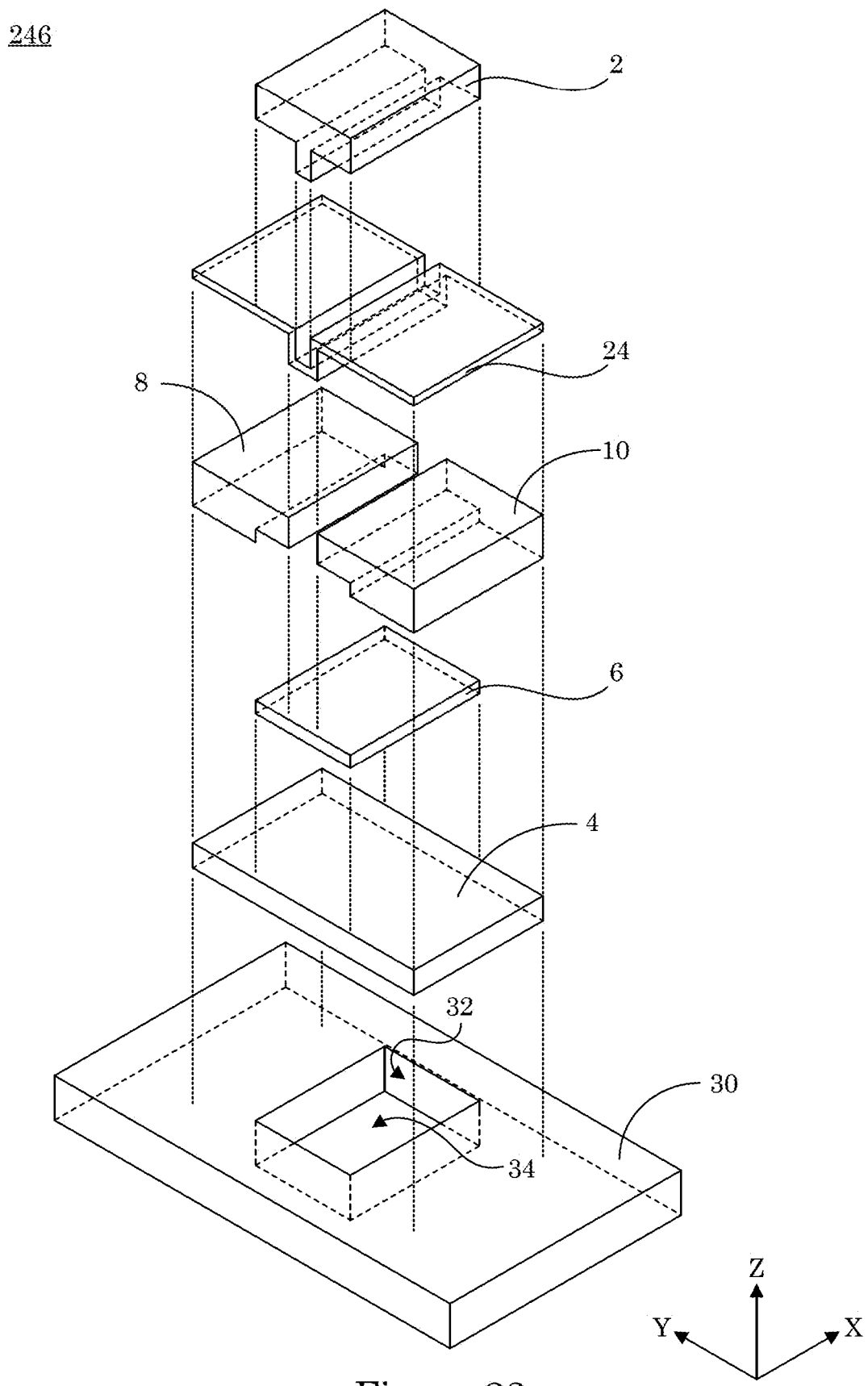
FIG. 23 shows an exploded view of the dual gate field effect transistor shown in FIG. 22.
Figure 24:
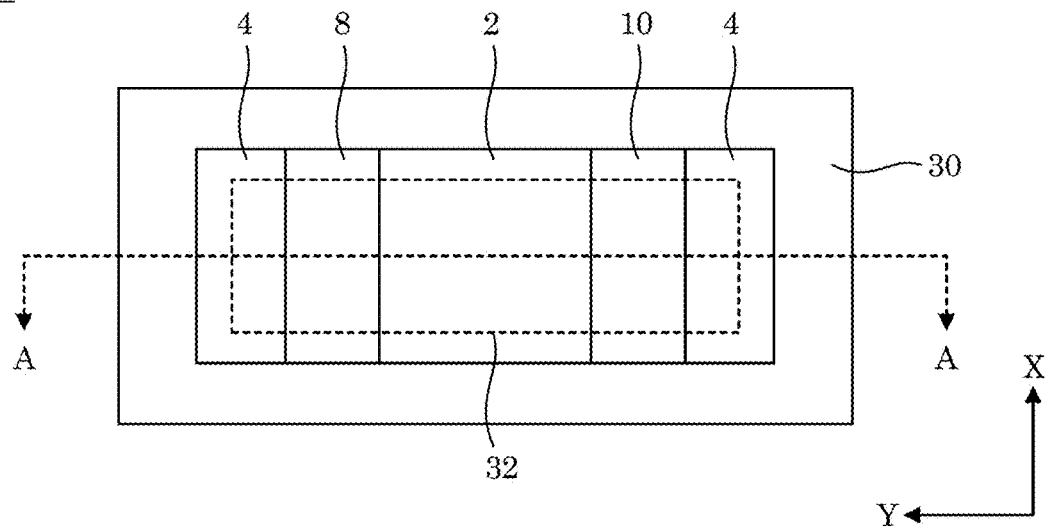
FIG. 24 shows a top view of the dual gate field effect transistor shown in FIG. 22 in panel A, and panel B shows a bottom view of the dual gate field effect transistor shown in FIG. 22.
Figure 24:
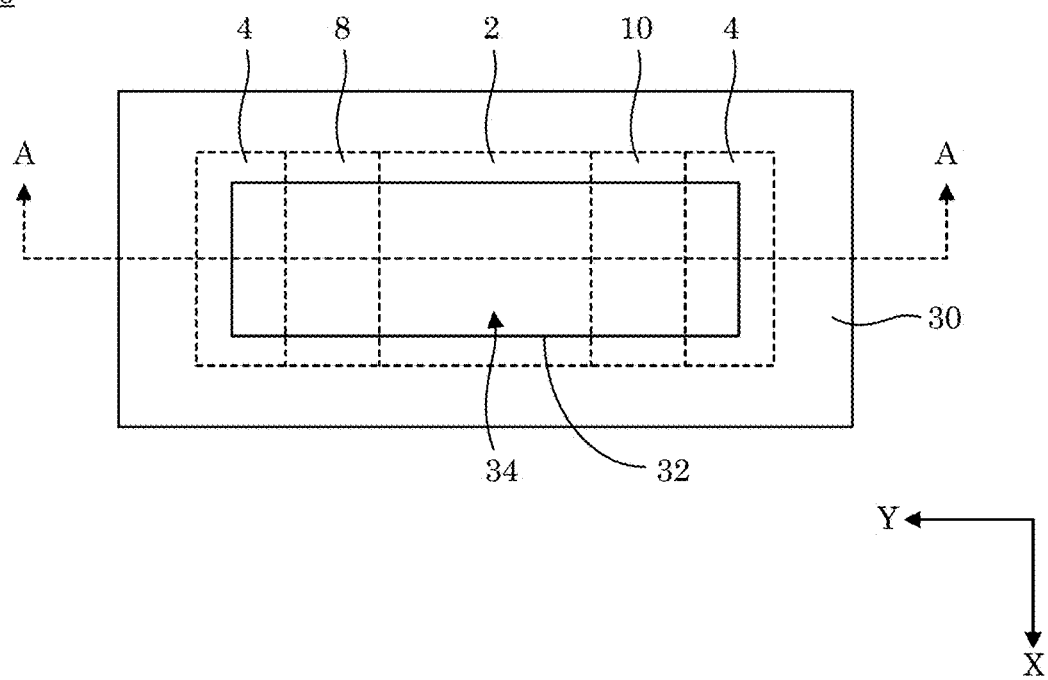
Figure 25:
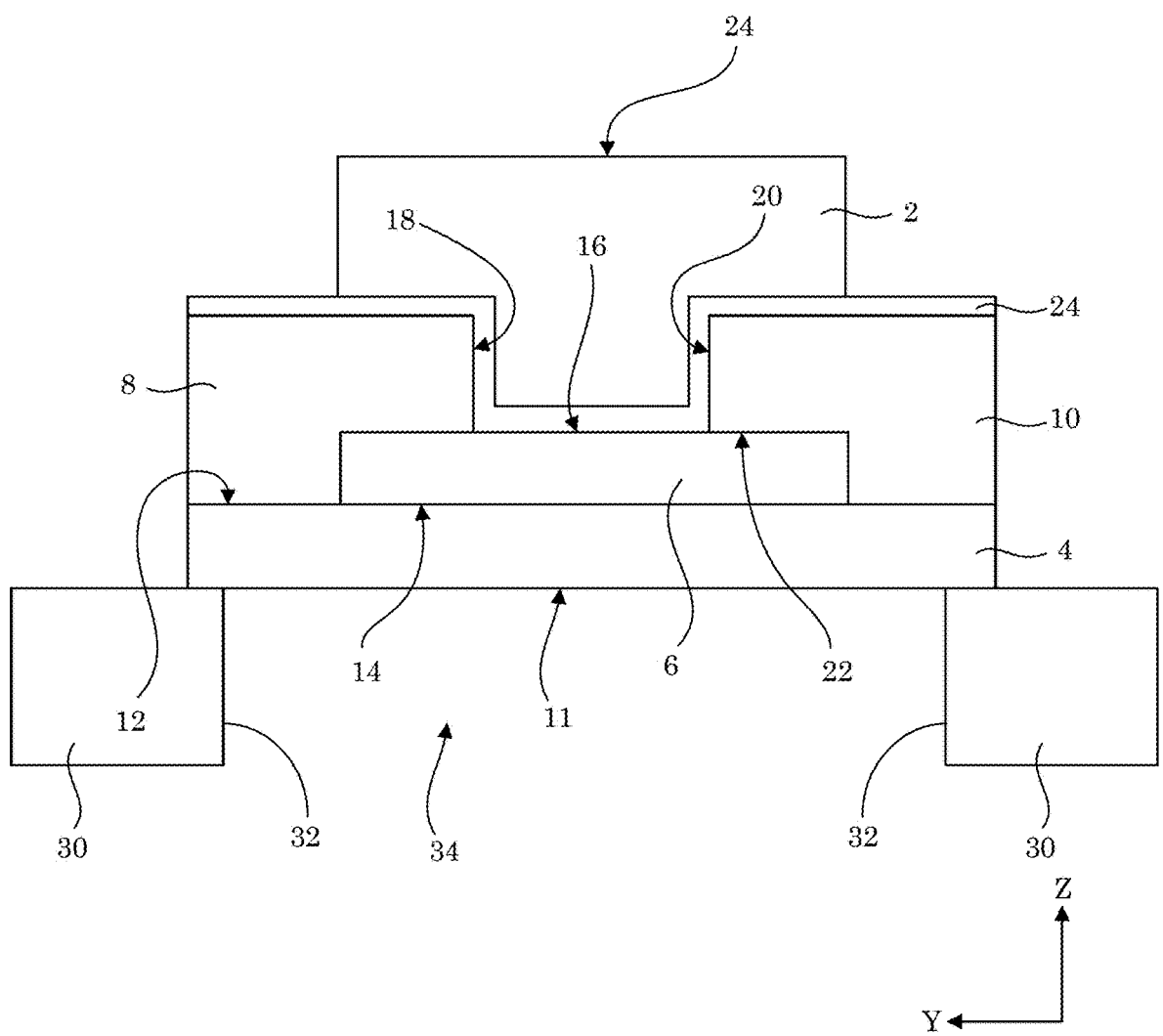
FIG. 25 a cross-section along line A-A of the dual gate field effect transistor shown in panel B of FIG. 24.

In an embodiment, with reference to FIG. 22 (perspective view) FIG. 23 (exploded view), FIG. 24 (top view in panel A and bottom view in panel B), and FIG. 25 (cross-section), dual gate field effect transistor 246 includes substrate 30 on which analyte gate 4 is disposed, wherein analyte gate 4 is interposed between substrate 30 and two-dimensional active layer 6. As shown in FIG. 23 and FIG. 25, substrate 30 includes analyte chamber 34 bounded by wall 32. Analyte chamber 34 can receive charged analyte 224 for contact with analyte gate 4.

Figure 26:
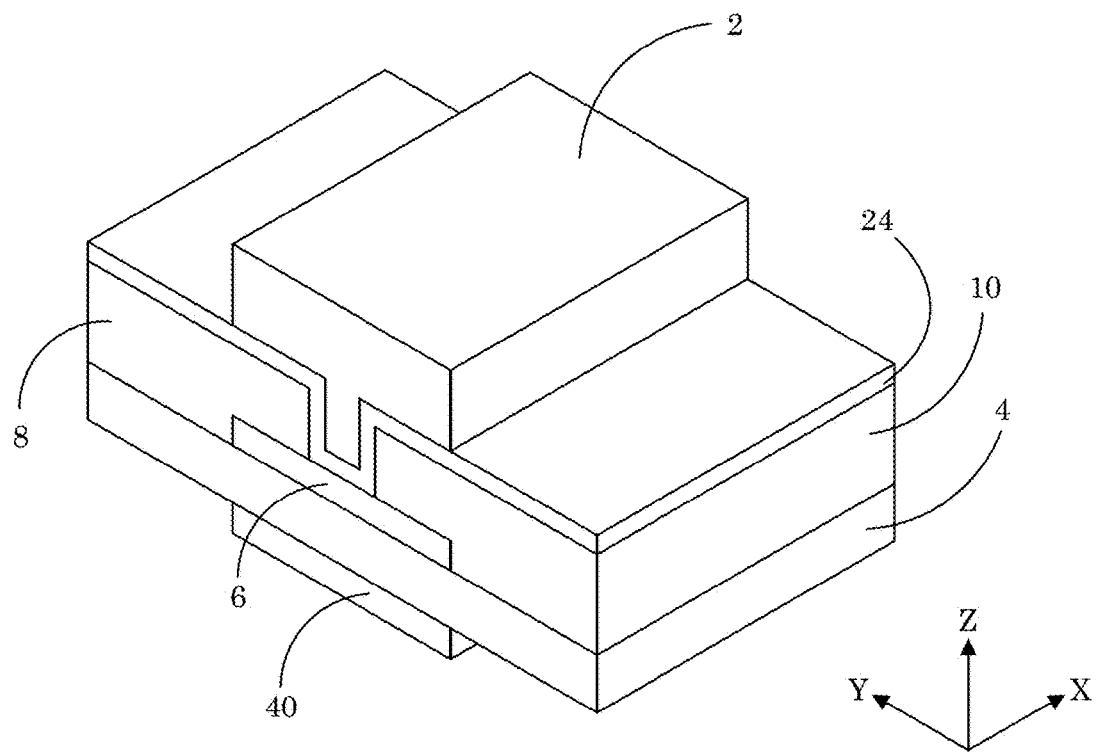
FIG. 26 shows a perspective view of a dual gate field effect transistor in panel A and a top view of the dual gate field effect transistor in panel B.
Figure 26:
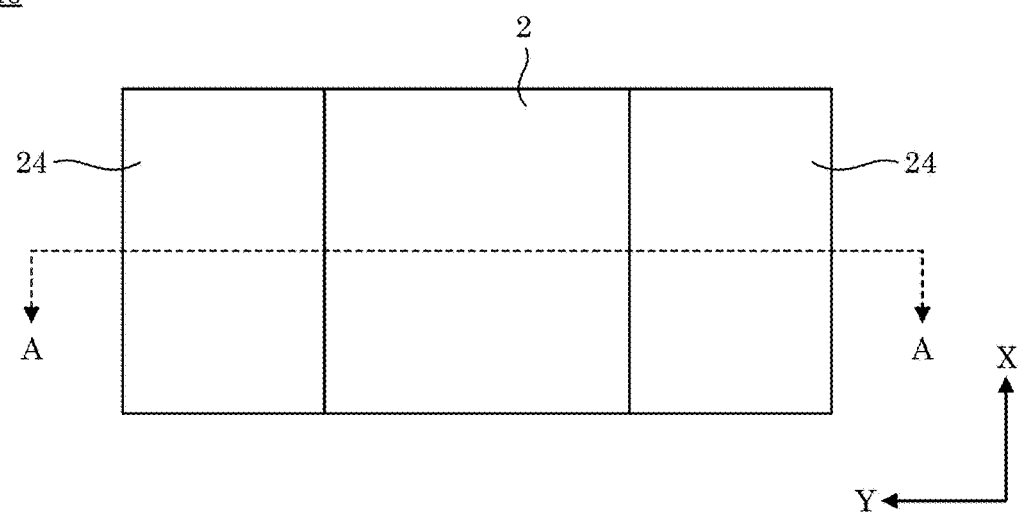
Figure 27:
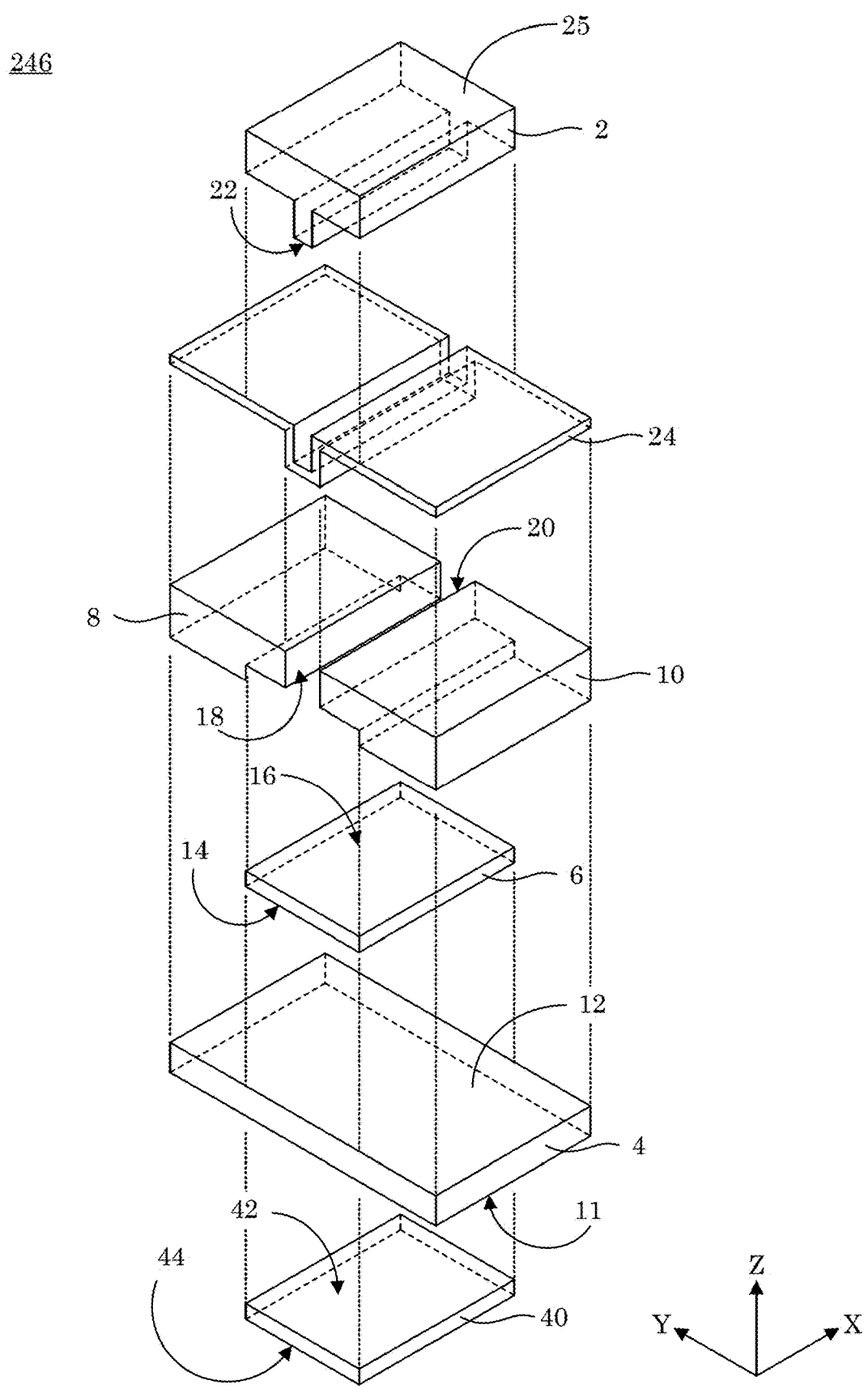
FIG. 27 shows an exploded view of the dual gate field effect transistor shown in FIG. 26.
Figure 28:
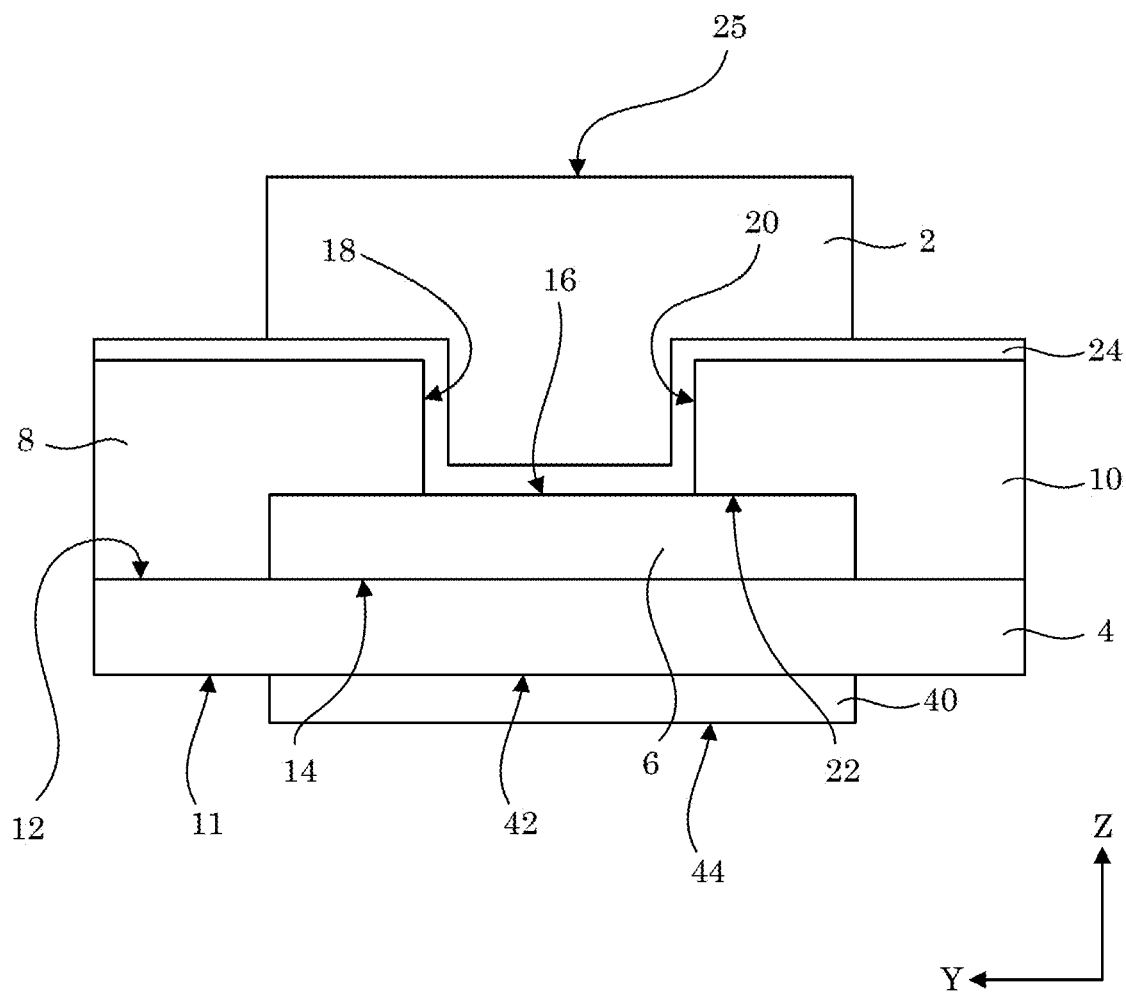
FIG. 28 shows a cross-section along line A-A of the dual gate field effect transistor shown in panel B of FIG. 26.
Figure 29:
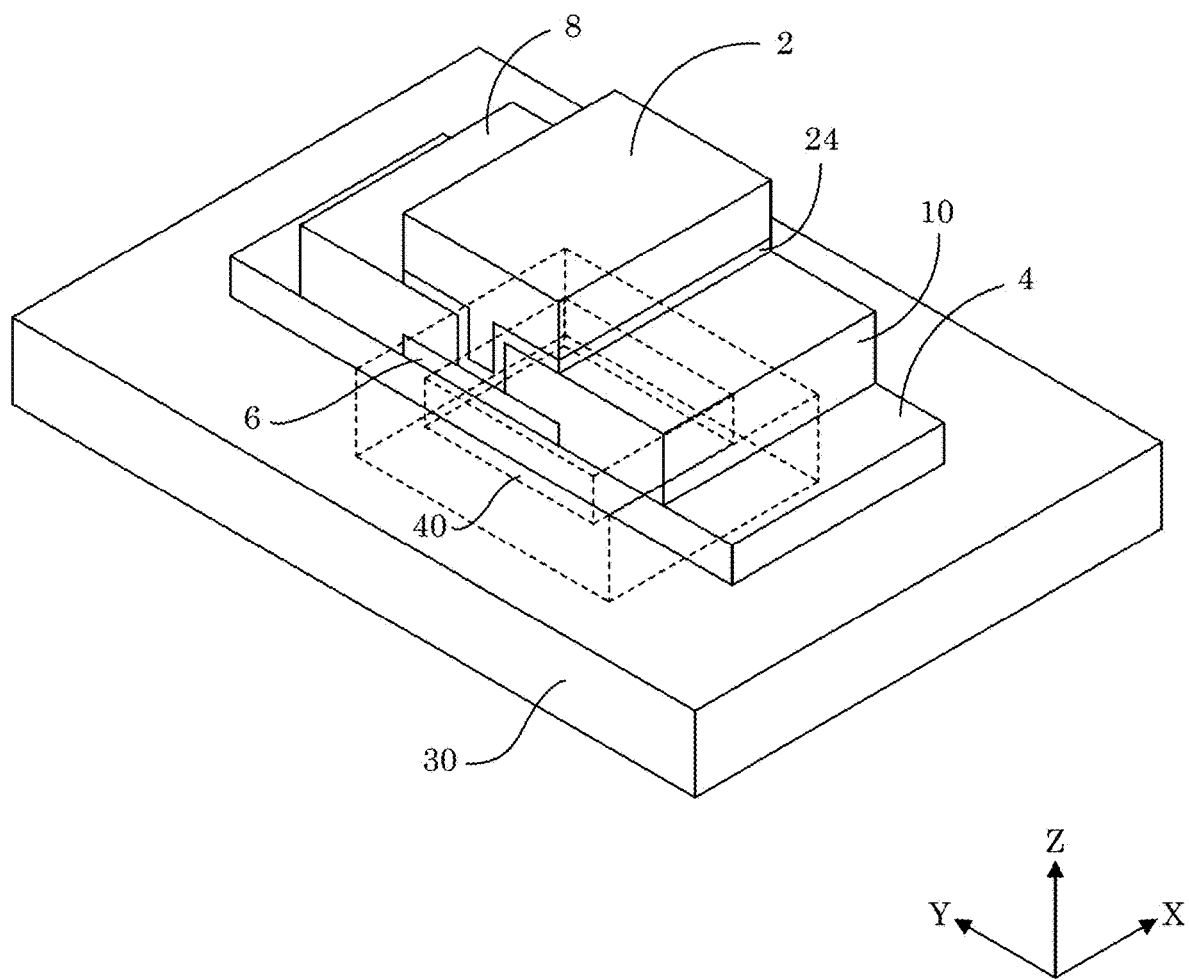
FIG. 29 shows a perspective view of a dual gate field effect transistor.
Figure 30:
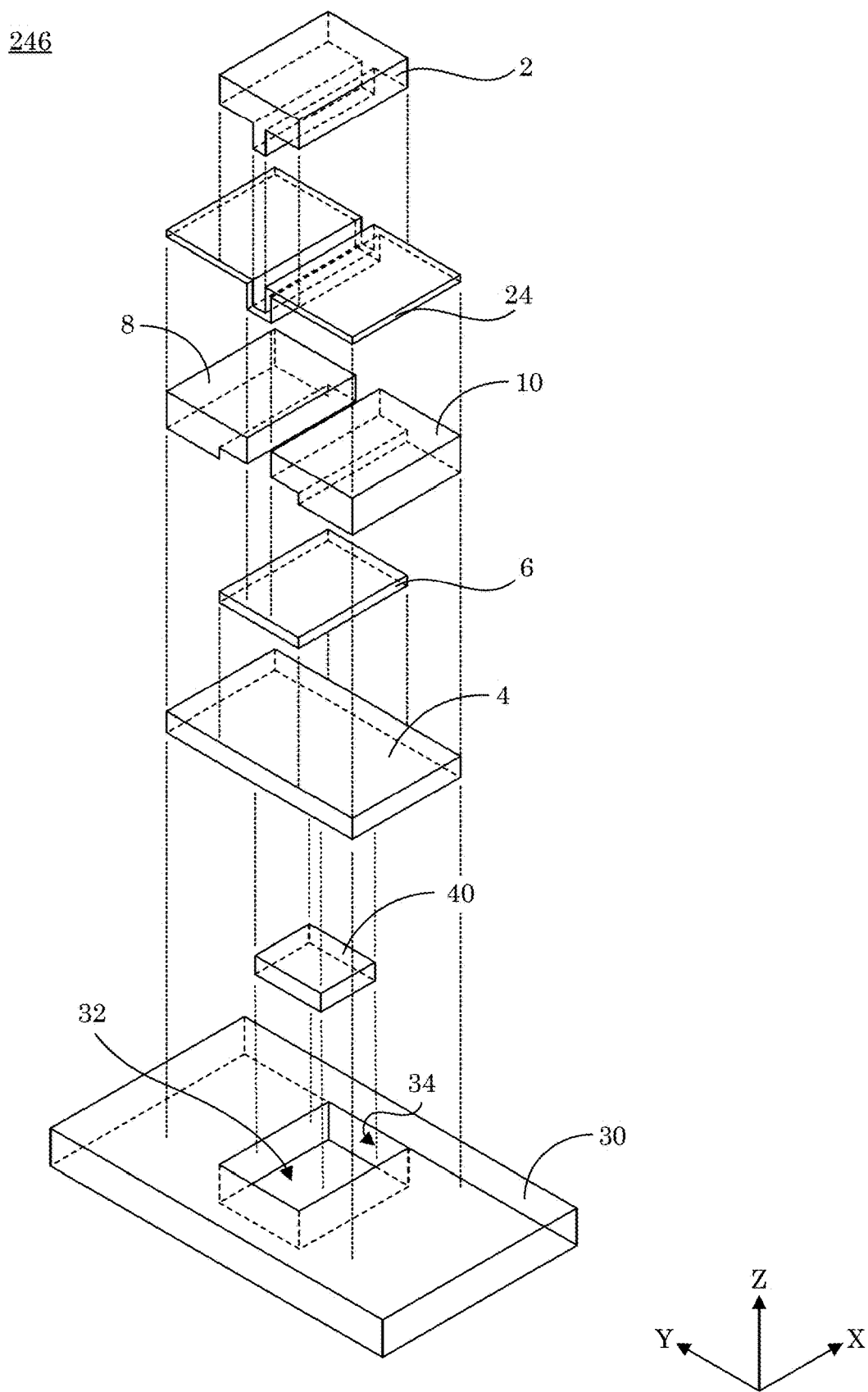
FIG. 30 shows an exploded view of the dual gate field effect transistor shown in FIG. 29.
Figure 31:
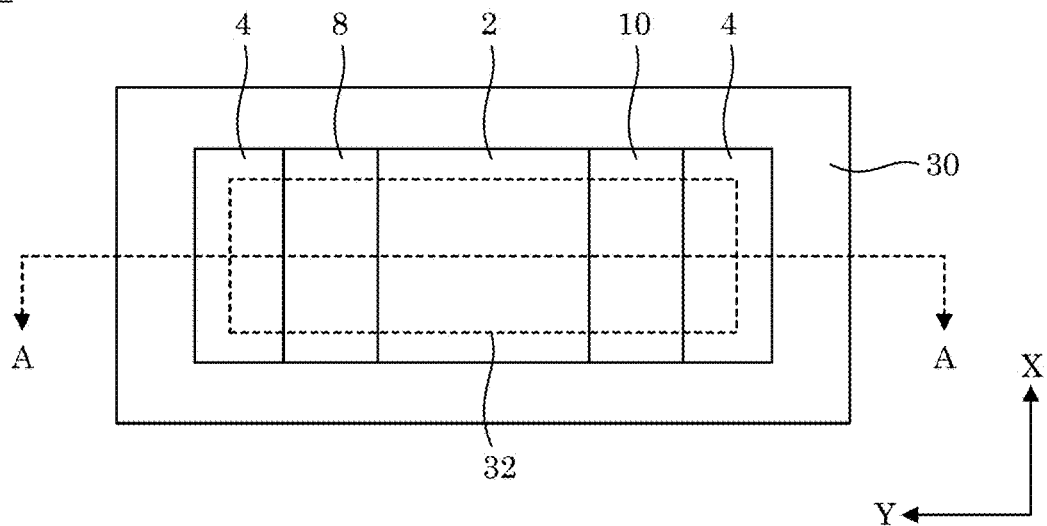
FIG. 31 shows a top view of the dual gate field effect transistor shown in FIG. 29 in panel A, and panel B shows a bottom view of the dual gate field effect transistor shown in FIG. 29.
Figure 31:
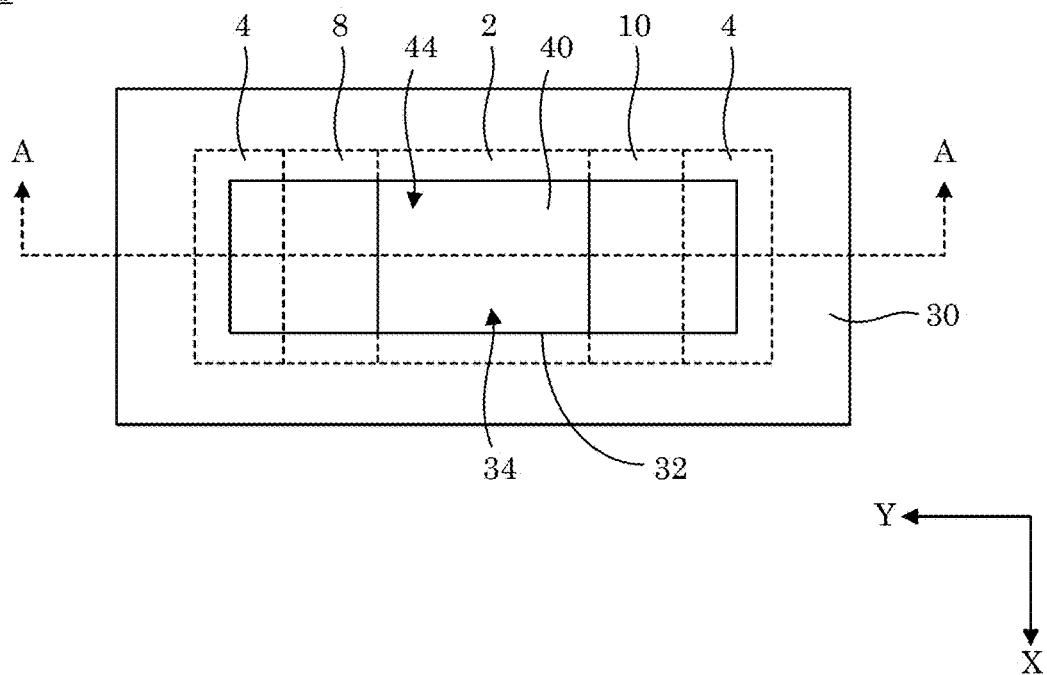
Figure 32:
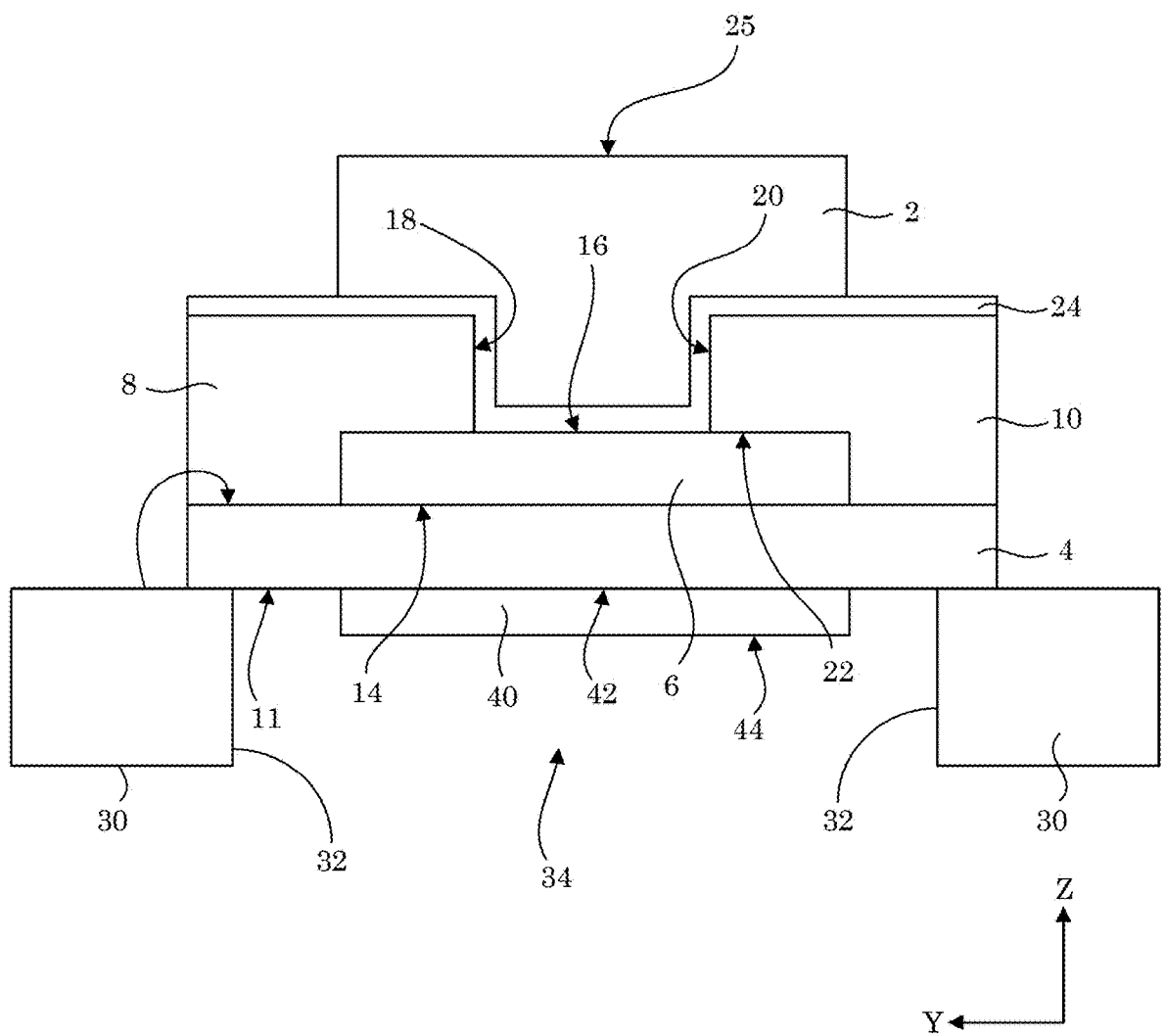
FIG. 32 a cross-section along line A-A of the dual gate field effect transistor shown in panel B of FIG. 31.
Figure 33:
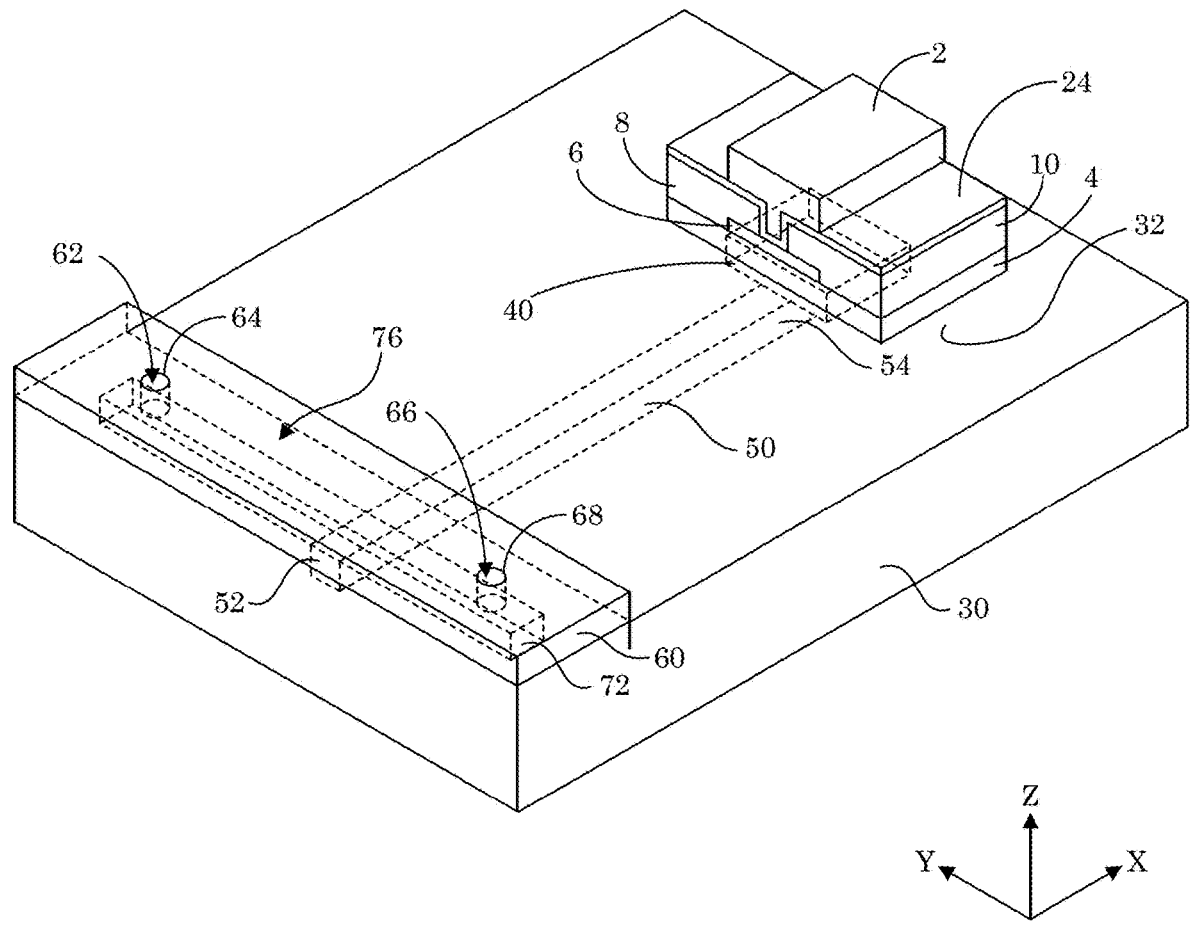
FIG. 33 shows a perspective view of a dual gate field effect transistor.
Figure 34:
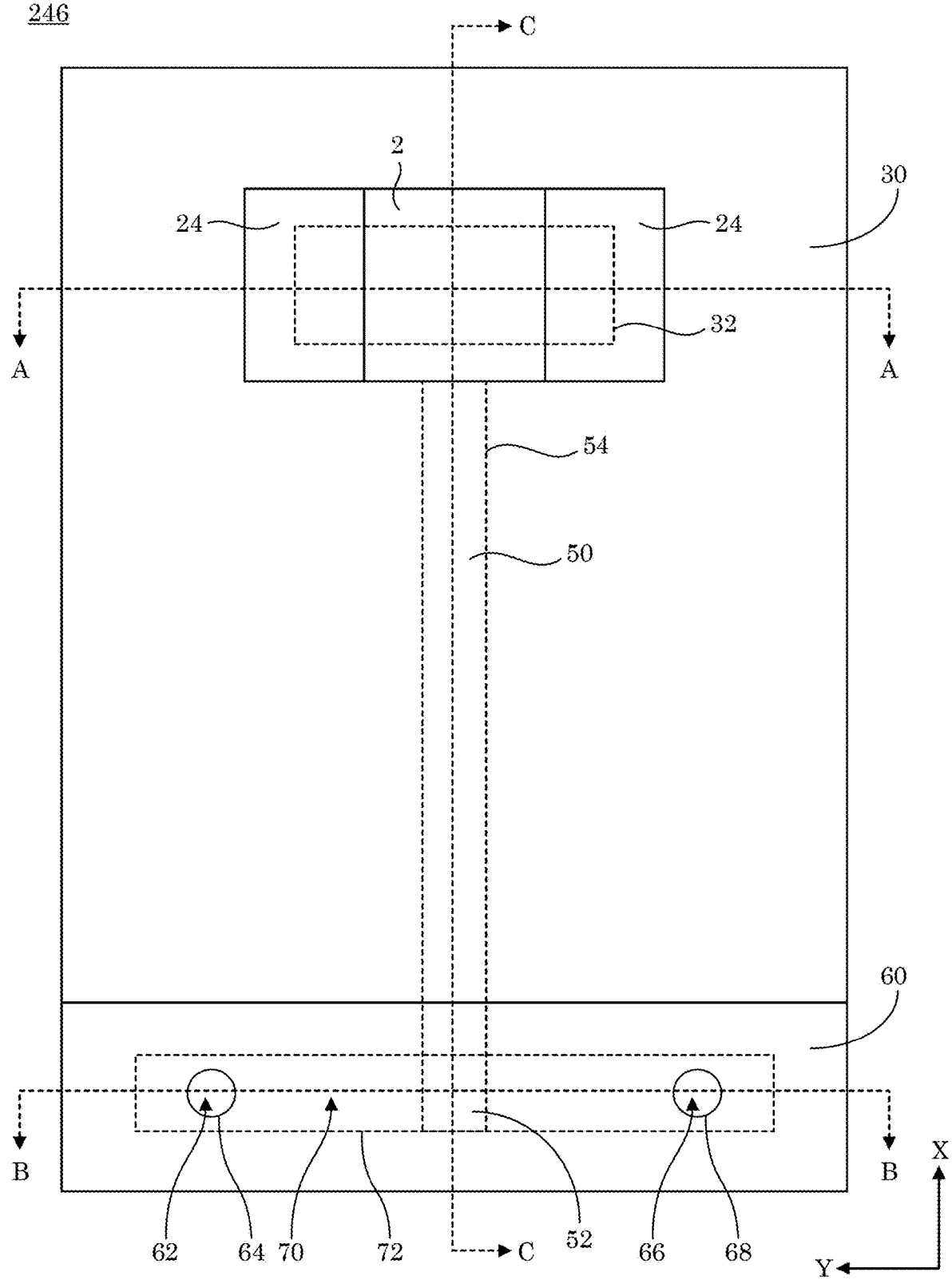
FIG. 34 shows a top view of the dual gate field effect transistor shown in FIG. 33.

In an embodiment, with reference to FIG. 26, FIG. 27, and FIG. 28, dual gate field effect transistor 246 includes analyte gate contact 40 disposed on analyte gate 4, wherein analyte gate 4 is interposed between analyte gate contact 40 and two-dimensional active layer 6. According to an embodiment, with reference to FIG. 29, FIG. 30, FIG. 31, and FIG. 32, dual gate field effect transistor 246 further includes substrate 30 on which analyte gate 4 is disposed, wherein analyte gate 4 is interposed between two-dimensional active layer 6 and a combination of substrate 30 and analyte gate contact 40. Here, analyte gate contact 40 is disposed in analyte chamber 34 to receive charged analyte 58 at analyte contact surface 44 of analyte gate contact 40, wherein analyte gate contact 40 also includes gate contact surface 42 opposing analyte surface 11 of analyte gate 4.

Figure 35:
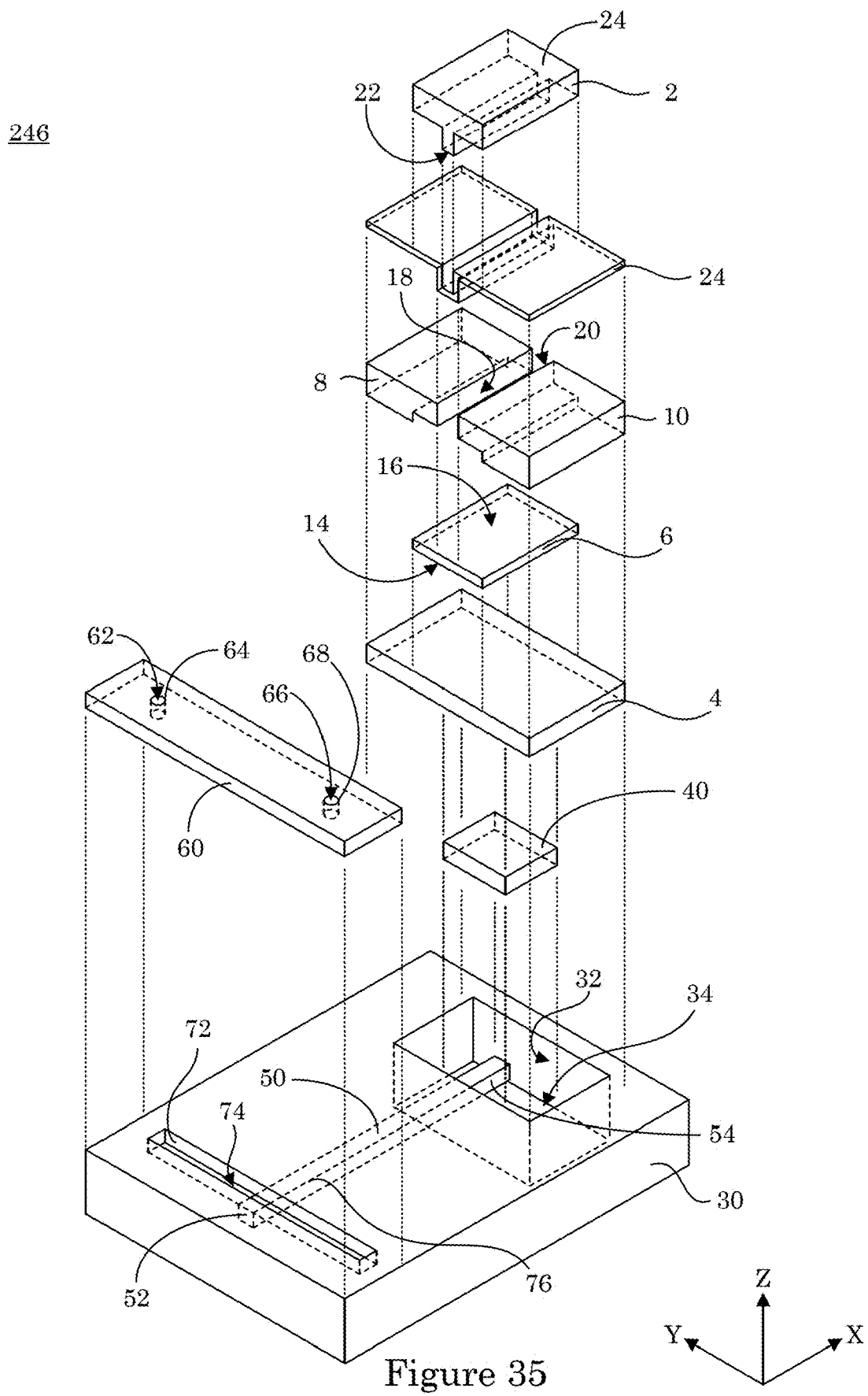
FIG. 35 shows an exploded view of the dual gate field effect transistor shown in FIG. 33.
Figure 36:
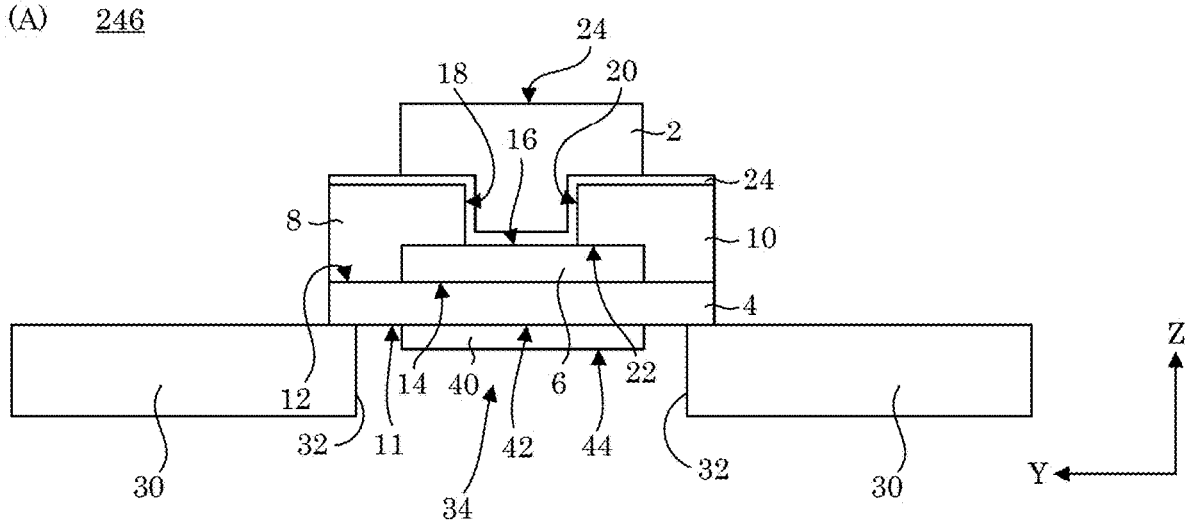
FIG. 36 shows a cross-section along line A-A of the dual gate field effect transistor shown in FIG. 34; panel B shows a cross-section along line B-B of the dual gate field effect transistor shown in FIG. 34, and panel C shows a cross-section along line C-C of the dual gate field effect transistor shown in FIG. 34.
Figure 36:
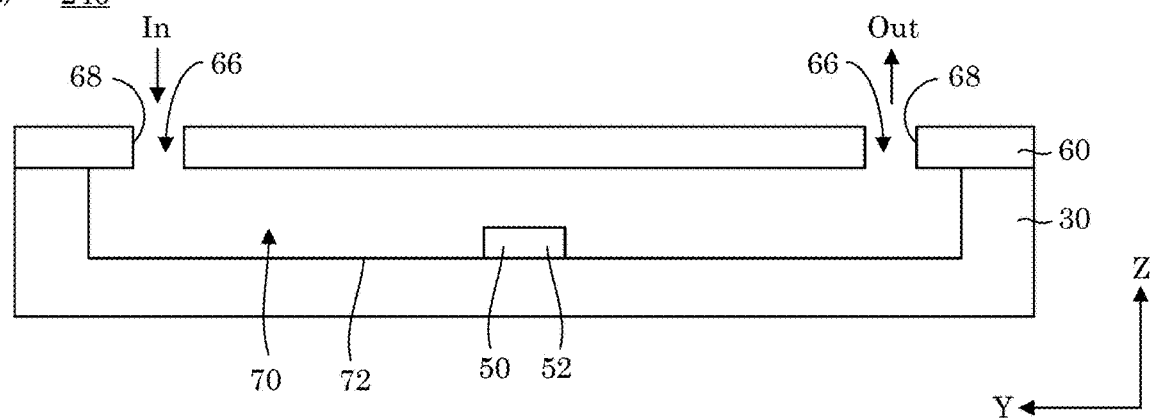
Figure 36:
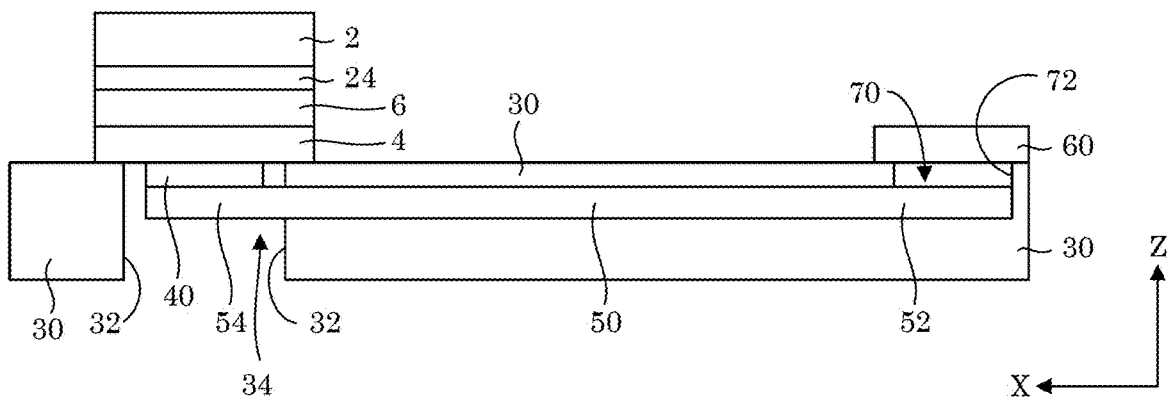
Figure 37:
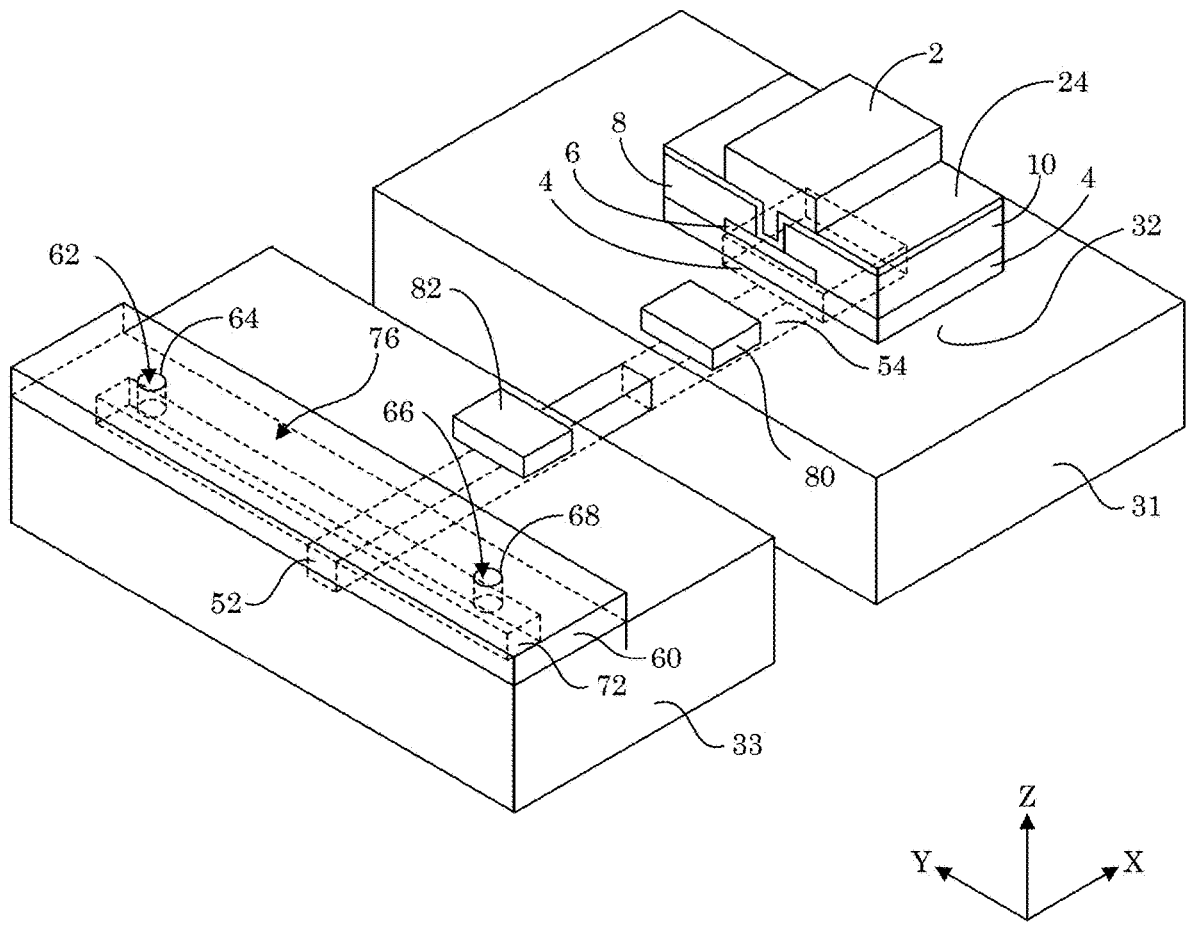
FIG. 37 shows a perspective view of a dual gate field effect transistor.
Figure 38:
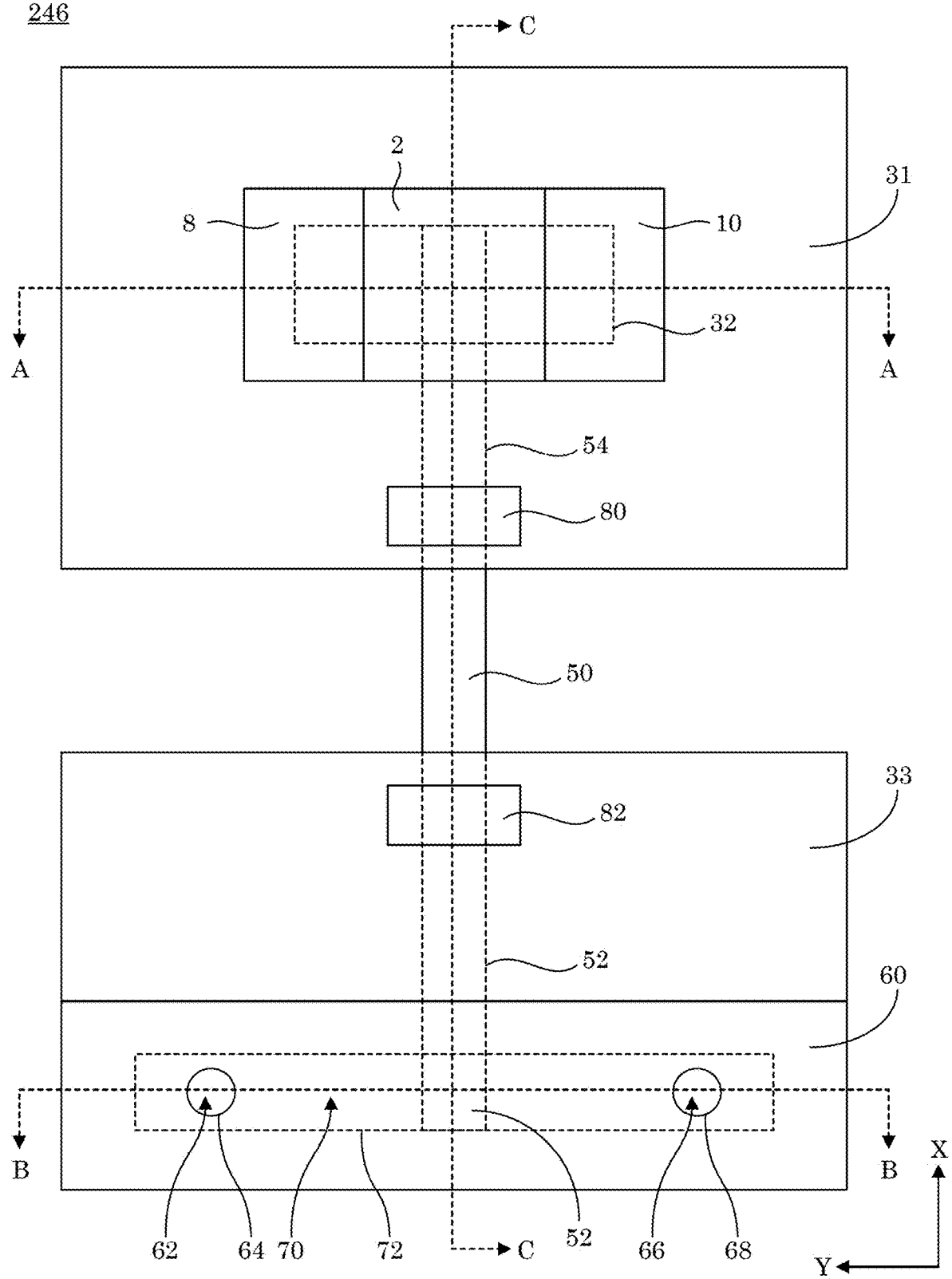
FIG. 38 shows a top view of the dual gate field effect transistor shown in FIG. 37.
Figure 39:
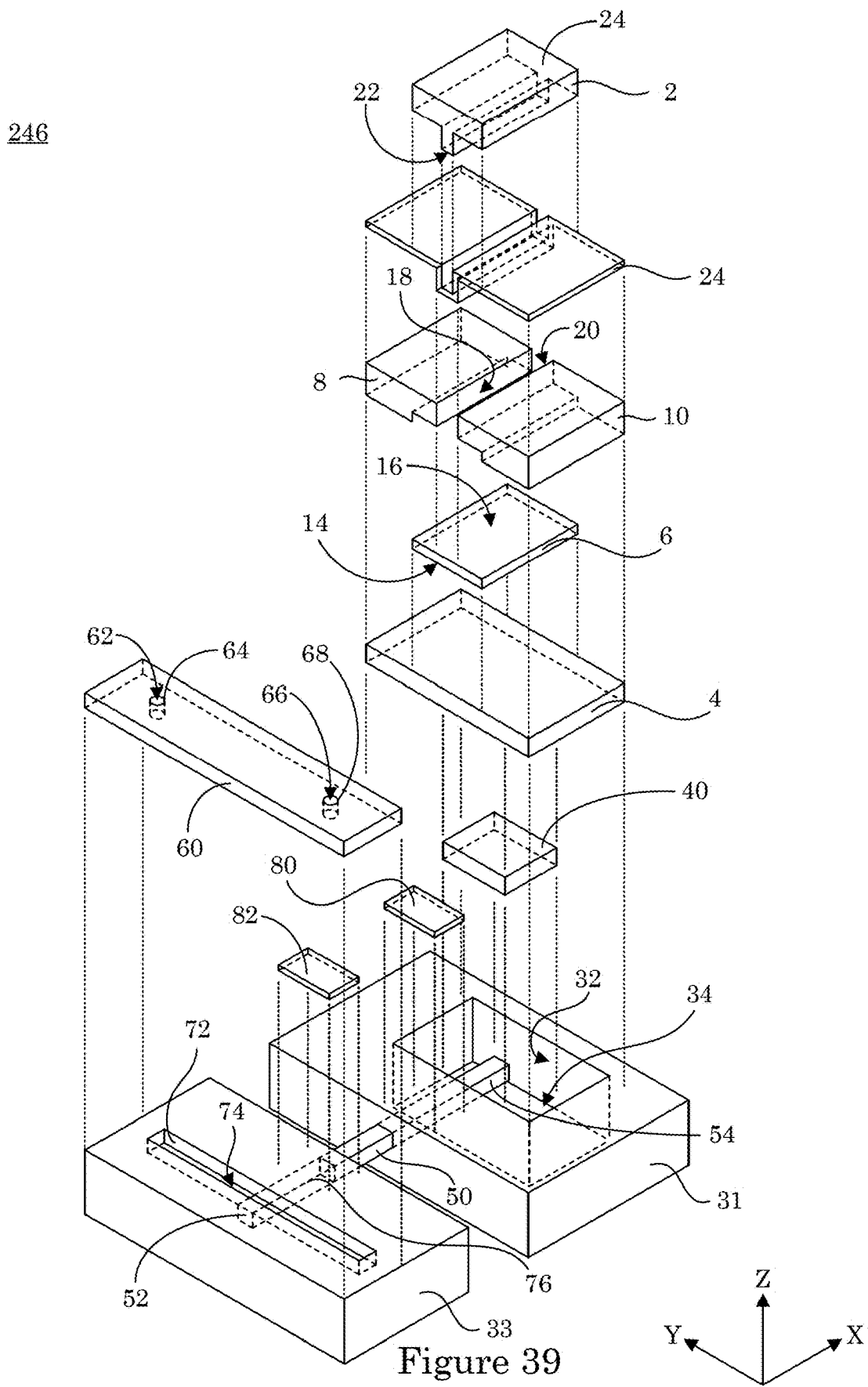
FIG. 39 an exploded view of the dual gate field effect transistor shown in FIG. 37.
Figure 40:
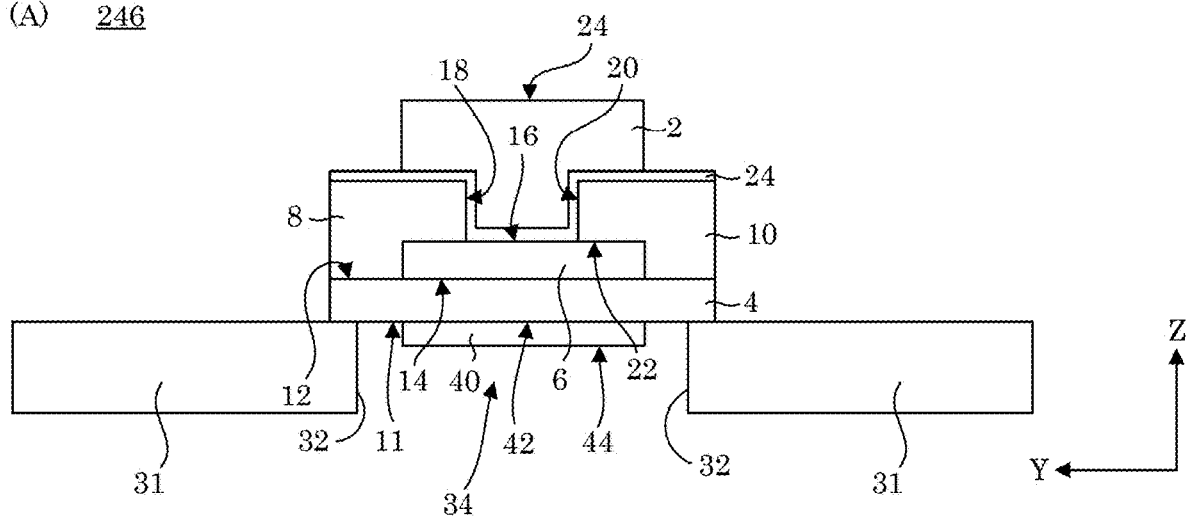
FIG. 40 shows a cross-section along line A-A of the dual gate field effect transistor shown in FIG. 37; panel B shows a cross-section along line B-B of the dual gate field effect transistor shown in FIG. 37, and panel C shows a cross-section along line C-C of the dual gate field effect transistor shown in FIG. 37.
Figure 40:
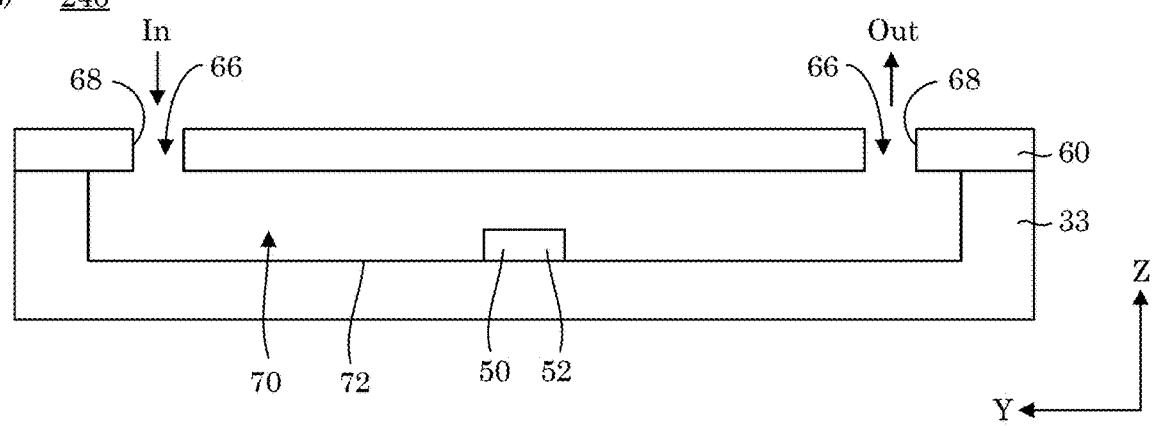
Figure 40:
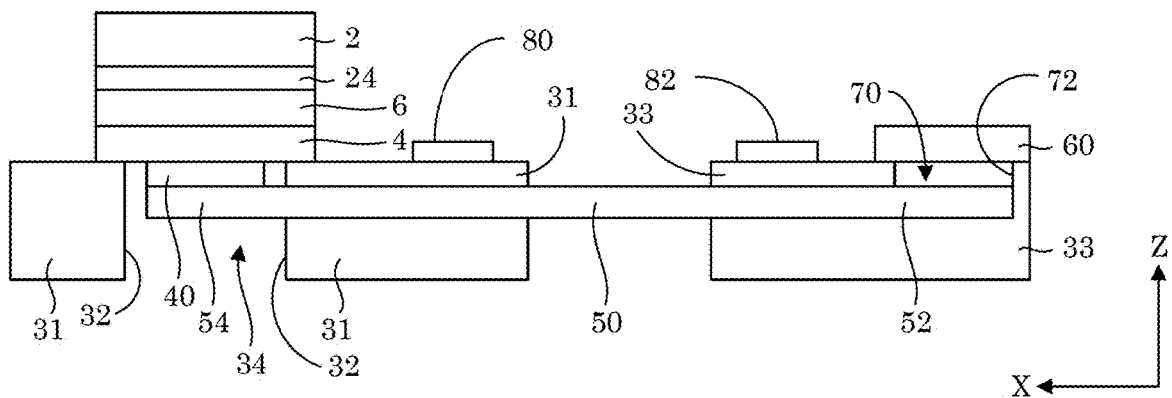

In an embodiment, with reference to FIG. 33, FIG. 34, FIG. 35, and FIG. 36, dual gate field effect transistor 246 includes analyte gate extension 50 disposed on substrate 30 and in electrical communication with analyte gate contact 40. Here, analyte gate extension 50 includes first end connected to analyte gate contact 40 and second end 52 that extends on substrate 30 to microfluidic chamber 76 disposed on substrate 30. Microfluidic chamber 30 includes flow channel 70 bounded by wall 72 and cover 60. Cover 60 opposes an exposed surface of second end 52 of analyte gate extension 50 such that flow channel 70 provides for a flow of a fluid that includes charged analyte 224. Here, the exposed portion of second end 52 of analyte gate extension 50 in flow channel 70 can contact charged analyte 224, and the electrical charge present at analyte gate 4 changes due to contact of analyte gate extension 50 with charged analyte 224. Flow of the fluid containing charged analyte 224 is introduced into flow channel 70 through inlet port 62 bounded by wall 64 disposed in cover 60. Flow of the fluid exits flow channel 70 through exit port 66 bounded by wall 68 disposed in cover 60. In this manner, the fluid traverses flow channel 70 so that charged analyte 224 can contact analyte gate extension 50 at second end 52. As shown in FIG. 35, it is contemplated that analyte gate extension 50 can extend along substrate 30 from analyte gate contact 40 at analyte gate 4 to microfluidic chamber 76 in channel 74 bounded by wall 76 of substrate 30.

In an embodiment, with reference to FIG. 37, FIG. 38, FIG. 39, and FIG. 40, dual gate field effect transistor 246 includes substrate 30 that includes first substrate 33 on which analyte gate 4 and analyte gate contact 40 are disposed; and second substrate 31 on which microfluidic chamber 76 is disposed. Here, first substrate 33 and second substrate 31 are spaced apart by distance D, and analyte gate extension 50 spans a separation between first substrate 33 and second substrate 31 across distance D. It is contemplated that first substrate 33 and second substrate 31 can be disposed on a common platform that supports first substrate 33 and second substrate 31, wherein first end 54 of analyte gate extension 50 is electrically connected to electrical pad 80 disposed on first substrate 33, and second end 52 of analyte gate extension 50 is electrically connected to electrical pad 82 disposed on second substrate 31.

Figure 41:
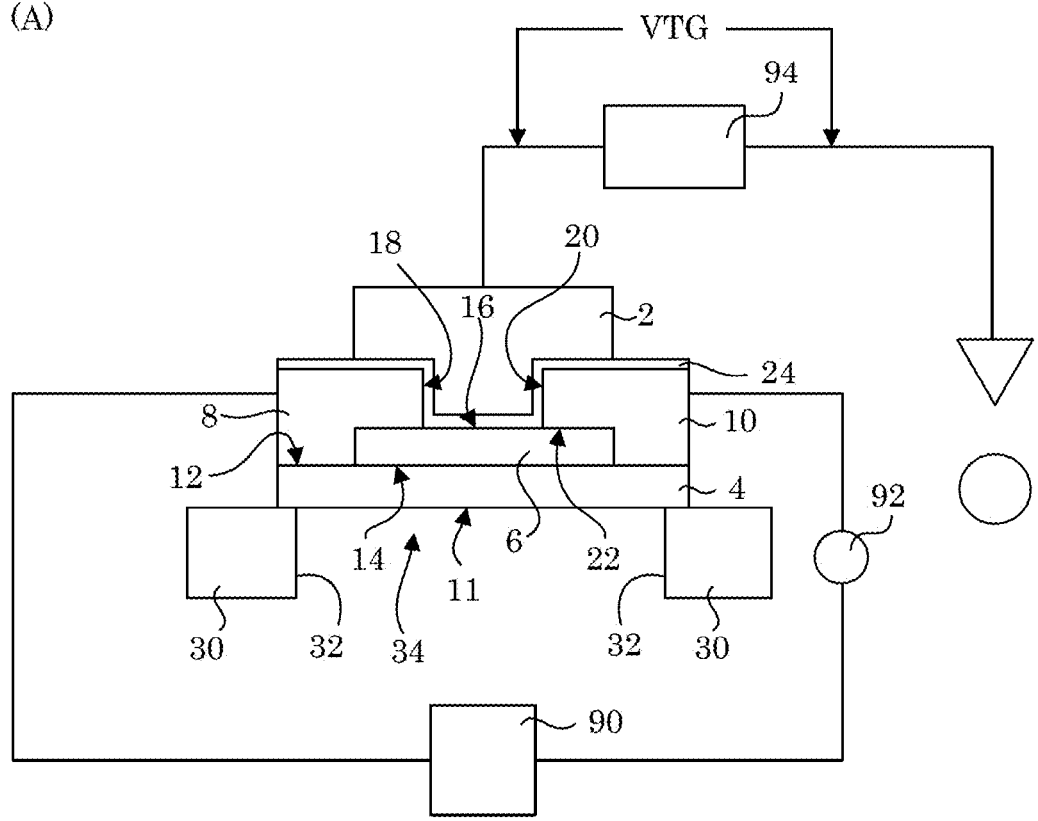
FIG. 41 shows a dual gate field effect transistor that includes an open loop detection in panel A, and panel B shows a graph of drain current versus gate voltage.
Figure 41:
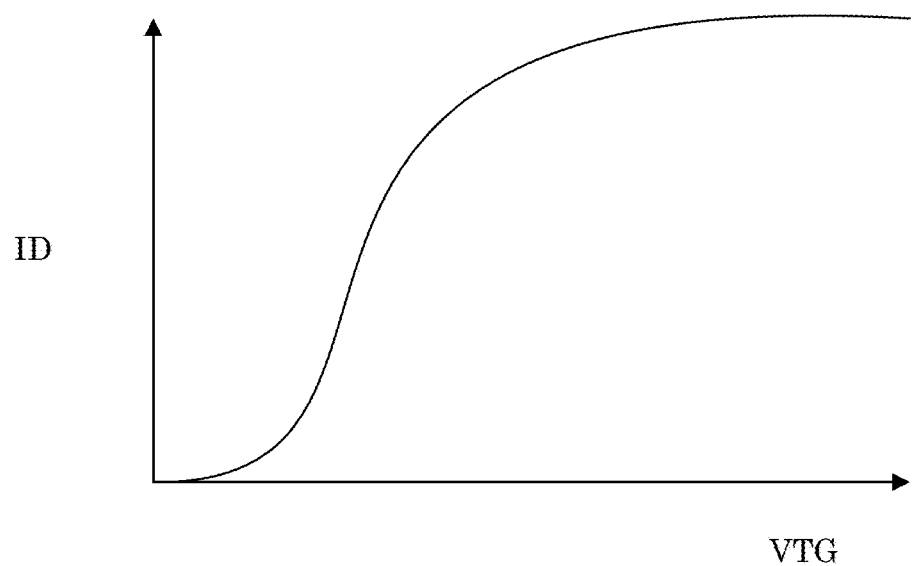

In an embodiment, with reference to FIG. 41, dual gate field effect transistor 246 includes power source 90 in electrical communication with source electrode 8 and drain electrode 10 and provides a potential difference that includes drain voltage VD between source electrode 8 and drain electrode 10. Power source 94 is in electrical communication with control gate 2 to provide gate voltage VG to control gate 2. Monitor 92 is electrically interposed between, e.g., drain electrode 10 and power source 90 to monitor drain current ID communicated between source electro-8 and drain electrode 10 through two-dimensional active layer 6. In this manner, a presence of charged analyte 58 at analyte gate 4 can be sensed by dual gate field effect transistor 246, e.g., by a change in drain current ID as shown panel B of FIG. 41. Here, dual gate field effect transistor 246 is configured in an open loop mode. Accordingly, drain voltage VD is applied across source electrode 8 and drain electrode 10, and drain current ID across two-dimensional active layer 6 is acquired by monitor 92 (e.g., an ammeter). Also, gate voltage VG is applied to control gate 2 to control a density of carriers in two-dimensional active layer 6 and to provide flow of drain current ID between source electrode 8 and drain electrode 10. A graph of drain current ID versus gate voltage VG is shown in panel B of FIG. 41. It is contemplated that gate voltage VG can maintain dual gate field effect transistor 246 in a sensitive detection region (e.g., S10 in panel B of FIG. 41) such that a relatively small change in gate voltage VG produces a relatively large change drain current ID. Charged analyte 224 proximate to analyte surface 11 of analyte gate 4 produces a change in drain current ID similar to changing gate voltage VG. A change in drain current ID is characteristic of charged analyte 224 interacting with dual gate field effect transistor 246 via analyte gate 4. The change in drain current ID due to charged analyte 224 can be nulled by changing gate voltage VG to return drain current ID to an amount of current prior to the change in drain current ID due to charged analyte 224.

Figure 42:
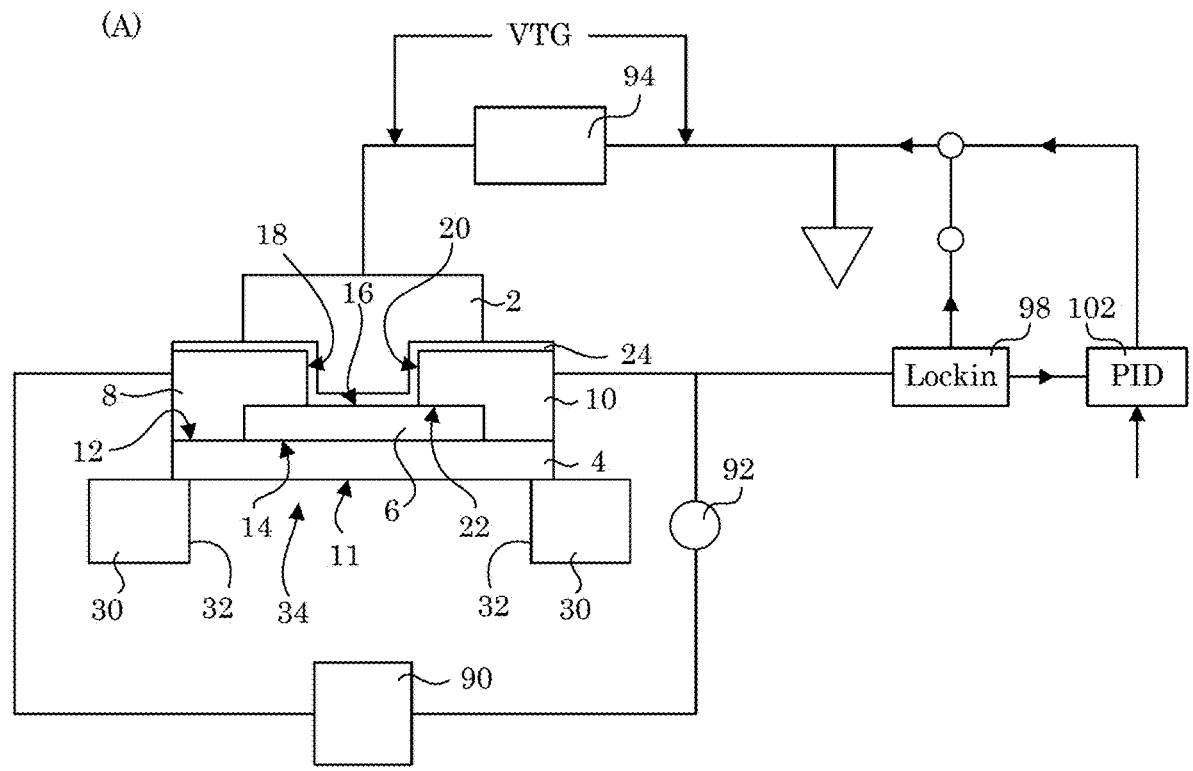
FIG. 42 shows a dual gate field effect transistor that includes a closed loop detection in panel A, and panel B shows a graph of drain current versus gate voltage.
Figure 42:
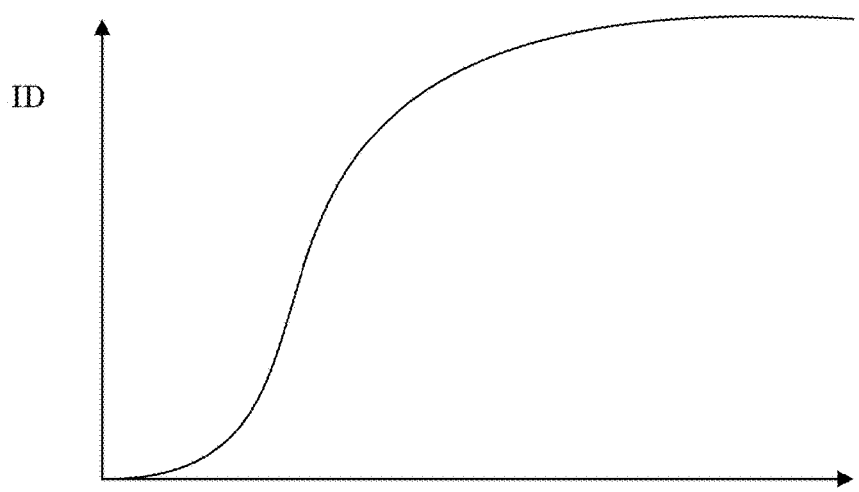

In an embodiment, with reference to FIG. 42, dual gate field effect transistor 246 includes power source 90 in electrical communication with source electrode 8 and drain electrode 10 and provides a potential difference that includes drain voltage VD between source electrode 8 and drain electrode 10. Power source 94 is in electrical communication with control gate 2 to provide gate voltage VG to control gate 2. Monitor 92 is electrically interposed between, e.g., drain electrode 10 and power source 90 to monitor drain current ID communicated between source electrode 8 and drain electrode 10 through two-dimensional active layer 6. In this manner, a presence of charged analyte 224 at analyte gate 4 can be sensed by dual gate field effect transistor 246, e.g., by a change in drain current ID as shown panel B of FIG. 42. Additionally, dual gate field effect transistor 246 can include frequency driver 98 (e.g., a lock-in amplifier) to control a frequency of gate voltage VG. Control loop feedback controller 102 can control an amplitude of gate voltage VG. Here, error signal 99 from frequency driver 98 can be provided to control loop feedback controller 102, wherein control signal 97 is communicated from control loop feedback controller 102 to power source 94 to control the amplitude of gate voltage VG. Control signal 97 changes in response to a change in error signal 99. Here, dual gate field effect transistor 246 is configured in a closed loop mode. Accordingly, drain voltage VD is applied across source electrode 8 and drain electrode 10, and drain current ID across two-dimensional active layer 6 is acquired by monitor 92 (e.g., an ammeter). Also, gate voltage VG is applied to control gate 2 to control a density of carriers in two-dimensional active layer 6 and to provide flow of drain current ID between source electrode 8 and drain electrode 10. A graph of drain current ID versus gate voltage VG is shown in panel B of FIG. 42. It is contemplated that gate voltage VG can maintain dual gate field effect transistor 246 in a sensitive detection region (e.g., S13 in panel B of FIG. 42) such that a relatively small change in gate voltage VG produces a relatively large change drain current ID. Charged analyte 224 proximate to analyte surface 11 of analyte gate 4 produces a change in drain current ID similar to changing gate voltage VG. A change in drain current ID is characteristic of charged analyte 224 interacting with dual gate field effect transistor 246 via analyte gate 4. The change in drain current ID due to charged analyte 224 can be nulled by changing gate voltage VG to return drain current ID to an amount of current prior to the change in drain current ID due to charged analyte 224. Moreover, periodic signal 103 (e.g. sinusoidal, square, and the like) with an amplitude that is small in comparison the amplitude of gate voltage VG is generated by frequency driver 98 (e.g. a lock-in amplifier, function generator, and the like) and added to gate voltage VG. Output signal 105 that includes oscillations in drain current ID are communicated to an input channel of frequency driver 98 (e.g. a lock-in amplifier, phase sensitive detector, and the like) to generate DC error signal 99 that is proportional to any external disturbance, e.g., from charged analyte 58 proximate to analyte gate 4 of dual gate field effect transistor 246. Error signal 99 is input to control loop feedback controller 102 (e.g. PID controller, nonlinear controller, and the like) to maintain drain current ID at a desired set point (e.g., S13 in panel B of FIG. 42) at a sensitive point of the graph. Moreover, control signal 97 produced control loop feedback controller 102, in response to a change in error signal 99 is recorded and is indicative of a binding event for charged analyte 58.

In an embodiment, dual gate field effect transistor 246 includes an improved semiconductor/insulating interface structure formed by inclusion of two-dimensional active layer 6 in which two-dimensional active layer 6 can include a two-dimensional (2D) atomic crystal layer. Such a structure may be used, for example in a field effect device, e.g., a thin film transistor. Other embodiments include a method for forming such a structure and for forming a field effect device such as a thin film transistor structure in dual gate field effect transistor 246.

Dual gate field effect transistor 246 advantageously provide greater carrier mobility, lower power consumption due to reduction in leakage current, high temperature stability (e.g., up to 500° C.), lower cost as compared, e.g., with a conventional crystalline silicon field effect transistor. In an embodiment, a 10× to 20× greater mobility (e.g., up to and greater than 500 cm$^2$N/Vs) or 2 orders of magnitude lower power consumption due to the reduction in leakage current is provided.

In an embodiment, dual gate field effect transistor 246 includes substrate 30 that can be any suitable dielectric or semiconductor material, e.g., silicon, glass, plastic, silicon, silicon on insulator, sapphire, and the like. Substrate 30 can be selected to support an interface between electronic and biological components as well as provide mechanical support for components of dual gate field effect transistor 246. In an embodiment, substrate 30 includes a regular shaped surface. Exemplary substrates 30 include silicon, silicon dioxide on silicon, $Al_2O_3$ on Si, $HfO_2$ on Si, sapphire, silicon carbide, and the like. In an embodiment, substrate 30 is thermally grown silicon dioxide on silicon with a part of the underlying silicon removed to form analyte chamber 34. In an embodiment, substrate 30 includes silicon dioxide on silicon.

A thickness of substrate 30 can be from 100 nanometers (nm) to 1 centimeters (cm), specifically from 500 nm to 1 millimeter (mm), and more specifically from 1000 nm to 500 micrometers (μm).

Analyte gate 4 is provided in dual gate field effect transistor 246 for changing drain current ID due to interaction with charged analyte 224. Exemplary materials for analyte gate 4 include a dielectric material such as $Al_2O_3$, $Hf_2O_2$, $SiO_2$, hexagonal boron nitride, and the like. In an embodiment, analyte gate 4 includes analyte surface 11 that can include be a chemical interface to promote adhesion of charged analyte 224 thereto. Analyte surface 11 improves selectivity of dyadic sensor 100 for charged analyte 224.

A thickness of analyte gate 4 can be from 1 nm to 300 nm, specifically from 1 nm to 30 nm, and more specifically from 2 nm to 10 nm.

It is contemplated that analyte gate contact 40 can be disposed on analyte gate 4. Exemplary materials for analyte gate 4 include silicon, silicon dioxide on silicon, $Al_2O_3$ on Si, $HfO_2$ on Si, sapphire, silicon carbide, and the like. Analyte gate extension 50 can be connected to analyte gate contact 40. In this manner, analyte gate contact 40 or analyte gate extension 50 can interact (e.g., contact) charged analyte 224 and communicated a change in electrical charge to analyte gate 4, wherein analyte gate 4 produces a change in drain current ID between source electrode 8 and drain electrode 10. Further, electrical pads (e.g., 80, 82) can be disposed on substrate 30 and in electrical contact with analyte gate contact 40 or analyte gate extension 50. It should be appreciated that analyte gate contact 40 or analyte gate extension 50, pads (80, 82) are electrically conductive and can include an electrical conductor such as a metal, e.g., titanium, gold, silver, aluminum, nickel, chrome, and the like, or a combination thereof.

A thickness of analyte gate contact 40 and analyte gate extension 50 independently can be from 20 nm to 300 nm, specifically from 50 nm to 200 nm, and more specifically from 50 nm to 100 nm.

Source electrode 8 and drain electrode 10 are disposed on two-dimensional active layer 6 to produce drain current ID that changes due to application of gate voltage VG to control gate 2 and a presence of charged analyte 224 at analyte gate 4, analyte gate contact 40, or analyte gate extension 50. It should be appreciated that source electrode 8 and drain electrode 10 are electrically conductive and can include an electrical conductor such as a metal, e.g., titanium, gold, silver, aluminum, nickel, chrome, and the like, or a combination thereof. A thickness of source electrode 8 and drain electrode 10 independently can be from 20 nm to 300 nm, specifically from 50 nm to 200 nm, and more specifically from 50 nm to 100 nm.

Control gate 2 is disposed on two-dimensional active layer 6 to control production of drain current ID via application of gate voltage VG to control gate 2 or presence of charged analyte 58 at analyte gate 4, analyte gate contact 40, or analyte gate extension 50. It should be appreciated that control gate 2 is electrically conductive and can include an electrical conductor such as a metal, e.g., titanium, gold, silver, aluminum, nickel, chrome, and the like, or a combination thereof. A thickness of control gate 2 can be from 20 nm to 300 nm, specifically from 50 nm to 200 am, and more specifically from 50 nm to 100 nm.

Gate insulating layer 24 is interposed between control gate 2 and two-dimensional active layer 6 to electrically isolate control gate 2 from two-dimensional active layer 6. It is contemplated that gate insulating layer 24 can be interposed between control gate 2 and drain electrode 10, control gate 2 and source electrode 8, or a combination thereof for electrical isolation. In some embodiments, gate insulating layer 24 is a high dielectric constant ("high-k") insulator layer. In some embodiments, the high-k insulator layer has a high-k value from 10 to 40 $e_o$. In some embodiments, the high-k insulator layer has a high k-value greater than 40 $e_o$. Exemplary material for gate insulating layer 24 includes an electrical insulator such as $Al_2O_3$, $Hf_2O_2$, $SiO_2$, hexagonal boron nitride, and the like, or a combination thereof. A thickness of gate insulating layer 24 can be from 1 nm to 300 nm, specifically from 1 nm to 30 nm, and more specifically from 2 nm to 10 nm.

Two-dimensional active layer 6 is interposed between control gate 2 and analyte gate 4. Two-dimensional active layer 6 can be a 2D atomic crystal layer with a crystalline atomic plane produced either from a bottom-up synthesis process (e.g. Van-der-Waals epitaxial growth), extracted, cleaved, or the like from a constituent bulk crystal. In some embodiments, an individual crystalline atomic plane is cleaved from a bulk homogeneous crystal structure. In some embodiment, two-dimensional active layer 6 is provided by cleaving a heterogeneous crystal structure. The cleaving process can be accomplished, e.g., by mechanical exfoliation, chemical exfoliation, or a combination thereof. The crystalline atomic plane of two-dimensional active layer 6 has a generally two-dimensional (2D) structure in x- and y-directions and a very small depth in the z-direction relative to its dimensions in the x-y plane (i.e., $D_x$, $D_y \gg D_z$). The 2D atomic crystals includes transition metal dichalcogenide (TMD) that provides a semiconducting structure and according semiconducting electrical properties. Additional 2D atomic crystals include black phosphorous, graphene, graphene oxide, indium selenide, silecene, and the like, or a combination thereof.

TMD can be arranged in an atomically thin monolayer having a chemical formula $MX_2$, wherein M a transition metal, and X is a chalcogenide of a chalcogen (e.g., O, S, Se, Te, and the like) from group 16 of the periodic table of elements. M can be, e.g., a transition metal of Group 3 (e.g., Sc, Y, and the like), Group 4 (e.g., Ti, Zr, Hf, and the like), Group 5 (e.g., V, Nb, Ta, and the like), Group 6 (e.g., Cr, Mo, W, and the like), Group 7 (e.g., Mn Re, and the like), Group 8 (e.g., Fe, Ru, Os, and the like), Group 9 (e.g., Co, Rh, Ir, and the like), Group 10 (e.g., Ni, Pd, Pt, and the like), Group 11 (e.g., Cu, Ag, Au, and the like), Group 12 (e.g., Zn, Cd, Hg, and the like), and the like, or a combination thereof. Alloyed forms of TMDs can be included in two-dimensional active layer 6 and can include a chemical formula $M_m M'_{1-m} X_2$, wherein M and M' are different transition metals, and $0 < m < 1$; $MX_x X'_{2-x}$, wherein X and X' are different chalcogenides, and $0 < x < 2$; and $M_m M'_{1-m} X_x X'_{2-x}$, where M and M' are different transition metals, X and X' are different chalcogenides, and $0 < m < 1$, and $0 < x < 2$. Doped forms of TMDs can be included in two-dimensional active layer 6 and can include alkali metal-doped forms of TMDs. More generally, M can be any combination of one or more transition metals, X can be any combination of one or more of S, Se, and Te, and the chemical formula can be represented as $MX_y$, where y is 2 or about 2. In some embodiments, TMD in two-dimensional active layer includes transition metal M that is a Group 6 transition metal (e.g., Mo or W).

Exemplary semiconducting transition metal dichalcogenides for two-dimensional active layer 6 include molybdenum disulfide ($MoS_2$), tungsten disulfide ($WS_2$), niobium disulfide ($NbS_2$), tantalum disulfide ($TaS_2$), vanadium disulfide ($VS_2$), rhenium disulfide ($ReS_2$), tungsten selenide ($WSe_2$), molybdenum selenide ($MoSe_2$), niobium selenide ($NbSe_2$), or the like. Without wishing to be bound by theory, transition metal dichalcogenides having group 4 and 6 transition metals (e.g., Mo, Hf, W) exhibit superconducting, semiconducting or insulating properties, depending on the band-gap of the material. The unfilled transition-metal d-band determines the band-gap, the dielectric constant, and mobility of the transition metal dichalcogenides.

Two-dimensional active layer 6 can be a single monolayer, double monolayer, triple monolayer, or the like. It is contemplated that a thickness of gate insulating layer 24 can be from 1 nm to 300 nm, specifically from 1 nm to 30 nm, and more specifically from 2 am to 10 nm.

Charge detector 200 senses presence of charged analyte 224 that contacts charge sensor 210. Charge sensor 210 includes sensing electrode 228 that can include metals or glasses to provide a charge sensitive sensing surface. Exemplary metals of sensing electrode 228 include gold, platinum, titanium, and the like. Exemplary glasses of the sensing electrode 228 include $SiO_2$, $Al_2O_3$, and the like. Moreover, the sensing surface of the sensing electrode 228 can be modified to be selective to biological or chemical species of interest. In an embodiment, sensing electrode 228 includes a platinum surface that is lithographically defined on a substrate assembled within a microfluidic chamber 250. Charge detector 200 includes a reference electrode 230 that provides a stable reference potential relative to the sensing electrode 228. The reference electrode can include a metal or glass. Exemplary metals for reference electrode 230 include platinum, titanium, silver, and the like. Reference electrode 230 can be a standard glass electrode that includes a tube of glass or plastic filled with electrolyte solution, containing a silver/silver chloride wire and a porous glass or other junction that is permeable to ions. In one embodiment, reference electrode 230 is a standard glass electrode, and sensing electrode 228 can include platinum. The voltage between sensing electrode 228 and reference electrode 230, which is held at reference potential 232 is used to generate charge signal 220. Moreover, reference potential 232 may be held at any voltage to optimize the operation of charge detector 200 including at ground, i.e., 0 V. Charge detector 200 includes a high impedance amplifier 234 (FIG. 5) that transforms charge signal 220. High impedance amplifier 234 provides a high input impedance that does not pass a high current within charge signal 220. An input impedance of high impedance amplifier 234 can be from 1 gigaOhm (GOhm) to 100 TOhm, and more specifically from 100 GOhm to 10 TOhm. A value of current within signal 220 can be from 1 fA to 1 nA, and more specifically from 100 fA to 10 pA. A voltage within signal 220 can be from −1 V to +1 V, and more specifically −10 mV to +10 mV, and more specifically from −10 µV to +10 µV. High impedance amplifier 234 can exhibit a voltage gain from 1 to 10. In one embodiment, high impedance amplifier 234 has a voltage gain of 1, acting as a voltage follower with an input impedance of 1 TOhm.

Figure 46:
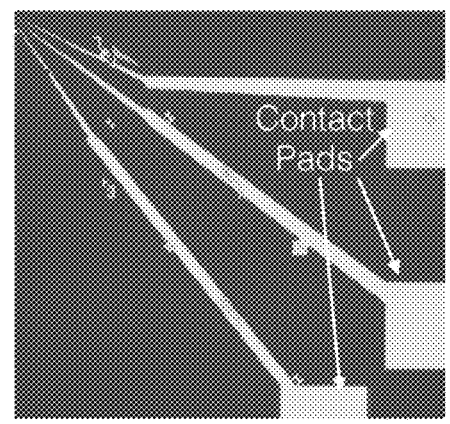
FIG. 46 shows a dual gate field effect transistor in panel A according to Example 1, and panel B shows a zoomed view the portion of the dual gate field effect transistor shown in panel A.
Figure 46:
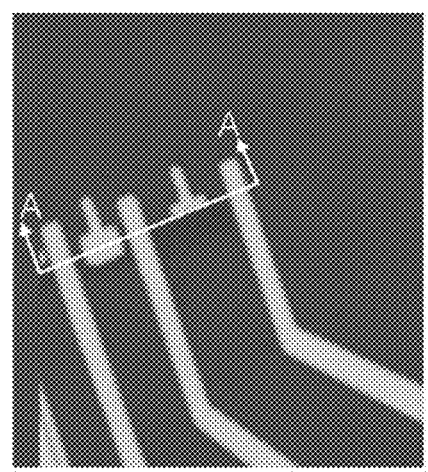
Figure 46:
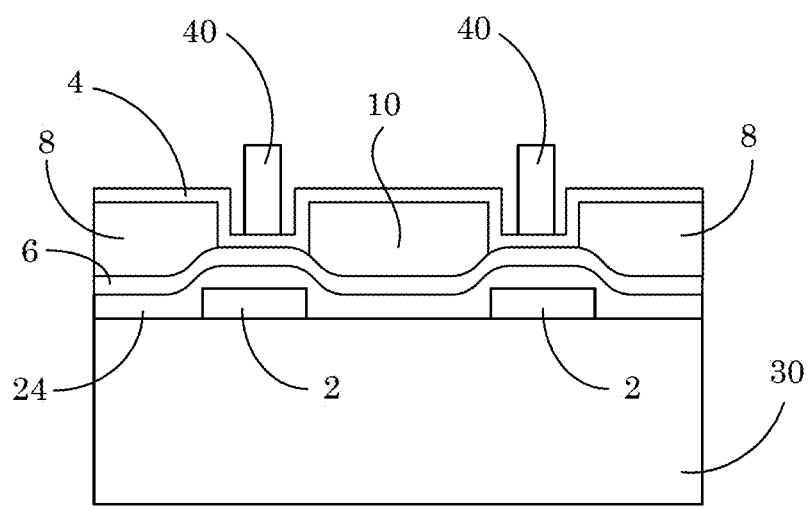
Figure 57:
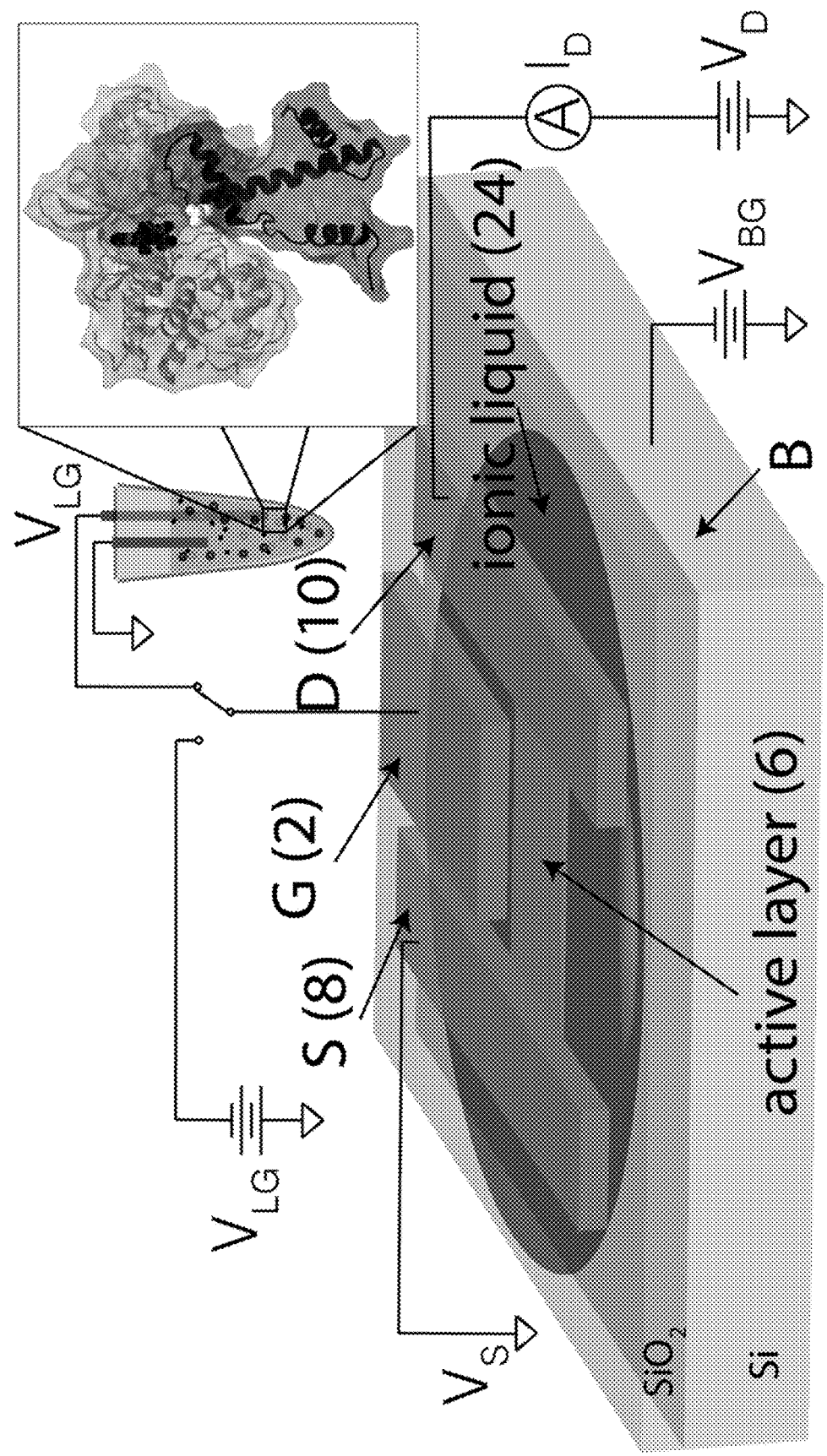
FIG. 57 shows a dual gate field effect transistor.
Figure 58:
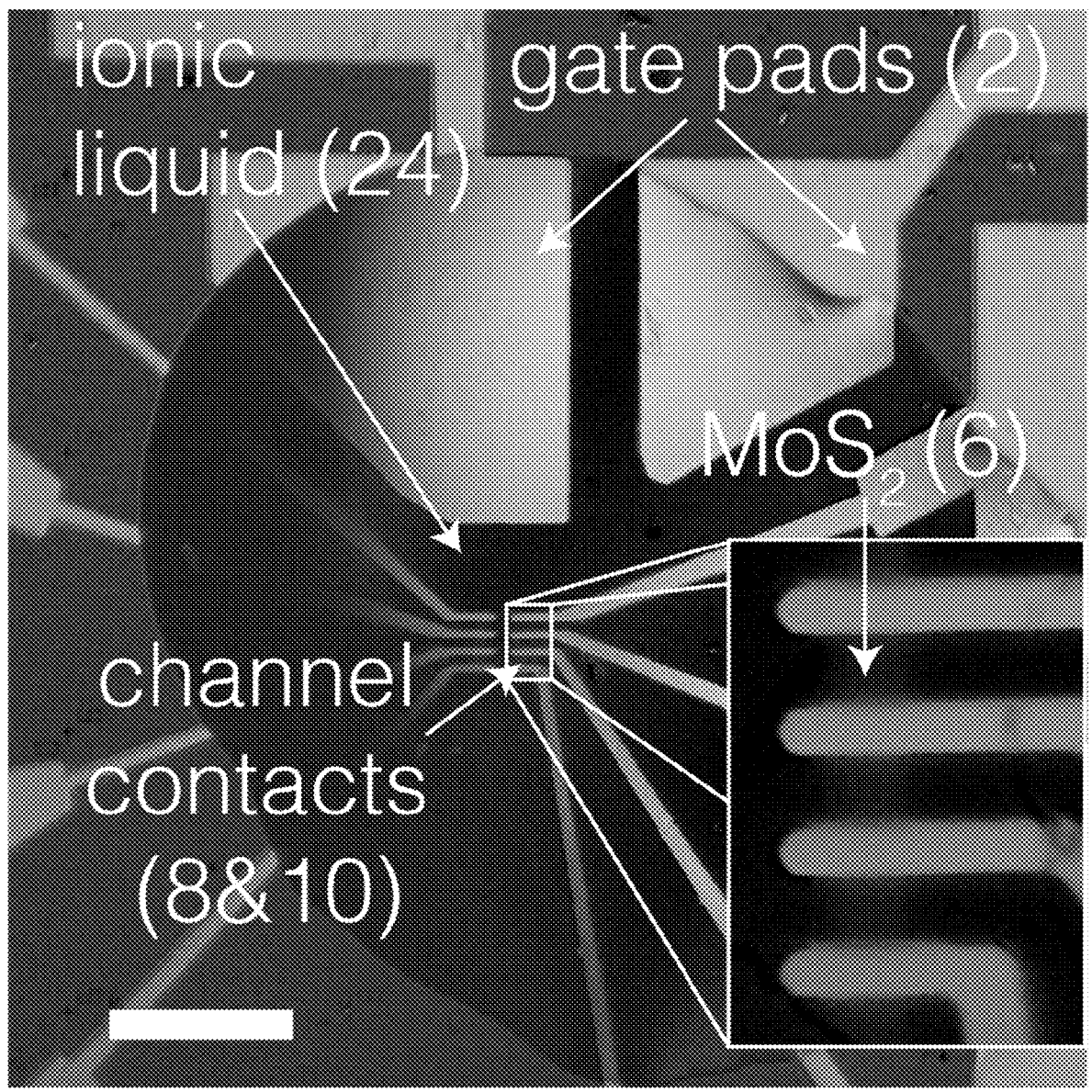
FIG. 58 shows a micrograph of a a dual gate field effect transistor.

Charge detector 200 transduces the presence of charged analyte 224 by detecting charge signal 220 using transducer 212. Transducer 212 includes an adder 240, gate voltage source 242, drain voltage source 244, and dual gate field effect transistor 246. Adder 240 sums the charge signal 220 with gate voltage source 242. Gate voltage source 242 is optimized to maintain dual gate field effect transistor 246 at its most sensitive operating point. A voltage for gate voltage source 242 can be from −5 V and +5 V, and more specifically from −1 V and +1 V. In an embodiment, adder 240 is a unity gain summing amplifier that accepts charge signal 220 on an input and gate voltage source 242 on the second input. In an embodiment, adder 240 sums charge signal 220 and gate voltage source 242 across identical resistors to add the signals and generate sum voltage 270. Output of adder 240 includes sum voltage 270 that is applied to analyte gate contact 40 of dual gate field effect transistor 246. Analyte gate contact 40 of dual gate field effect transistor 246 includes a metal disposed on analyte gate 4. Exemplary metals of analyte gate contact 40 include gold, titanium, nickel, chromium, and the like. Exemplary materials for analyte gate 4 include solid state dielectrics include $Al_2O_3$, $HfO_2$, $SiO_2$, single or multiple layers of hexagonal boron nitride (hBN), and the like. Exemplary ionic liquids include diethylmethyl(2-methoxyethyl)ammonium bis(trifluoromethylsulfonyl)imide (DEME-TFSI), and the like. In an embodiment, a gold analyte gate contact 40 is disposed on a 20 nm thick $Al_2O_3$ analyte gate 4 (FIG. 46). In an embodiment, a gold analyte gate contact 40 is in contact and electrical communication with an ionic liquid (DEME-TFSI) analyte gate 4 (FIG. 57 and FIG. 58). Transducer 212 also includes a drain voltage source 244 that generates drain voltage 252 applied to drain electrode 10 of dual gate field effect transistor 246 (FIG. 20, FIG. 21, FIG. 22, FIG. 23, FIG. 25, FIG. 26). This results in a current across the two-dimensional active area 6 and generates the transduction signal 218. Exemplary drain voltage source 244 include a battery or a power supply. Typical voltage ranges of drain voltage 252 applied using drain voltage source 244 are between −30 V and +30 V, and more specifically between −10 V and +10 V, and even more specifically between −1 V and +1 V. In an embodiment, drain voltage source 244 is a high precision power supply that provides a 0.5 V drain voltage 252 to drain electrode 10 of dual gate field effect transistor 246.

Charge detector 200 includes sensitivity controller 214 (FIG. 4, FIG. 5, FIG. 6, FIG. 7, FIG. 8, FIG. 9) to optimize the detection of charged analyte 224 by acting on the transduction signal 218 and providing a feedback control signal 216. Sensitivity controller 214 also outputs charge readout 226 to read the charge state of charged analyte 224. Sensitivity controller 214 comprises a current preamplifier 282 that transforms the transduction signal 218 to process signal 274. The transduction signal 218 can take the form of a current while the process signal 274 is typically a voltage. Typical current ranges of the transduction signal 218 are between 100 pA and 1 mA, and more specifically between 1 nA and 100 nA. Typical voltage ranges of the process signal 274 are between 10 □V and 10 V. In one embodiment (FIG. 2, FIG. 3, FIG. 4, FIG. 5, FIG. 8, FIG. 9), the current preamplifier 282 is a transimpedance amplifier with a gain of $10^6$ V/A, allowing the transformation of a 100 nA transduction signal 218 into a 100 mV process signal 274. Sensitivity controller 214 also comprises of control loop feedback device 272 that accepts the process signal 274 and generates a feedback control signal 216. The feedback control signal 216 is connected to the control gate 2 of the dual gate field effect transistor 246 (FIG. 20, FIG. 21, FIG. 22, FIG. 23, FIG. 25, FIG. 26). Typical voltage ranges for feedback control signal 216 are between −100 V and +100 V, and more specifically between −10 V and +10 V. Sensitivity controller 214 uses an approach to minimize the difference between process signal 274 and hold signal 278 to generate the feedback control signal 216. Typical values of the hold signal are between −10 V to +10 V and more specifically between −1 V and +1 V. In one embodiment, the sensitivity controller 214 is a PID controller that varies the feedback control signal 216 between −10 V and +10 V to maintain the transduction signal 218 at a constant value of 0.1 V to match the hold signal 278. Sensitivity controller 214 comprises of a phase-sensitive detector 284 that performs phase sensitive detection of transduction signal 218 to generate process signal 274. Phase-sensitive detector 284 generates phase signal 276 as an input to adder 280. Exemplary phase signal 276 include an AC signal with well-defined voltage and frequency that is added to the controller signal 286 (FIG. 7) or to the drain voltage 252 (FIG. 8). Typical voltage values of phase signal 276 are between 0 and 1 Vrms, and more specifically between 1 mVrms and 100 mVrms. Typical frequency values of phase signal 276 are between 1 Hz and 1 MHz, and more typically between 100 Hz and 100 kHz. In one embodiment, phase-sensitive detector 284 is a lock-in amplifier that locks onto a 10 kHz, 10 mVrms transduction signal 218 with a low-pass filter cut-off of 100 Hz to generate process signal 274. In this embodiment, the phase signal 276 is provided by the lock-in amplifier with a voltage amplitude of 10 mVrms and frequency of 100 kHz.

Charge detector 200 includes processor 290 to store charge readout 226. Processor 290 comprises of an analog to digital converter to digitize charge readout 226 and storage system to record the charge state of charge analyte 224. In one embodiment, the processor 290 is a PC with a built-in analog to digital convertor. In another embodiment, processor 290 is an integrated application specific integrated circuit (ASIC) that converts and stores charge readout 226.

In an embodiment, a process for making charge detector 200 includes disposing transducer 212 in electrical communication with charge sensor 210, disposing sensitivity controller 214 in electrical communication with transducer 212, and disposing sensitivity controller 214 in electrical communication with sensitivity controller 214. Here, charge sensor 210 can be made from metals or glasses to provide a charge sensitive sensing surface. Moreover, the sensing surface of the sensing electrode 228 can be tuned to be selective to biological or chemical species of interest. In an embodiment, sensing electrode 228 includes a platinum surface that is lithographically defined on a substrate assembled within a microfluidic chamber 250. Charge detector 200 includes a reference electrode 230 that provides a stable reference potential relative to the sensing electrode 228. The reference electrode can include a metal or glass. The voltage between the sensing electrode 228 and the reference electrode 230, which is held at a reference potential 232 is used to generate the charge signal 220. Charge detector 200 includes a high impedance amplifier 234 (FIG. 5) in electrical contact with the sensing electrode 228 that transforms the charge signal 220.

In an embodiment, making transducer 212 includes providing a gate voltage source 242 such as a battery or power supply to generate gate voltage 248. The adder 240 such as a summing amplifier is used to combine charge signal 220 with the gate voltage 248. The output of the adder 240 generates the sum voltage 270 and is applied to the control gate 2 of dual gate field effect transistor 246. The drain voltage source 244 generates the drain voltage 252 and is applied to the drain electrode 10 of the dual gate field effect transistor 246.

In an embodiment, making sensitivity controller 214 includes a current preamplifier 282 that transforms the transduction signal 218 to process signal 274. Sensitivity controller 214 also comprises of control loop feedback device 272 that accepts the process signal 274 and generates a feedback control signal 216. The feedback control signal 216 is connected to the control gate 2 of the dual gate field effect transistor 246. Sensitivity controller 214 includes a phase-sensitive detector 284 that performs phase sensitive detection of transduction signal 218 to generate process signal 274. Phase-sensitive detector 284 generates phase signal 276 as an input to adder 280. Exemplary phase signal 276 include an AC signal with well-defined voltage and frequency that is added to the controller signal 286 (FIG. 7) or to the drain voltage 252 (FIG. 8). Sensitivity controller 214 outputs charge readout 226 to read the charge state of charged analyte 224.

Figure 43:
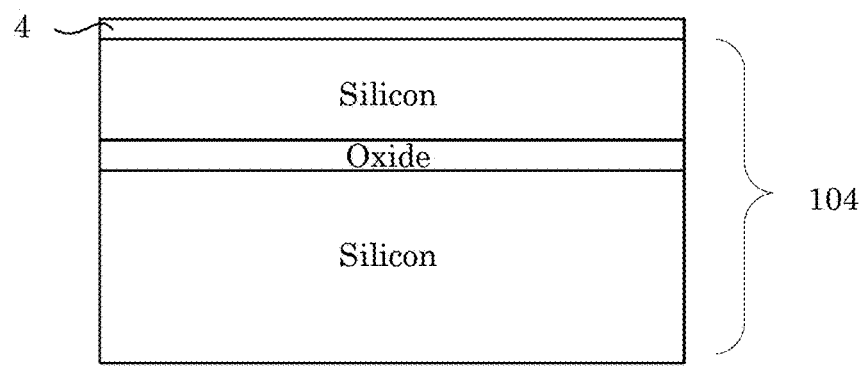
FIG. 43 shows steps for making a dual gate field effect transistor.
Figure 43:
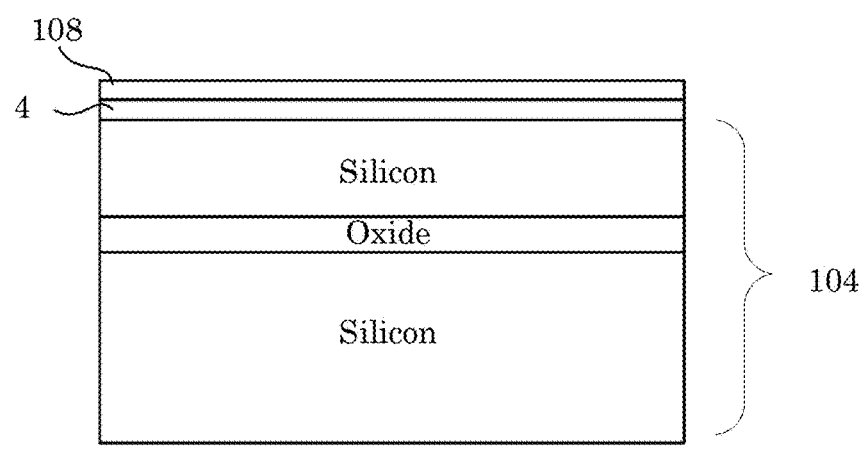
Figure 43:
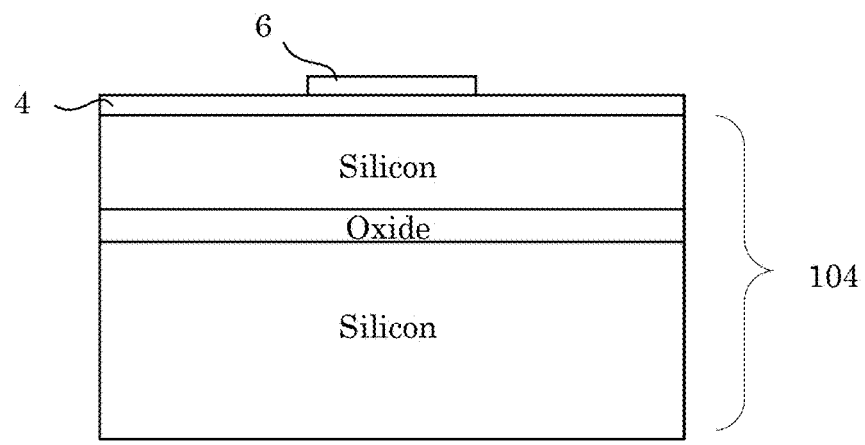
Figure 44:
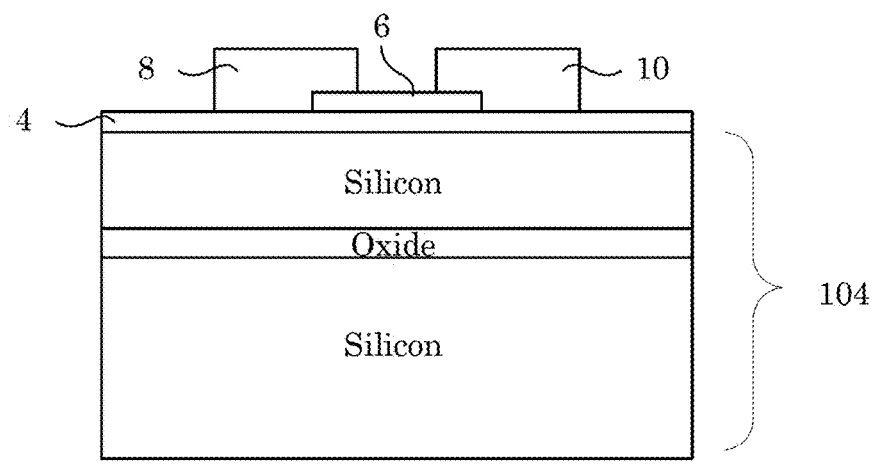
FIG. 44 shows steps for making a dual gate field effect transistor.
Figure 44:
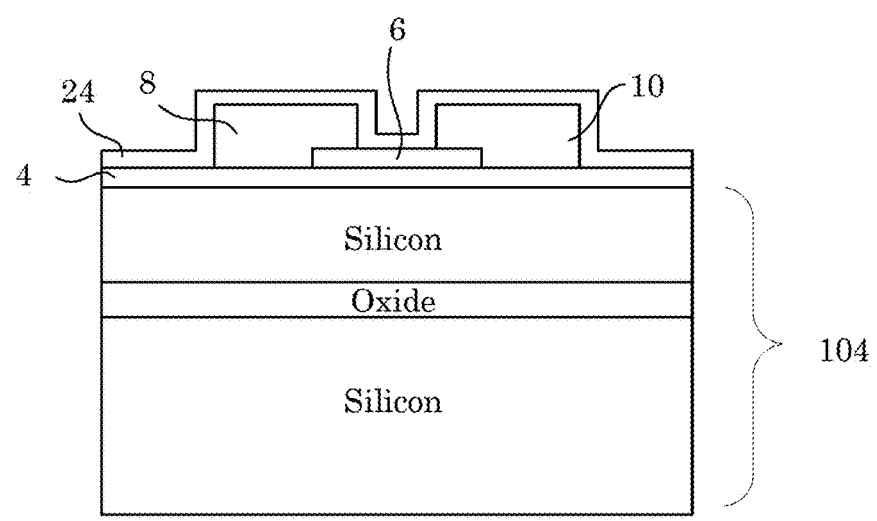
Figure 44:
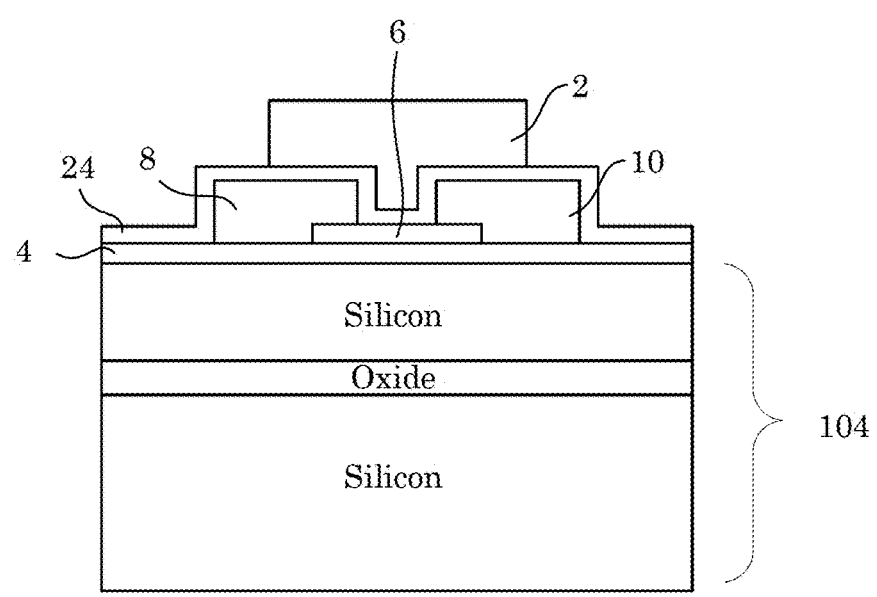

In an embodiment, with reference to FIG. 43 and FIG. 44, a process for making dual gate field effect transistor 246 includes providing substrate layer 104 that can include, e.g., a silicon on insulator (SOI) material in which a silicon oxide layer is interposed between layers of silicon. Analyte gate 4 (e.g., as an oxide film) is disposed on substrate layer 104 as shown in panel A of FIG. 43. The oxide film can include, e.g., SiO$_2$, Al$_2$O$_3$, HfO$_2$, and the like and can be deposited on substrate layer 104 via a thermal process, atomic layer deposition, and the like. As shown in panel B of FIG. 43, TMD is disposed as film layer 108 on analyte gate 4. Film layer 108 can be produced from an exfoliated material, deposited by chemical vapor deposition, and the like. As shown in panel C of FIG. 43, two-dimensional active layer 6 is defined lithographically, wherein TMD outside the lithographically defined is etched using, e.g. by reactive ion etching or the like, to prepare two-dimensional active layer 6. Thereafter, as shown in panel A of FIG. 44, source electrode 8 and drain electrode 10 is defined lithographically from a metal layer (not shown) that includes an electrically conductive material (e.g., gold, silver, platinum, and the like) and deposited on two-dimensional active layer 6 to form source electrode 8 and drain electrode 10. Gate insulating layer 24 is formed by deposition of a film of oxide (e.g. SiO$_2$, Al$_2$O$_3$, HfO$_2$, and the like.) via, e.g., atomic layer deposition to cover two-dimensional active layer 6, source electrode 8, and drain electrode 10 with gate insulating layer 24 as shown in panel B of FIG. 44. Panel C of FIG. 44 disposal of control gate 2 on two-dimensional active layer 6, source electrode 8, and drain electrode 10 that occurs after lithographic definition of control gate 2 so on two-dimensional active layer 6, source electrode 8, and drain electrode 10. Control gate 2 can be disposed by deposition of an electrically conductive material. As shown in panel A of FIG. 45, substrate 30 is formed by removing (e.g., by etching) part of substrate layer 104 to exposed analyte surface 11 of analyte gate 4 to form dual gate field effect transistor 246, wherein etching can be proceeded by lithographically defining the area for removal. Substrate layer 4 can be etched by deep reactive ion etching, TMAH etching, BOE etching, XeF$_2$ etching, and the like, or a combination thereof. Optionally analyte gate contact 40 can be disposed on analyte surface 11 of analyte gate 4 by metal deposition of an electrically conductive material. Further, analyte gate extension 50 optionally can be disposed on substrate 30 in electrical communication with analyte gate 4 by metal deposition of an electrically conductive material in receiver 74 (see FIG. 35) formed by etching substrate 30. Likewise, microfluidic chamber can be formed by etching substrate 30 to form flow channel 30 and disposing cover 60 over flow channel 30 with mechanical pressure, adhesive, or the like.

Figure 45:
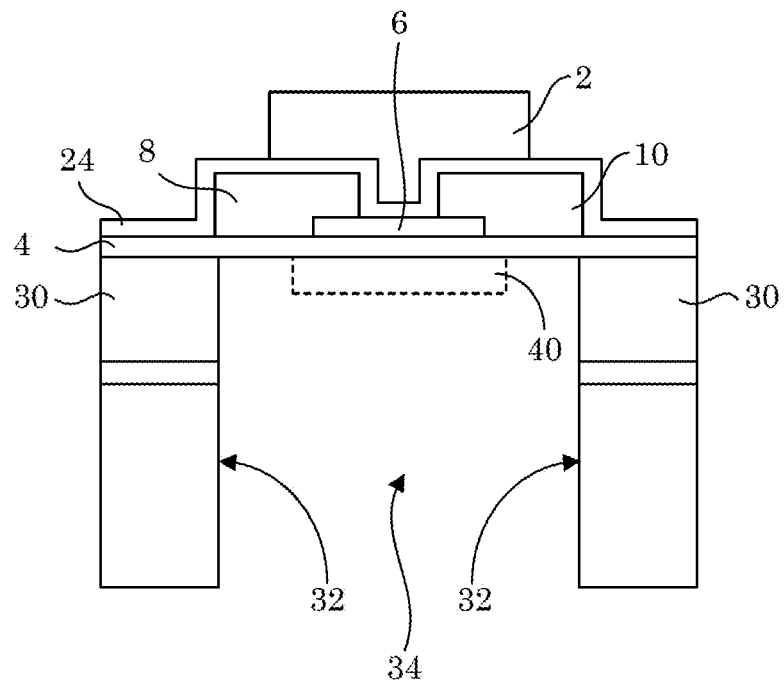
FIG. 45 shows steps for making a dual gate field effect transistor.
Figure 45:
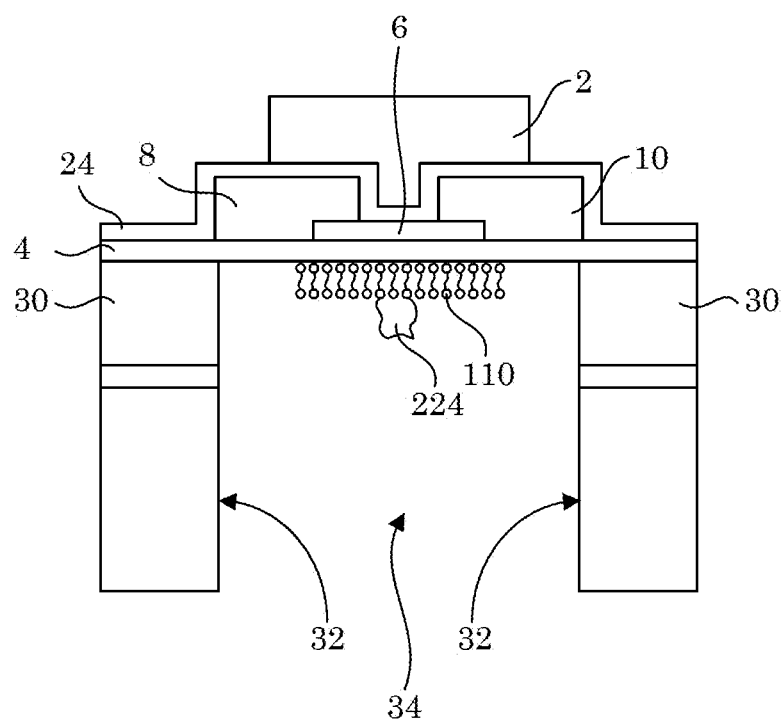

In an embodiment, as shown in panel B of FIG. 45, the process also can include disposing adsorbant 110 on analyte gate 4 or analyte gate contact 40. Adsorbant 110 provides interaction with charged analyte 58. Such interaction improves selectivity of dual gate field effect transistor 246 with respect to sensing charged analyte 58. Exemplary adsorbants 110 include a diffusive barrier (e.g., a polymer, lipids, and the like), biomolecule (e.g., a receptor protein, nucleic acid (DNA, RNA, and the like), antibody, and the like), and the like that interact with charged analyte 224 with high selectivity.

Figure 17:
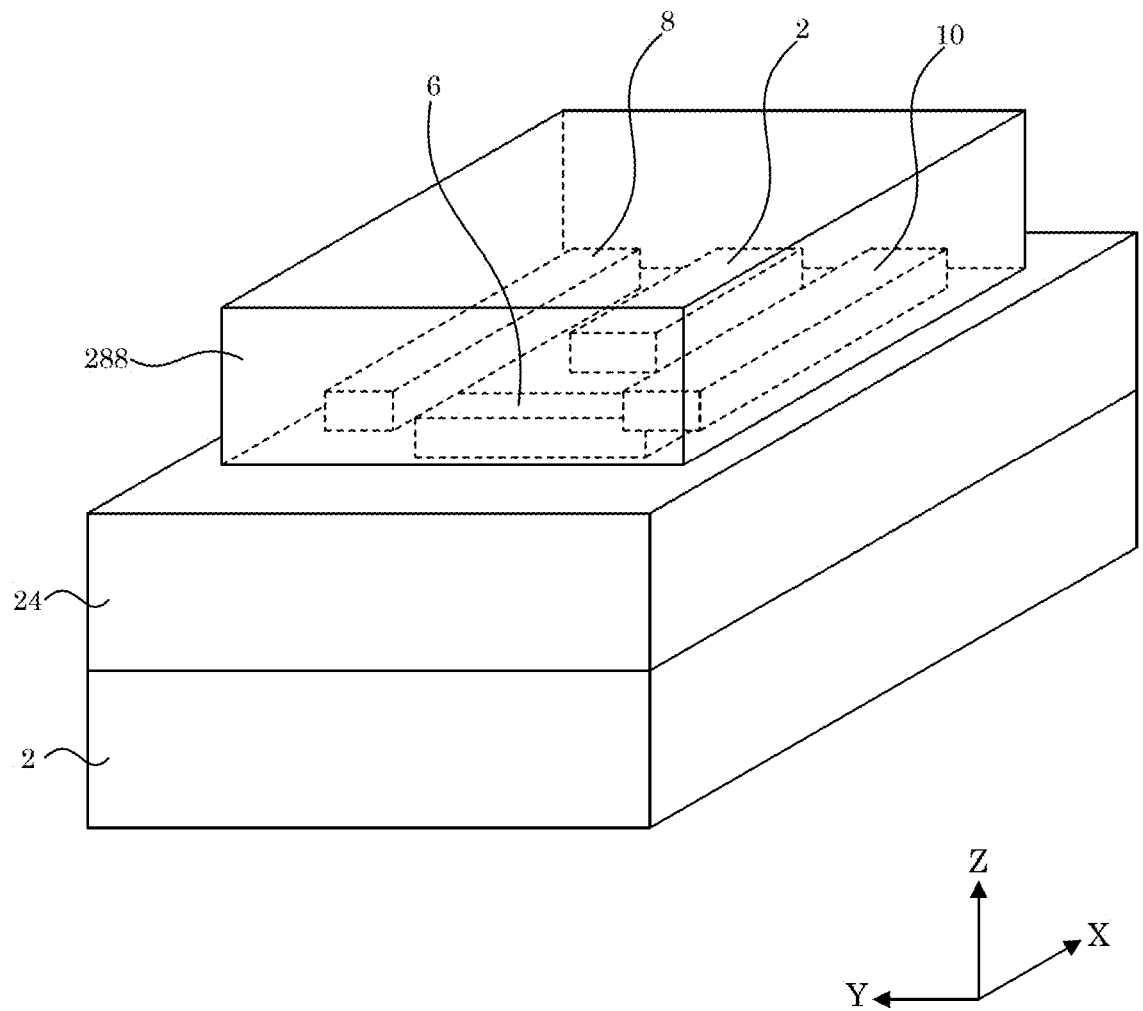
FIG. 17 shows a perspective view of the dual gate field effect transistor shown in FIG. 14.
Figure 18:
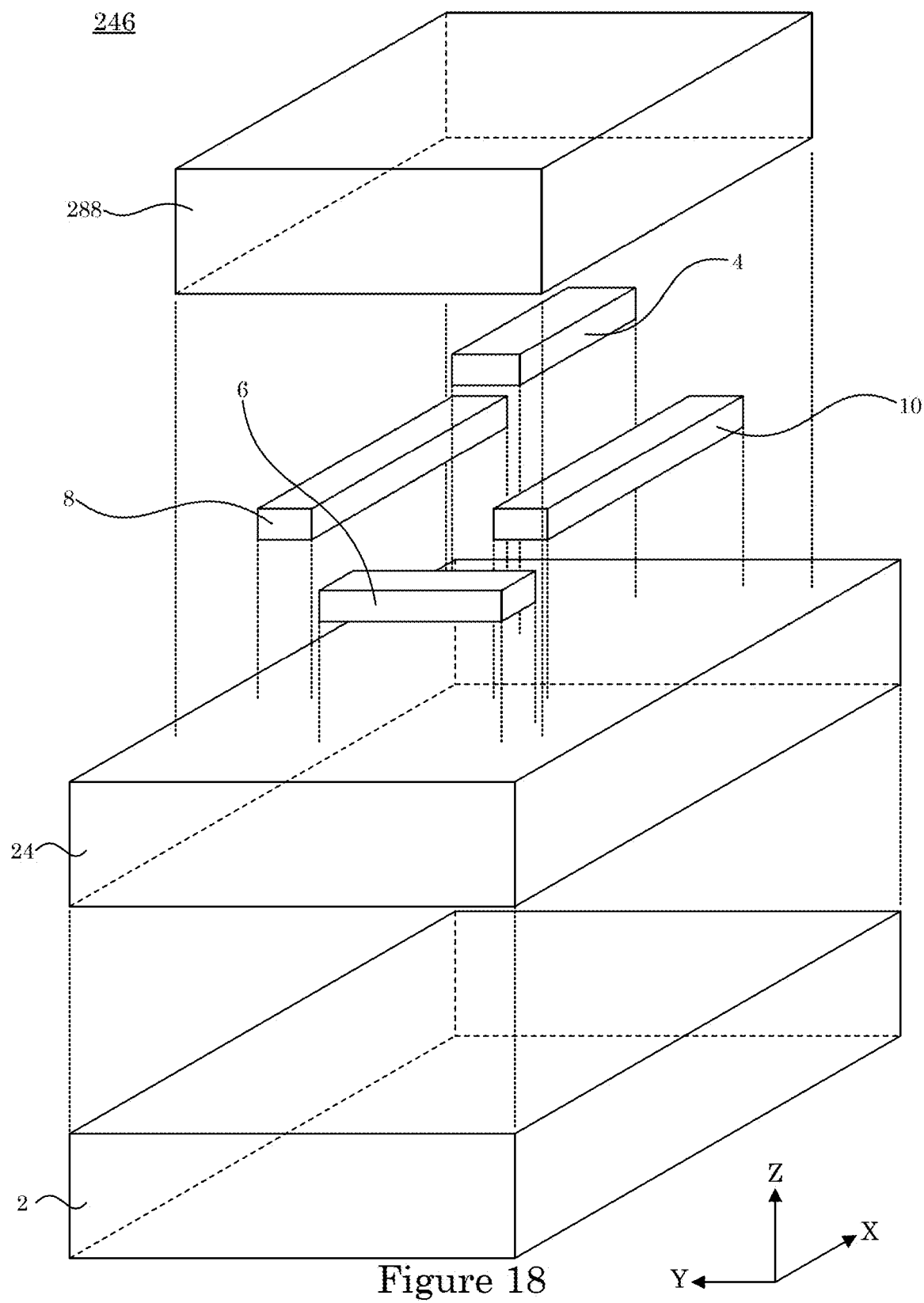
FIG. 18 shows an exploded view of the dual gate field effect transistor shown in FIG. 14.

In an embodiment, with reference to FIG. 14, FIG. 15, FIG. 16, FIG. 17, FIG. 18 and FIG. 57, a process for making dual gate field effect transistor 246 includes providing a control gate 2 that can include, e.g., silicon. The gate insulating layer 24 is interposed between the control gate 2 and the two-dimensional active layer 6. The oxide film can include, e.g., SiO$_2$, Al$_2$O$_3$, HfO$_2$, and the like and can be deposited on control gate 2 via a thermal process, atomic layer deposition, and the like. As shown FIG. 17, TMD is disposed as two-dimensional active layer 6 on gate insulating layer 24. Two-dimensional active layer can be produced from an exfoliated material, deposited by chemical vapor deposition, and the like. As shown in panel C of FIG. 43, two-dimensional active layer 6 is defined lithographically, wherein TMD outside the lithographically defined is etched using, e.g. by reactive ion etching or the like, to prepare two-dimensional active layer 6. Thereafter, as shown in panel FIG. 17, source electrode 8, drain electrode 10, and analyte gate 4 are defined lithographically from a metal layer (not shown) that includes an electrically conductive material (e.g., gold, silver, platinum, and the like) and deposited on two-dimensional active layer 6 to form source electrode 8 and drain electrode 10, and near two-dimensional active layer 6 to form analyte gate 4. Ionic liquid 288 is formed by syringe deposition of a droplet of ionic liquid (e.g., DEME-TFSI, etc.) to cover two-dimensional active layer 6 and analyte gate 4 as shown in FIG. 17.

Charge detector 200 has numerous beneficial uses, including sensing charged analyte 224. In an embodiment, a process for sensing charged analyte 224 with charge detector 200 includes: contacting charge sensor 210 with charged analyte 224; producing, by charge sensor 210, charge signal 220; communicating charge signal 220 from charge sensor 210 to transducer 212; receiving, by transducer 212, charge signal 220 from charge sensor 210; receiving, by transducer 212, feedback control signal 216 from sensitivity controller 214; producing, by transducer 212, transduction signal 218 in response to receipt of charge signal 220; receiving, by sensitivity controller 214, transduction signal 218 from transducer 212; and producing, by sensitivity controller 214, charge readout 226 in response to receipt of transduction signal 218 to sense charged analyte 224. The process for sensing charged analyte 224 further can include receiving charge signal 220 by adder 240; receiving gate voltage 248 by adder 240; producing sum voltage 270 from charge signal 220 and gate voltage 248; receiving, by dual gate field effect transistor 246, sum voltage 270 from adder 240; receiving drain voltage 252 by dual gate field effect transistor 246; receiving, by dual gate field effect transistor 246, feedback control signal 216 from sensitivity controller 214; and producing, by dual gate field effect transistor 246, transduction signal 218 from sum voltage 270 based on feedback control signal 216. The process for sensing charged analyte 224, further can include receiving transduction signal 218 by current preamplifier 282; producing process signal 274 by current preamplifier 282 from transduction signal 218; receiving, by control loop feedback device 272, process signal 274; receiving, by control loop feedback device 272, hold signal 278; producing, by control loop feedback device 272, feedback control signal 216, based on process signal 274 and hold signal 278; producing, by control loop feedback device 272, charge readout 226 based on charge signal 220 produced from contact by charged analyte 224 with sensing electrode 228; and receiving, by dual gate field effect transistor 246, feedback control signal 216 from control loop feedback device 272. The process for sensing charged analyte 224 further can include receiving transduction signal 218 by phase-sensitive detector 284; producing process signal 274 by phase-sensitive detector 284 from transduction signal 218; producing phase signal 276 by phase-sensitive detector 284; receiving, by control loop feedback device 272, process signal 274 from phase-sensitive detector 284 and hold signal 278; producing, by control loop feedback device 272, controller signal 286 from process signal 274 and hold signal 278; receiving, by adder 280, phase signal 276 and controller signal 286; producing, adder 280, feedback control signal 216 from phase signal 276 and controller signal 286; and receiving, by dual gate field effect transistor 246, feedback control signal 216 from adder 280. In an embodiment, a process for sensing charged analyte 224 further includes disposing ionic liquid 288 on control gate 2 of dual gate field effect transistor 246 of transducer 212.

In the process for performing sensing charged analyte 224, contacting charge sensor 210 with charged analyte 224 can include measurement of charged species such as H+ ions that contact the sensing electrode 228, or include biomolecules such as proteins, DNA, antibodies, and the like that contact sensing electrode 228 through covalent conjugation or other attachment technique. In the process for performing sensing charged analyte 224, producing, by transducer 212, transduction signal 218 from sensitivity controller 214 can include generating charge signal 220 with a high impedance amplifier 234, summing charge signal 220 with gate voltage source 242 using adder 240 to generate sum voltage 270. In the process for performing sensing charged analyte 224, producing, by charge sensor 210, charge signal 220 includes using a voltage defined relative to a reference potential 232 that can be set to any voltage include ground (i.e., 0 V). In the process for performing sensing charged analyte 224, communicating charge signal 220 from charge sensor 210 to transducer 212 includes a transformation using a high impedance amplifier 234, e.g., a voltage follower that transforms the high impedance input signal to a low impedance output signal to preserve signal fidelity, decrease parasitic effects and minimize noise. In the process for performing sensing charged analyte 224, receiving, by transducer 212, feedback control signal 216 from sensitivity controller 214 can include receiving the output of adder 240, the sum voltage 270, which constitutes a signal representative of the charged analyte 224. In the process for performing sensing charged analyte 224, producing, by transducer 212, transduction signal 218 in response to receipt of charge signal 220 induces a current in two-dimensional active layer 6 (FIG. 2, FIG. 3, FIG. 4, FIG. 5, FIG. 6, FIG. 7, FIG. 8, FIG. 9) that manifests as the transduction signal 218. In the process for performing sensing charged analyte 224, receiving, by sensitivity controller 214, transduction signal 218 from transducer 212 can include input of the transduction signal 218 to the current preamplifier 282 resulting in a process signal 274 voltage that is fed to the control loop feedback device 272. The control loop feedback device 272 compares the process signal 274 with a hold signal 278 to generate the feedback control signal 216. In the process for performing sensing charged analyte 224, producing, by sensitivity controller 214, charge readout 226 in response to receipt of transduction signal 218 can include an output of the feedback control signal 216 for plotting or saving to storage medium. In the process for performing sensing charged analyte 224, receiving charge signal 220 by adder 240 can include summing the gate voltage from the gate voltage source 242 with the charge signal 220.

In the process for performing sensing charged analyte 224, receiving gate voltage 248 by adder 240 can include electrically connecting a battery or power supply to the input of the adder 240 using a resistor. In the process for performing sensing charged analyte 224, producing sum voltage 270 from charge signal 220 and gate voltage 248 can include using adder 240 (e.g., using a summing amplifier) to add charge signal 220 to gate voltage 248 In the process for performing sensing charged analyte 224, receiving, by dual gate field effect transistor 246, sum voltage 270 from adder 240 can include a voltage that is proportional to the interaction of charged analyte 224 to the sensing electrode 228. In the process for performing sensing charged analyte 224, receiving drain voltage 252 by dual gate field effect transistor 246 can include setting the baseline transduction signal 218 prior to modulation by the sum voltage 270. In the process for performing sensing charged analyte 224, receiving, by dual gate field effect transistor 246, feedback control signal 216 from sensitivity controller 214 can include a voltage to the control gate 2 of the dual gate field effect transistor 246 to maintain the transduction signal 218 at a constant value. In the process for performing sensing charged analyte 224, producing, by dual gate field effect transistor 246, transduction signal 218 from sum voltage 270 based on feedback control signal 216 allows the transduction signal 218 to be maintained at a constant value defined by the hold signal 278. In the process for performing sensing charged analyte 224, receiving transduction signal 218 by current preamplifier 282 can include electrical communication between current preamplifier 282 and source electrode 8 of dual gate field effect transistor 246.

In the process for performing sensing charged analyte 224, producing process signal 274 by current preamplifier 282 from transduction signal 218 can include conversion of current transduction signal 218 to a voltage process signal 274 using a current preamplifier 282 with gain (e.g., a transimpedance amplifier). In the process for performing sensing charged analyte 224, receiving, by control loop feedback device 272, process signal 274 electrical communication of control loop feedback device 272 with current preamplifier 282. In the process for performing sensing charged analyte 224, receiving, by control loop feedback device 272, hold signal 278 includes electrical communication with a battery or power supply that generates a voltage equal to the desired set point value. In the process for performing sensing charged analyte 224, producing, by control loop feedback device 272, feedback control signal 216, based on process signal 274 and hold signal 278 can include comparing the process signal 274 with hold signal 278 and use predefined logic operations to generate feedback control signal 216 that minimizes the difference (or error) between the process signal 274 and hold signal 278. In the process for performing sensing charged analyte 224, producing, by control loop feedback device 272, charge readout 226 based on charge signal 220 produced from contact by charged analyte 224 with sensing electrode 228 is obtained by duplicating the feedback control signal 216 and outputting it as charge readout signal 226 for plotting or saving to storage medium. In the process for performing sensing charged analyte 224, receiving, by dual gate field effect transistor 246, feedback control signal 216 from control loop feedback device 272 can include electrical communication between control loop feedback device 272 and the control gate 2 of dual gate field effect transistor 246.

In the process for performing sensing charged analyte 224, receiving transduction signal 218 by phase-sensitive detector 284 can include electrical communication between current preamplifier 282 and phase-sensitive detector 284. In the process for performing sensing charged analyte 224, producing process signal 274 by phase-sensitive detector 284 from transduction signal 218 can include demodulating the transduction signal 218 with the phase signal 276 followed by a low-pass filter step to obtain a DC voltage when the transduction signal 218 is at the same frequency as the phase signal 276. The output of the demodulator results in the process signal 274. In the process for performing sensing charged analyte 224, producing phase signal 276 by phase-sensitive detector 284 can include the output of a waveform generator that generates an AC signal (e.g., a sine wave, or a square wave) with a voltage amplitude, frequency and phase. In the process for performing sensing charged analyte 224, receiving, by control loop feedback device 272, process signal 274 from phase-sensitive detector 284 and hold signal 278 can include electrical communication between control loop feedback device 272 and phase-sensitive detector 284. Receiving hold signal 278 by control loop feedback device 272 requires electrical communication with a battery or power supply that generates a voltage equal to the desired set point value. In the process for performing sensing charged analyte 224, producing, by control loop feedback device 272, controller signal 286 from process signal 274 and hold signal 278 can include comparing the process signal 274 with the hold signal 278 and use pre-defined logic operations to generate feedback control signal 216 that minimizes the difference (or error) between the process signal 274 and hold signal 278. In the process for performing sensing charged analyte 224, receiving, by adder 280, phase signal 276 and controller signal 286 can include electrical communication between adder 280 and control loop feedback device 272, as well as adder 280 and phase-sensitive detector 284. In the process for performing sensing charged analyte 224, producing, adder 280, feedback control signal 216 from phase signal 276 and controller signal 286 can include using a summing amplifier to add phase signal 276 with the controller signal 286 to generate feedback control signal 216.

In the process for performing sensing charged analyte 224, receiving, by dual gate field effect transistor 246, feedback control signal 216 from adder 280 can include electrical communication between adder 280 and dual gate field effect transistor 246. In the process for performing sensing charged analyte 224, disposing ionic liquid 288 on control gate 2 of dual gate field effect transistor 246 of transducer 212 can include deposition of a droplet of ionic liquid (e.g., DEME-TFSI) using a pipette or a syringe.

In addition to being disposed in charge detector 200, dual gate field effect transistor 246 has numerous beneficial uses, including independently sensing charged analyte 224. In an embodiment, process for sensing an analyte includes providing dual gate field effect transistor 246; subjecting source electrode 8 and drain electrode 10 with a first potential difference comprising drain voltage VD; subjecting control gate 2 with gate voltage VG; and monitoring drain current ID to sense a presence of charged analyte 224 at analyte gate 4 or at charge sensor 210. As used herein, "sensing" can include detection of the presence of one or more analytes, measurements of the interaction between two or more analytes, detecting conformational or structural changes in one or more analytes, or detecting chemical changes that lead a change in net charge of one or more analytes. The process can further include controlling a frequency of gate voltage VG with frequency driver 98, wherein monitoring drain current ID includes detecting drain current ID at the frequency of gate voltage VG. The process also can include controlling an amplitude of gate voltage VG with control loop feedback controller 102. In some embodiments, the process includes providing error signal 99 from frequency driver 98 to control loop feedback controller 102; and providing control signal 97 from control loop feedback controller 102 to control the amplitude of gate voltage VG, wherein control signal 97 changes in response to a change in error signal 99. Acquisition of the drain current ID can be accomplished by a parameter analyzer, ammeter, analog to digital convertor, or oscilloscope. Additionally, a set point can be supplied to control loop feedback controller 102 by a digital input or analog voltage source.

Charge detector 200 has numerous advantageous and beneficial properties. In this regard, charge detector 200 can provide operation of the dual gate field effect transistor 246 with asymmetric gate capacitances at the quantum capacitance limit of the two-dimensional active layer 6. Using charge detector 200 provides dual gate field effect transistor 246 to improve measurement sensitivity by 200× over conventional field effect transistors (e.g., chemFET, or ion-sensitive FET). Further, varying the gate voltage 248 allows the sensitivity of dual gate field effect transistor 246 to be tuned dynamically by placing the two-dimensional active layer 6 in either the depletion regime, weak inversion regime, or strong inversion regime. The ability to vary sensitivity of dual gate field effect transistor 246 in this way allows more sensitive measurements over a small range of interest or lower sensitivity measurements over a wider range of interest (i.e., dynamic range and sensitivity can be optimized). Unexpectedly, charge detector 200 allows operation of dual gate field effect transistor 246 at very low noise, which allows measurement signal to noise ratio (SNR) to improve with sensitivity, in contrast to chemFETs, ion-sensitive FETs and dual-gate silicon FETs.

In an aspect, dual gate field effect transistor 246 includes drain current ID through two-dimensional active layer 6 and changes in response to and depends upon volt gate VG applied to control gate 2 and the charge present at analyte gate 4. A charged analyte 224 generates charge signal 220, which when summed with gate voltage 248 using adder 240 results in sum voltage 270. The adjustable voltage from gate voltage 248 allows dual gate field effect transistor 246 to always operate at its optimum settings for a given application when used within charge detector 200. Further, the combination of optimized sum voltage 270 and the feedback control signal 216 place the two-dimensional active layer 6 within dual gate field effect transistor 246 to always operate in a low noise regime (e.g., strong inversion) thereby maximizing the signal to noise ratio and consequently allowing measurements with extremely low limit of detection (LOD). Moreover, dual gate field effect transistor 246 can be an asymmetric sensor, wherein control gate 2 is a different material than analyte gate 4. In an embodiment, control gate 2 is electrically conductive, and analyte gate 4 is dielectric. It is contemplated that dual gate field effect transistor 246 can be a symmetric sensor, wherein control gate 2 is a same material as analyte gate 4. Further, dual gate field effect transistor 246 provides sensitive detection and quantification of analytes due to the presence of a separate control gate 2, wherein dual gate field effect transistor 246 can be disposed at a point of optimal sensitivity, in an absence of decreasing sensitivity from contact with charged analyze 224 to the surface of analyte gate 4 or sensing electrode 228.

Advantageously, unexpectedly, and surprisingly, dual gate field effect transistor 246 is a dual gate article and includes control gate 2 to control two-dimensional active layer 6 and includes analyte gate 4 that can be a thin membrane layer disposed over analyte chamber 34 (a fluidic chamber for flow or disposal of charged analyte 224 on analyte gate 4). Beneficially, analyte gate contact 40 can be disposed on analyte gate 4 and can be a second metal gate electrode that is superior to a conventional chem FET or floating gate FET, which adsorb molecules on a metal top gate. Because chem FET or floating gate FET has a thick gate dielectric, the chem FET or floating gate FET has a loss of sensitivity over time. Dual gate field effect transistor 246 overcomes these problems with conventional FETs and decreases effects of already adsorbed layers of analyte on analyte gate 4 by changing the top gate voltage in a presence of the adsorbed layers.

Additionally, dual gate field effect transistor 246 selectively senses inter-molecular interactions in a composition that includes a plurality of charged analytes 224 and senses a selected analyte selectively, e.g., via adsorbant 110 disposed on analyte gate 4, wherein adsorbant 110 interact (e.g., bind) to a selected analyte with a selected specificity (e.g., high specificity, low specificity, and the like).

The articles and processes herein are illustrated further by the following Examples, which are non-limiting.

EXAMPLES

Example 1. Fabrication of a Dual Gate Field Effect Transistor

A dual gate field effect transistor was fabricated by first defining the control gate using photolithography, followed by depositing 20 nm of gate insulating material, $Al_2O_3$, using an atomic layer deposition (ALD) process. Single crystal monolayer $MoS_2$ was exfoliated onto the control gate insulator. This was followed by ebeam lithography to define and metallize source and drain contacts with 2 nm of Ti and 50 nm Au using e-beam deposition. Deposition of 20 nm of $Al_2O_3$ with ALD followed to define the analyte gate. Finally, an analyte gate contact extension was patterned with e-beam lithography and then metallized with 2 nm of Ti and 50 nm Au using e-beam deposition.

FIG. 46 shows the array of dichalcogenide asymmetric dual gate field effect transistors in panel A. Panel B shows a zoomed view of a portion of the dichalcogenide asymmetric dual gate field effect transistor shown in panel A. Here, arrays of dual gate field effect transistors with varying lengths of two-dimensional active layers to vary sensitivity and drive current of the dual gate field effect transistors in the array.

Example 2. Operation of a Dual Gate Field Effect Transistor

Figure 47:
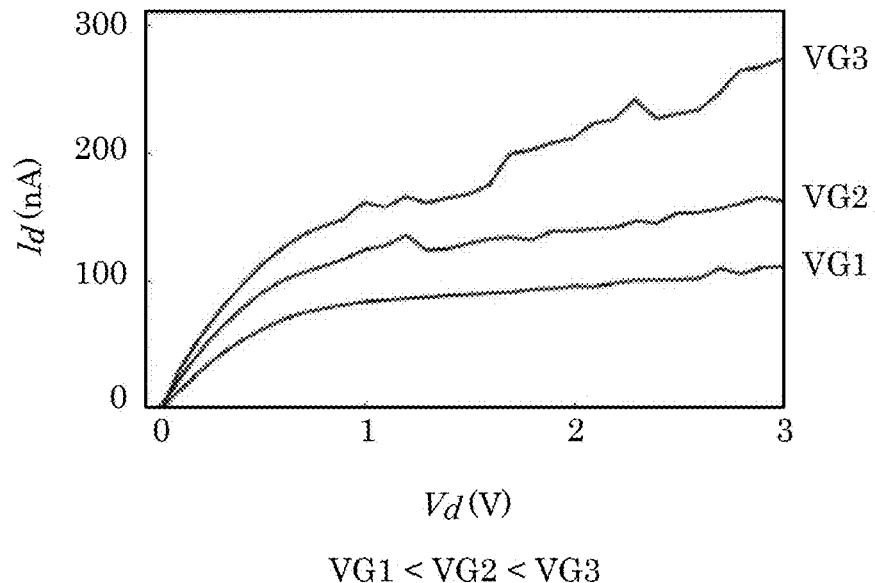
FIG. 47 shows a graph of trained current versus drain voltage in panel A according to Example 2, and panel B shows a graph of trained current versus gate voltage.
Figure 47:
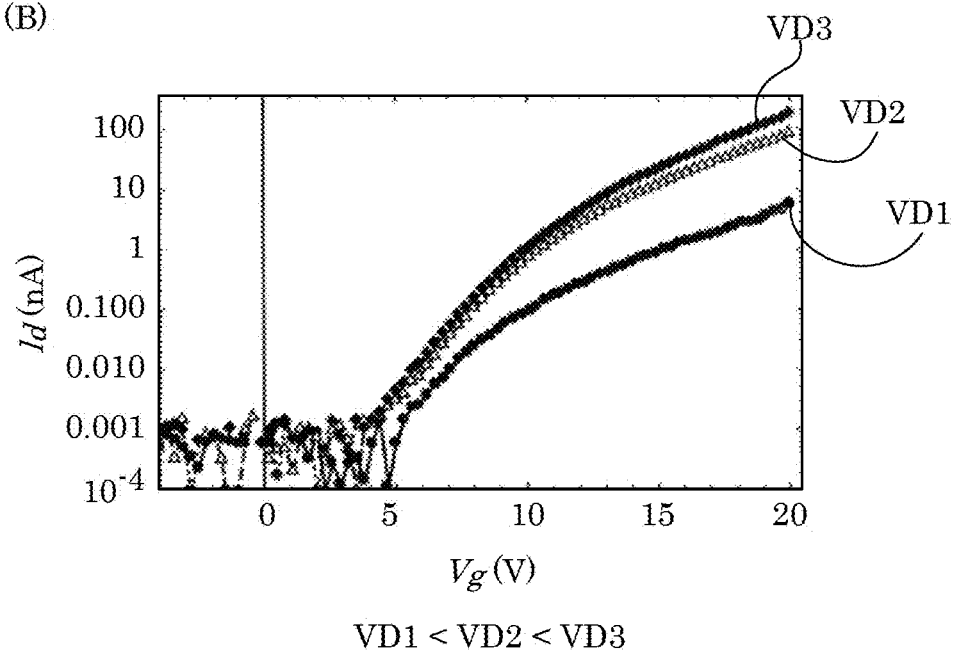

Dual gate field effect transistors in the array described in Example 1 were operated by placing the devices in a probe station and probing the source, drain, and control gate contacts. I-V curves were measured using a semi-conductor parameter analyzer to sweep the drain voltage and step the gate voltage to obtain the plots in FIG. 47 that shows data from the operation of the dual gate field effect transistors. The drain current ($I_d$) was plotted against the drain voltage ($V_d$) for three independent gate potentials ($V_g$). $V_d$ was varied from 0 to 3V and drain current $I_d$ for each sweep was recorded. Here, transfer characteristics of the dual gate field effect transistors were verified by plotting $I_d$ against $V_g$ for three independent values of $V_D$. The ratio of the saturation current ($I_{on}$) to the current when the dual gate field effect transistors is off ($I_{off}$) was found to be greater than $10^5$.

Example 3. Detecting an Analyte with a Dual Gate Field Effect Transistor

Dual gate field effect transistors in the array described in Example 1 were used to sense an analyte by placing a droplet with known analyte concentration directly in contact with the analyte gate contact. At the end of the measurement period, the analyte gate contact was rinsed with a buffer solution consisting of IM NaCl and 30 mM of TRIS-EDTA at pH 7.2 to remove the analyte.

Figure 48:
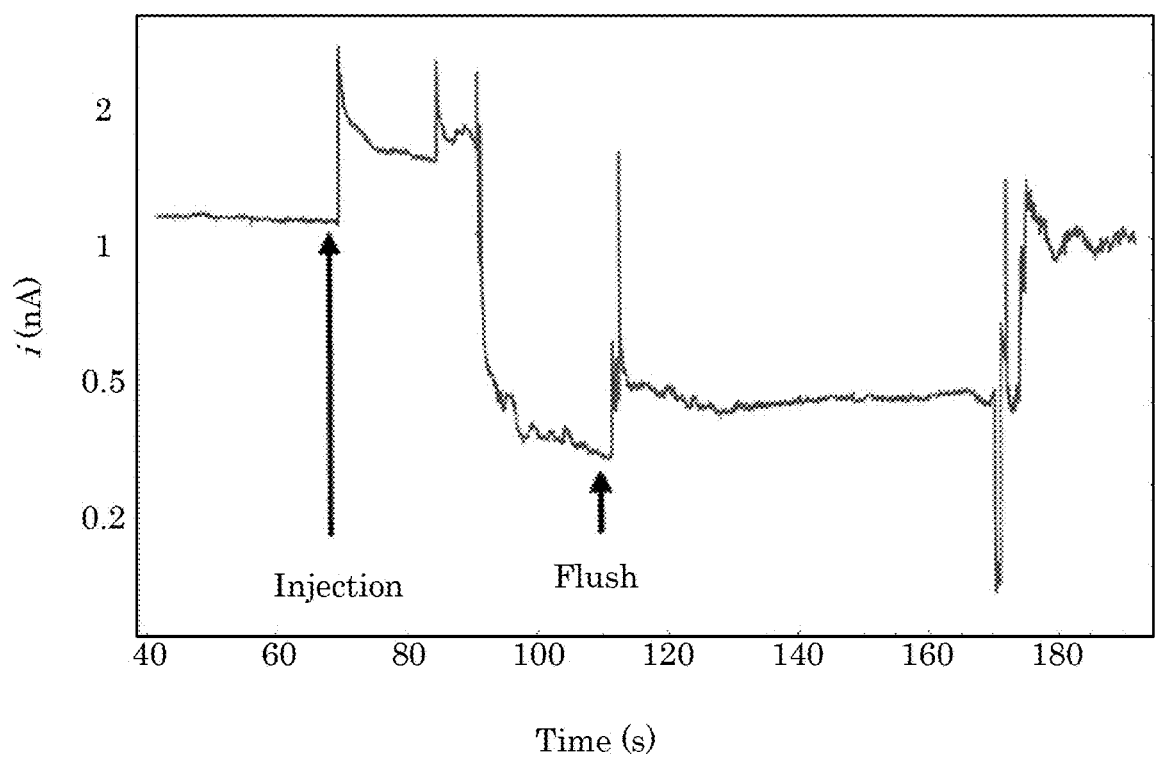
FIG. 48 shows a graph of drain current versus time according to Example 3.

FIG. 48 shows drain current $I_d$ as a function of time. 40 nano moles/L of single-stranded DNA (ssDNA) was injected onto the sensing surface at t=65 s. This resulted in a rapid change in the drain current from 1 nA to ~ 0.2 nA commensurate with the adsorbed charge from the ssDNA molecules in solution. The ssDNA was subsequently flushed for several seconds starting at t=110 s. This resulted in $I_d$ recovering to its baseline value of 1 nA.

Example 4. Functionalization of a Dual Gate Field Effect Transistor

Figure 49:
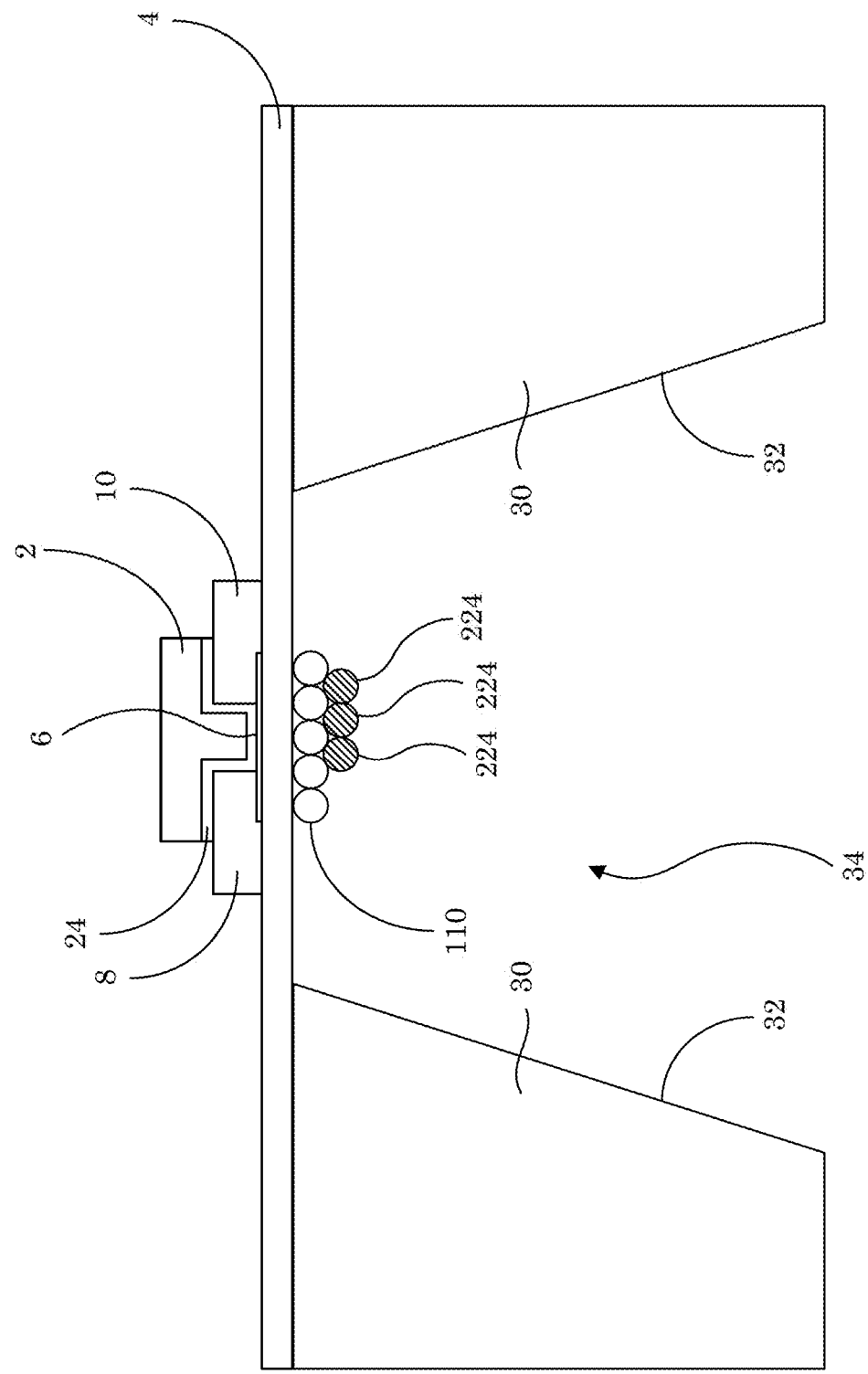
FIG. 49 shows a dual gate field effect transistor according to Example 4.

To one of the dual gate field effect transistors in the array described in Example 1, a receptor protein was attached to the analyte gate as an adsorbant as shown in FIG. 49. The attachment of a receptor as an analyte to the receptor protein at the analyte gate provided a change in the drain current of the two-dimensional active layer. Further, the receptor binds various analytes (e.g., serotonin, a drug molecule, ligand, and the like). Interaction between adsorbant and the analyte can be an electrostatic interaction. Upon binding a ligand molecule as the analyte, the potential of the dual gate field effect transistors is further modulated. A magnitude of change of drain current is proportional to the charge of the molecule, screening, or other environmental effect. This change modulates the amount of drain current, and the amount is proportional to the strength of the interaction. The change in drain current provides sensing, e.g., detection or electrostatic characterization, of the interaction between the analyte and the adsorbant. Removal of the ligand from the adsorbant returns the drain current to a previous value. A time evolution of the interaction was recorded by characterizing the rate at which interactions started and the rate at which interactions ended and provided kinetic characterization of the interaction and change in the interaction.

Example 5. Measurement System to Operate Dual-Gated Field Effect Transistors at a Quantum Capacitance Limit for Ultrasensitive Biosensing Dual-gated field-effect transistors were operated at the quantum capacitance limit and provided ultrasensitive pH measurements in biophysics applications. The devices were fabricated with 2D transition metal dichalcogenide films exfoliated onto oxide substrates and top gated with an ionic liquid. The high ionic liquid polarizability provided strong coupling between the top gate (ionic liquid) and a back-gate dielectric (substrate oxide) in which amplification of a voltage applied to the ionic liquid gate by up to 200×. This amplification was limited by the intrinsic quantum capacitance of the semiconducting channel. The devices operated near a theoretical limit. The devices had high performance for pH measurements with sensitivity greater than a Nerst value of 59 mV/pH and was ≈100× greater than conventional devices. Furthermore, the signal-to-noise ratio (SNR) of the measurements were more than an order of magnitude higher than convention ion sensitive field effect transistors (ISFET) and provided a low limit of detection of 0.001 pH units. The pH measurements provided rapid and quantitative estimation of kinetics for enzymes implicated in Alzheimer's disease. Measurements such as these can be used in development of therapeutics for neurodegenerative conditions.

Figure 2:
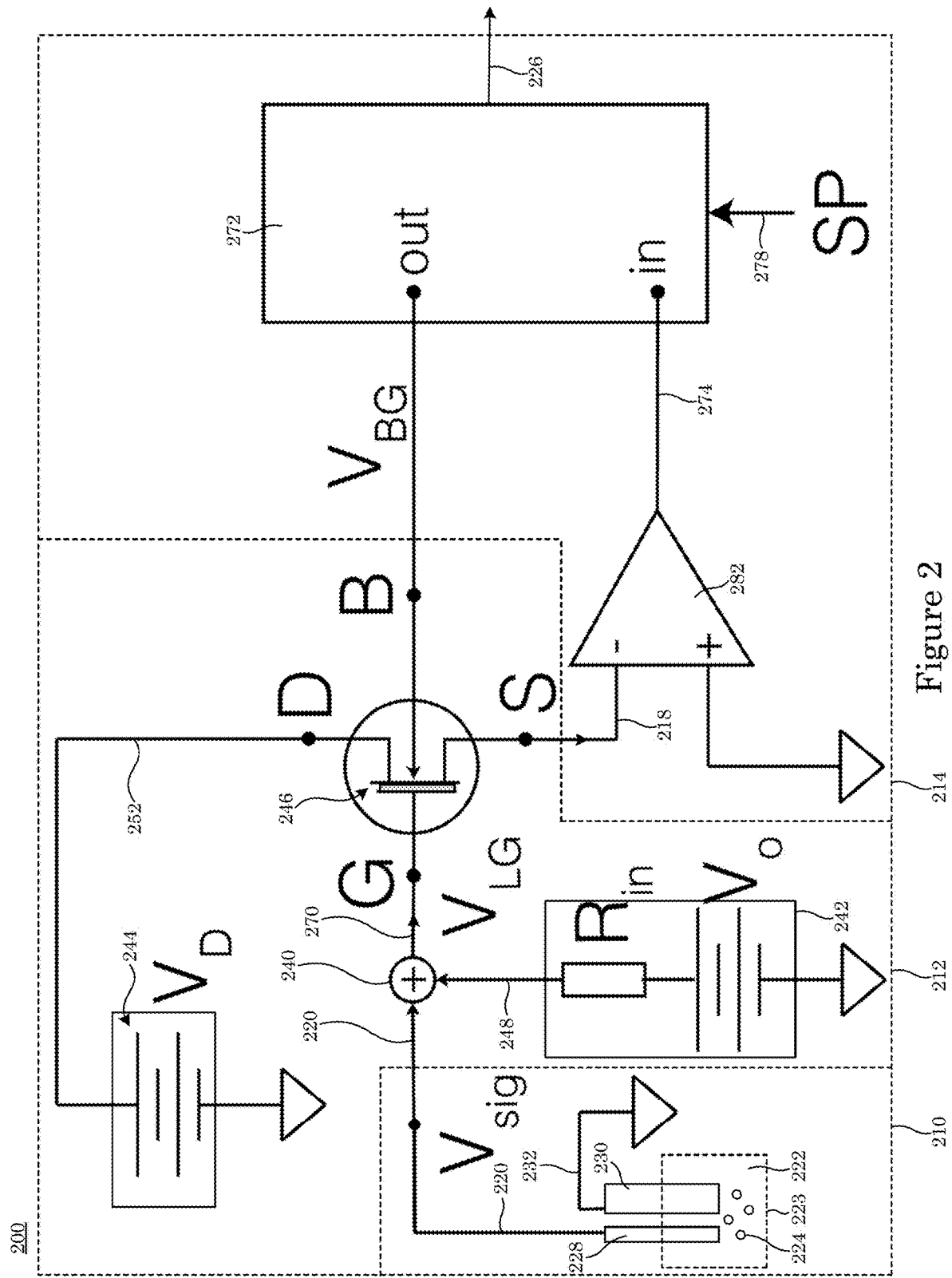
FIG. 2 shows a charge detector.
Figure 3:
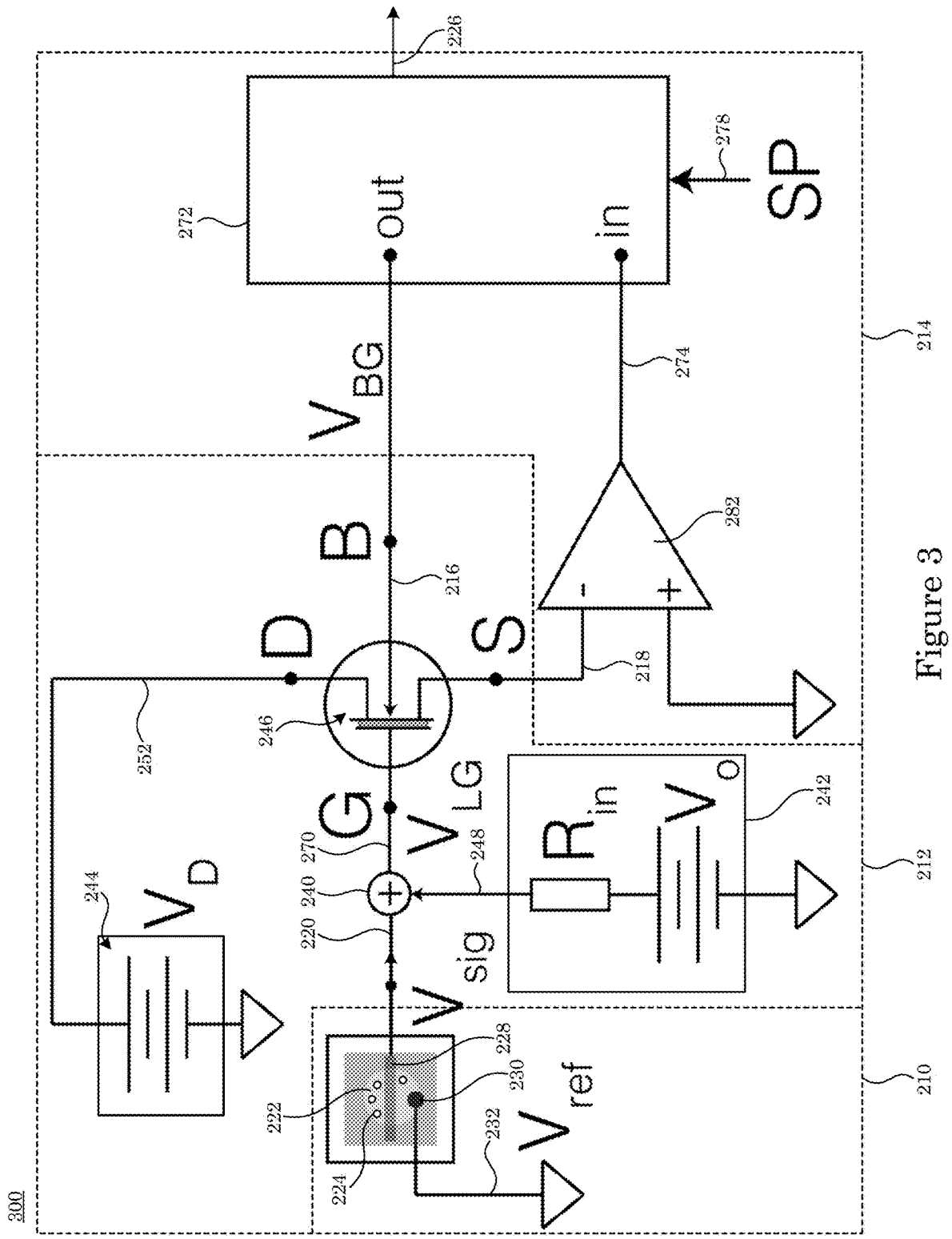
FIG. 3 shows a charge detector.

Dual-gated ionic liquid FETs were configured to run in a constant current mode to enable ultra-sensitive and time-resolved measurements of biomolecules and biomolecular reactions. The ionic liquid FETs were run in a constant current mode by using a proportional-integral-derivative (PID) controller as shown in FIG. 2. The PID controller varied the back-gate voltage, $V_{BG}$, (point B in FIG. 2) in response to the liquid gate voltage, $V_{LG}$, (point G in FIG. 2) to maintain a pre-determined root mean square (RMS) channel current, e.g., 100 nA$_{rms}$. PID performance was then compared with open loop operation where $I_D$ was recorded in response to changes in $V_{LG}$. $V_{LG}$ combines of two voltage components, $V_{sig}$ and $V_0$. The signal, $V_{SIG}$, connected to the ionic liquid-gate was generated by a biosensing element in a test-tube (FIG. 2a) or alternatively to a sensing element in a microfluidic channel (FIG. 2b). In both cases, a fixed DC offset voltage ($V_o$) was added to $V_{LG}$ across a resistor ($R_{in}$) to set the value of FET gain (□). In this instance, the sensing and transduction elements were integrated for on-chip measurements.

Here, the sensing element was designed to operate within microfluidic channels and included a metal (e.g., Au, Pt, Al, Ag, and the like.) lithographically patterned onto a substrate (e.g., Si, SiO2, SiN3, quartz, and the like.). This allows biomolecules to be directly conjugated onto the surface, e.g., with thiol chemistry for Au sensors. Alternatively, the sensing element can be coated with a material selective to a species. An example is using $Al_2O_3$, $Ta_2O_5$, $PtO_2$, hydroquinone, and the like to improve sensitivity to pH, or other selectivity agents can select other species of interest in biochemical measurements, e.g., $H_2O_2$, metabolites, and the like. The readout of the species can be performed capacitively.

With reference to FIG. 2, a dual-gate ionic liquid FETs was operated in a constant current mode for time-resolved local measurements of biological processes in a) a test tube or b) a microfluidic channel. The small potential generated by the biosensing elements, i.e. $V_{sig}$, is added with an adjustable DC voltage ($V_0$) to create an applied voltage to the ionic liquid gate electrode, i.e. $V_{LG}$, $V_0$ is used to tune the FET to maximize its sensitivity. Another constant voltage $V_D$ is applied to the drain electrode to generate a current, $I_D$, in the FET channel. ID is then used as input of a PID controller through a current preamplifier, the output voltage of the PID controller is used as $V_{BG}$ of the FET. The PID controller varied $V_{BG}$ in response to changes in $V_{LG}$ to maintain a pre-determined root mean square (RMS) channel current, e.g. $I_D$=100 nA$_{rms}$. Due to a large asymmetric coupling between the ionic liquid gate and the back gate to the device channel, a large $V_{BG}$ response results from a small change in $V_{LG}$ to maintain constant $I_D$. The dual-gate ionic liquid FET plays as a high-sensitive analog voltage amplifier that enable time-resolved, highly sensitive measurement of biological processes.

Figure 4:
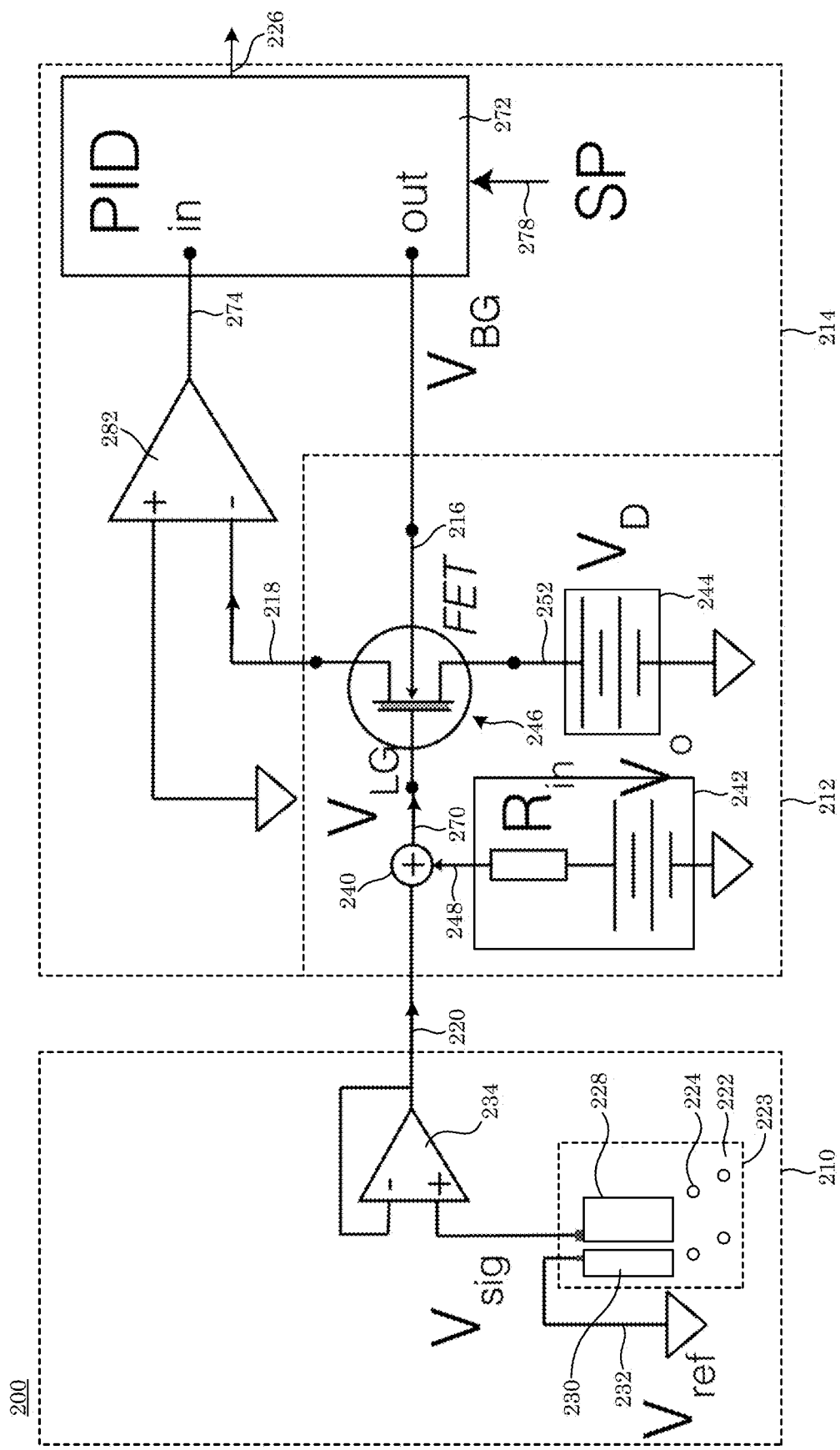
FIG. 4 shows a charge detector.
Figure 5:
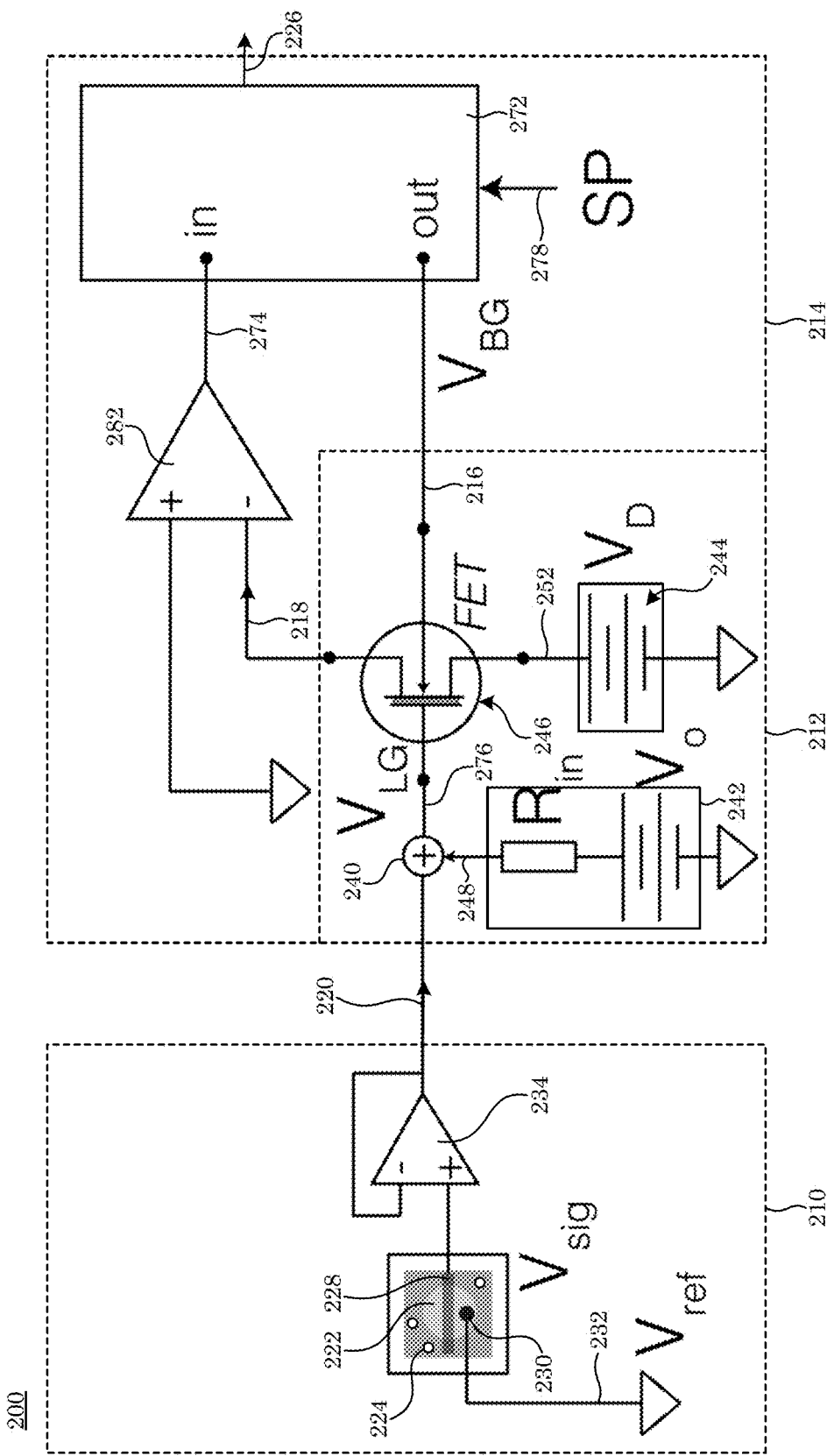
FIG. 5 shows a charge detector.

The device makes remote measurements, wherein the measurement configuration is separated into sensor and transducer elements as shown in FIG. 4 and FIG. 5. In instances where the sensor is not in close proximity with the transducer, we tightly integrate a voltage follower with the sensing element to provide an input impedance that exceeds 10 GΩ, thereby minimizing charge degradation along the wire connecting the sensor to the transducer. As in FIG. 1, FIG. 2, or FIG. 3, a voltage ($V_0$) is summed with the signal from the sensor to tune the FET to maximize its sensitivity.

Performance of the dual-gated ionic liquid FETs could further be enhanced by reducing the device operating temperature from room temperature (~300 K) to 250 K. Reducing device operating temperature will improve the following aspects of FET performance: thermal noise reduction results in better SNR thus decreasing limit of detection; decreasing temperature enhances FET switching characteristics (improving sub-threshold slope and reducing ionic gate leakage current) resulting in better FET response to small changes in $V_{SIG}$. Further reduction in temperature will result in freezing out of the ionic liquid and seize the FET operation.

Figure 50:
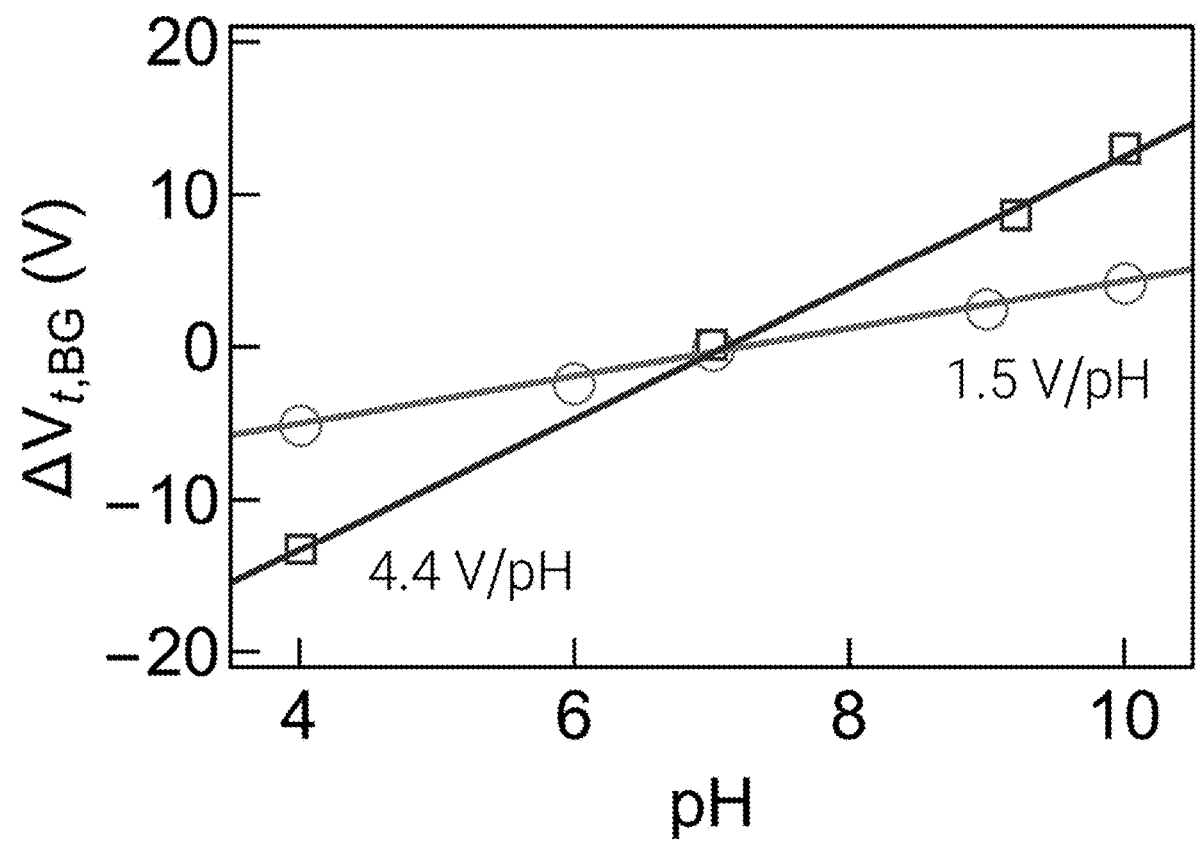
FIG. 50 shows a graph of change in voltage versus pH.

With reference to FIG. 4 and FIG. 5, dual-gate ionic liquid FETs operated in a constant current mode to enable time-resolved remote measurements of biomolecules in a test tube or a microfluidic channel. To maintain voltage signal, a voltage follower is integrated with the sensing element to provide an input impedance that exceeds 10 GΩ, thereby minimizing charge degradation along the wire connecting the sensor to the transducer. FIG. 50 (c) shows a representative pH measurement made using dual-gate ionic liquid FETs in constant current mode with a voltage follower.

Figure 6:
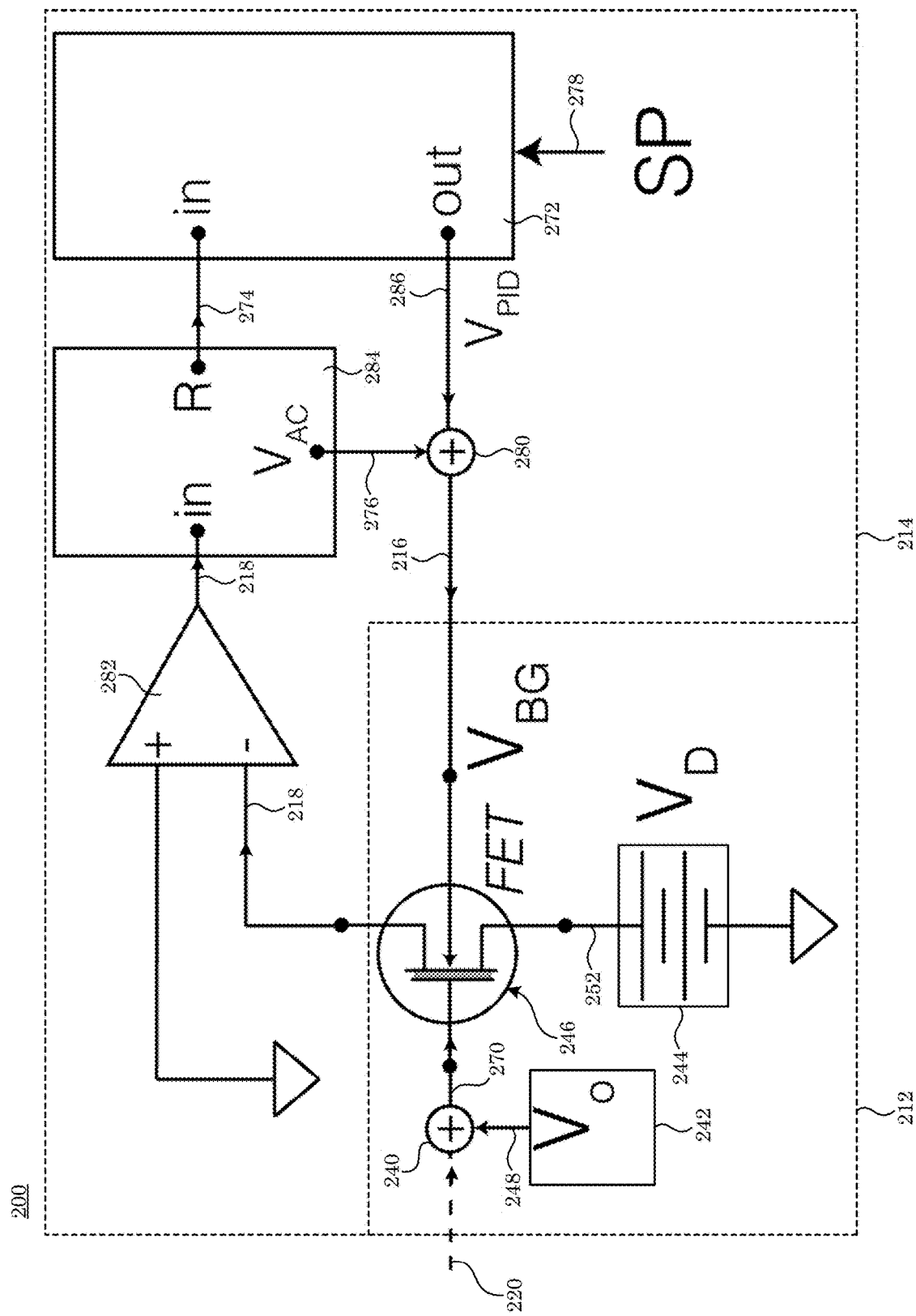
FIG. 6 shows a charge detector.

Measurement sensitivity can be improved by orders of magnitude by performing an AC measurement using phase sensitive detection (PSD) embedded within the measurement. The modifications to the transducer setup to achieve this are shown in FIG. 6. As shown in the figure, a reference AC voltage with a known frequency ($F_{AC}$) and amplitude ($V_{AC}$) is added to $V_{PID}$ to obtain $V_{BG}$. Alternatively, $V_{AC}$ is added to $V_D$ to achieve the same result (not shown). The applied AC voltage results in an AC component in $I_D$. Unlike the DC configuration in FIG. 1, FIG. 2, FIG. 3, FIG. 4, and FIG. 5, the output of the current preamplifier is first input to a lock-in detector. The input signal is demodulated using two independent demodulators each operating using a reference signal separated by a phase angle of 90 degrees. This two-phase approach returns a demodulated DC signal that equals $R = I_D \times G$, where G is the gain of the current preamplifier. The output of the lock-in amplifier is then connected to the PID input and used as the error signal to drive $V_{BG}$ and maintain a constant $I_D$ in a manner similar to that described in with reference to FIG. 1, FIG. 2, FIG. 3, FIG. 4, and FIG. 5. An integrated biochemical measurement system that leverages lock-in detection to considerably improve SNR is shown in FIG. 7.

Figure 7:
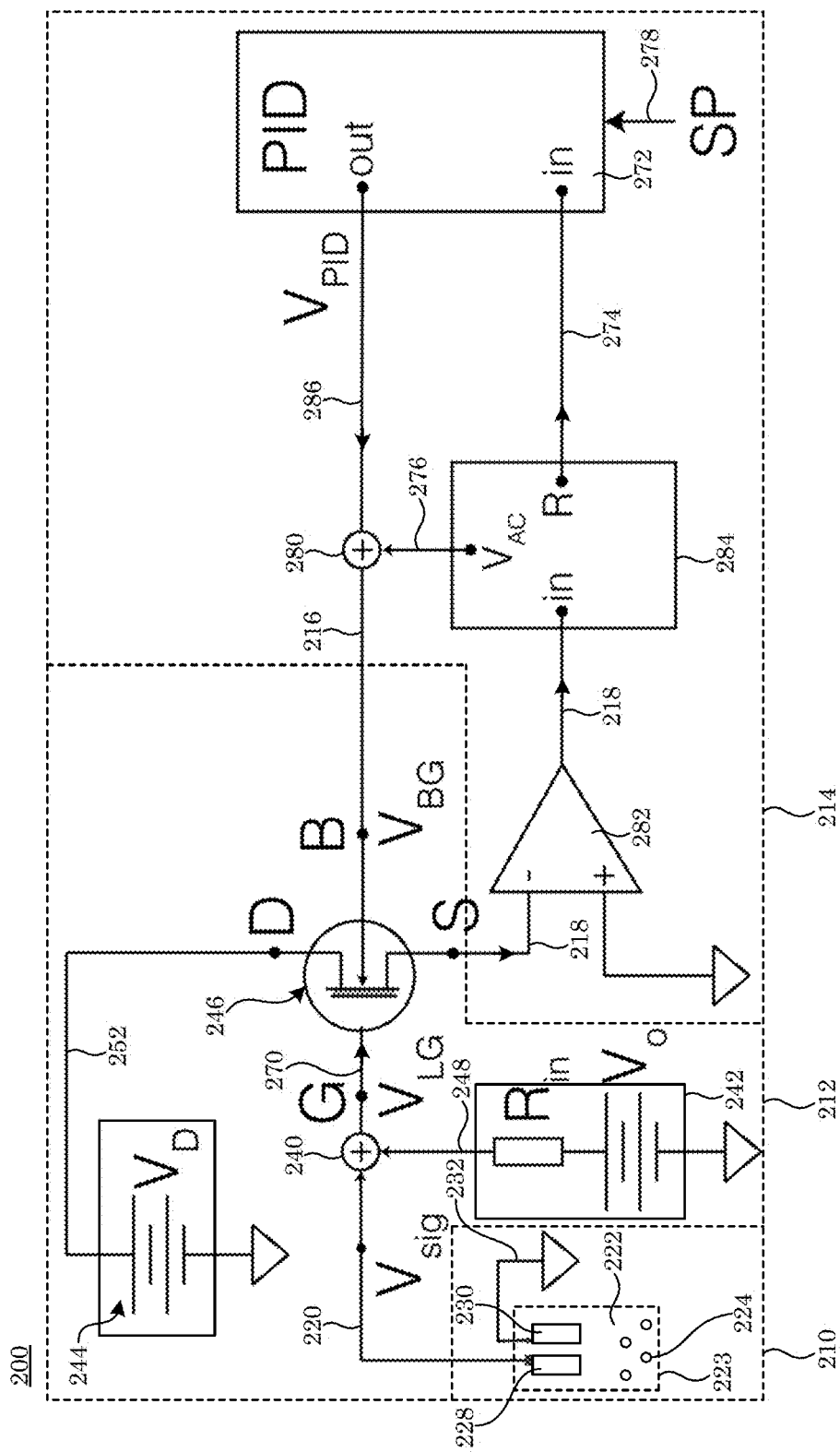
FIG. 7 shows a charge detector.
Figure 8:
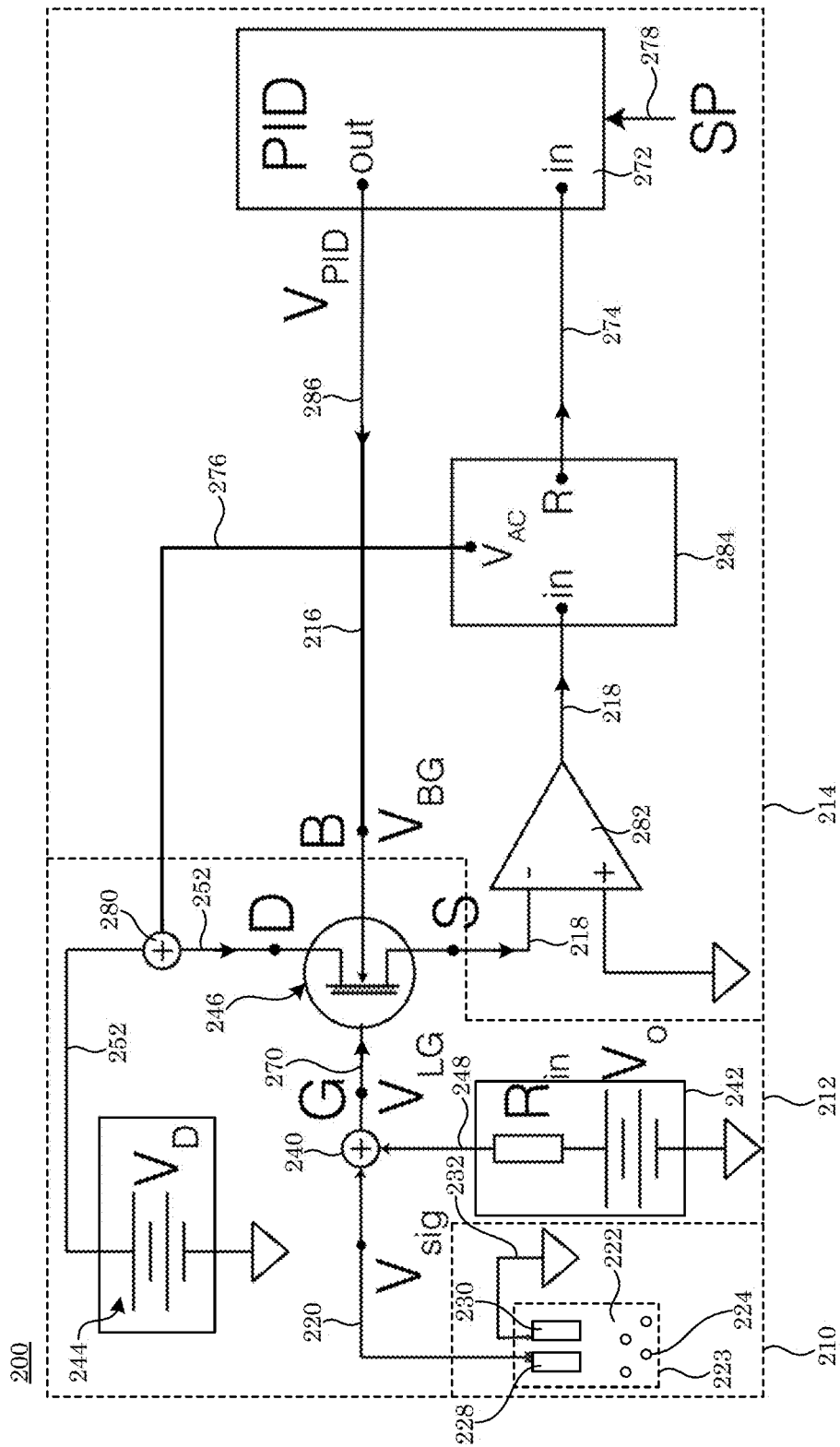
FIG. 8 shows a charge detector.
Figure 51:
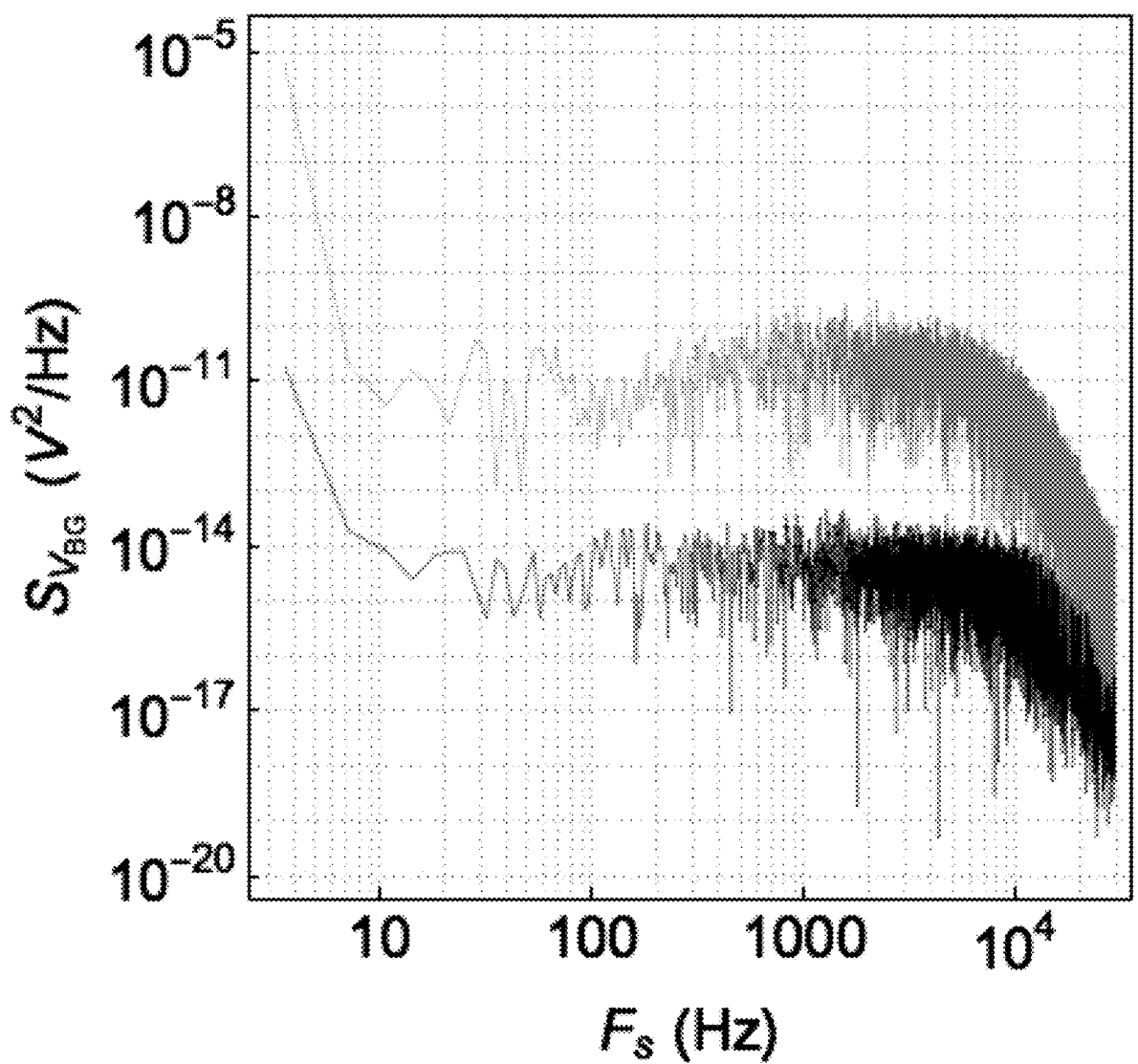
FIG. 51 shows a graph of signal versus frequency.
Figure 52:
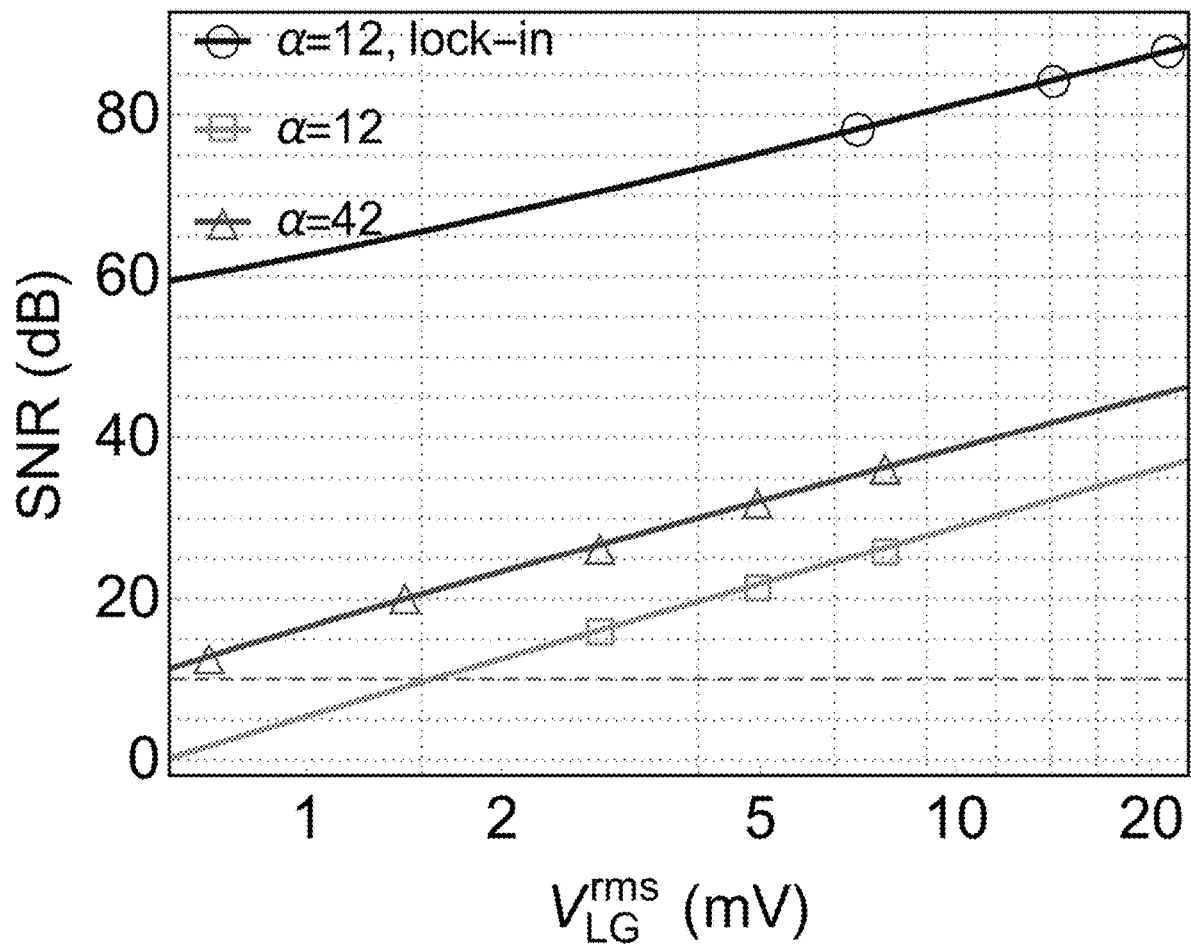
FIG. 52 shows a graph of signal-to-noise-reduction (SNR) versus voltage.

With reference to FIG. 6, FIG. 7, and FIG. 8, a transducer element with integrated lock-in detection scheme improved signal-to-noise (SNR) ratio of biochemical sensing. An integrated lock-in detection scheme for biochemical sensing was used, and power spectral density (PSD) measurement of the back-gate voltage ($V_{BG}$) with and without lock-in detection were made as shown in FIG. 51. FIG. 52 shows SNR of lock-in measurements compared to DC measurements with $\alpha=12$ and $\alpha=42$.

The system discussed in FIG. 6, FIG. 7, and FIG. 8 had an ≈500-fold improvement in SNR over the quantum limited DC measurements. FIG. 51 shows the power spectral density (PSD) of $V_{BG}$ with (blue) and without (pink) lock-in detection. Here, $F_{AC}=100$ Hz and $V_{AC}=100$ mV$_{p-p}$, and the resulting demodulated output was filtered with a 4-pole Bessel filter with a cutoff frequency of 5 Hz. The broadband noise in $V_{BG}$ was then estimated to be 5.3 mV$_{rms}$, (DC to 5 kHz; see Appendix B) but only 10.4 µV$_{rms}$ (DC to 5 kHz) when using lock-in detection. This results in an ≈500-fold improvement in SNR ($\alpha=12$; see Appendix B for a definition of α). The improvement in SNR was found to be ≈100-fold higher when compared to DC measurements where $\alpha=42$ (FIG. 52).

With regard to enzyme activity and kinetics, the ultrasensitive FET devices measured activity and kinetics of proline directed kinase Cdk5. Under normal physiological conditions, Cdk5 is tightly regulated by either the p35 or p39 inhibitory proteins. Oxidative stress causes a 10 kDa membrane anchored fragment of p35 to be cleaved, forming the pathological activator p25, resulting in deregulation and delocalization of the complex to the cytosol. The resulting pathological complex, Cdk5/p25, has higher activity than its physiological counterpart, Cdk5/p35, and participates in the indiscriminate phosphorylation of numerous proteins, which may result in neurofibrillary tangles and may be a symptom of Alzheimer's disease.

Figure 53:
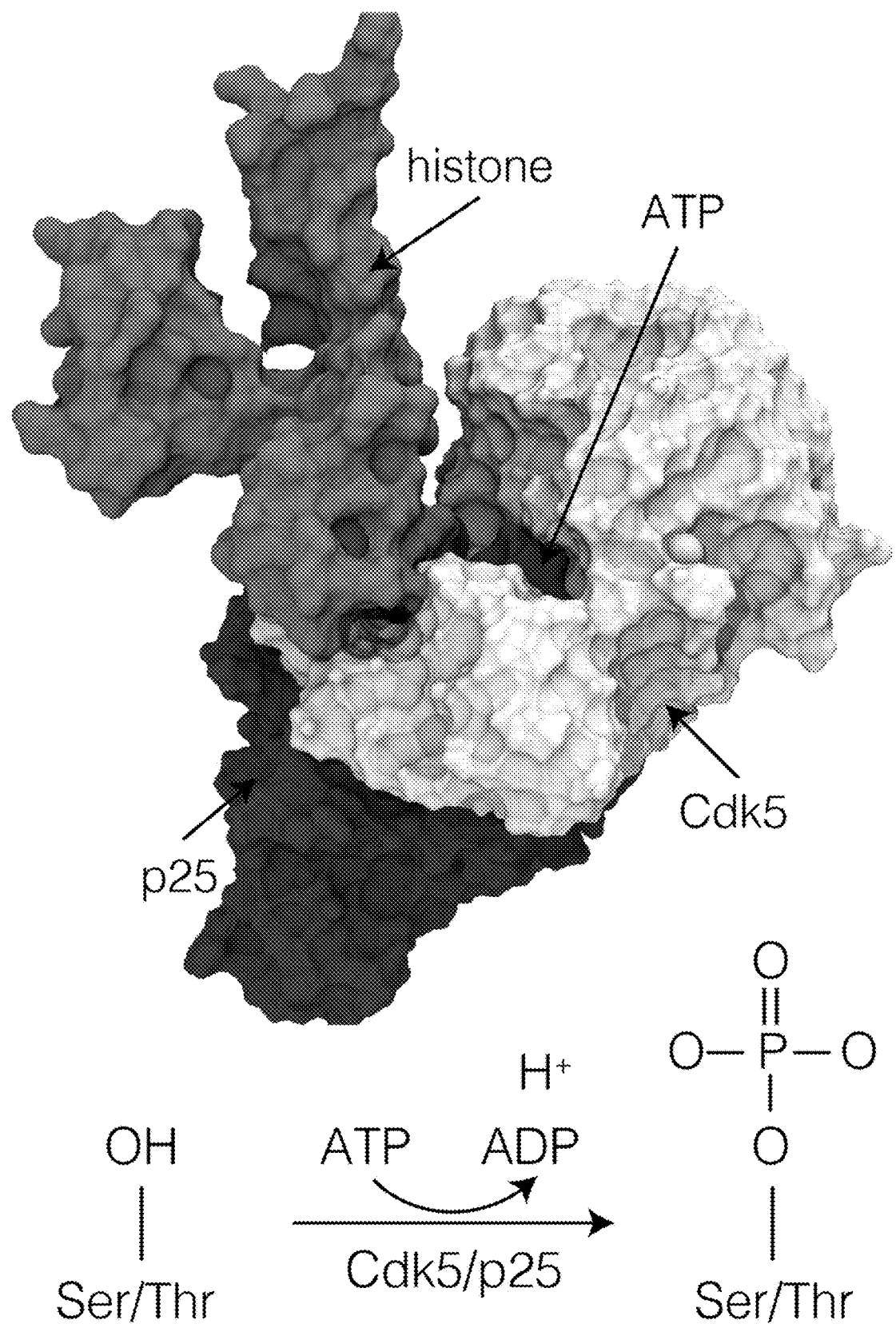
FIG. 53 shows a charged analyte.

The multi-protein pathological complex, Cdk5/p25, participates in the phosphorylation reaction shown in FIG. 53. Cdk5 mediated phosphorylation results in the release of a proton during ATP hydrolysis and the transfer of a single phosphate group to either a serine or threonine residue immediately preceding a proline. Here, ionic liquid-gated FETs detected small changes in the solution pH during phosphorylation of the substrate protein, histone H1.

Figure 54:
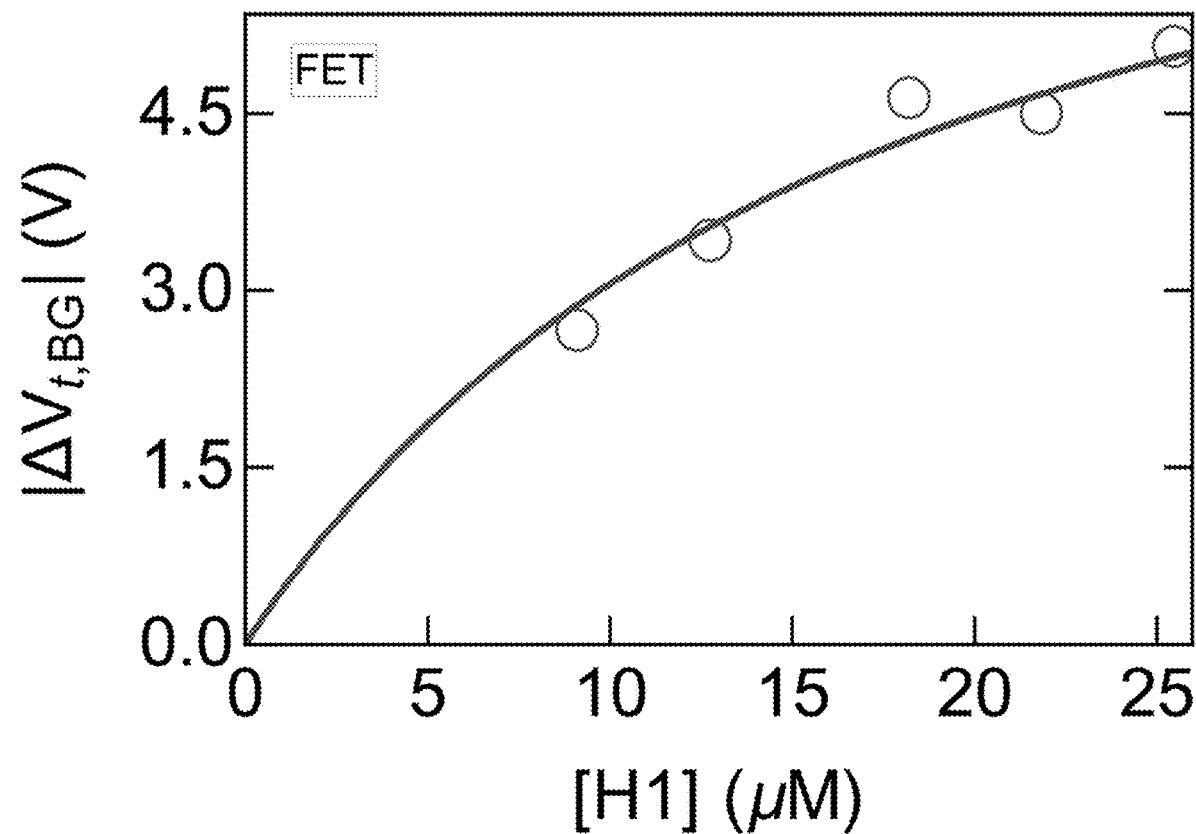
FIG. 54 shows a graph of protein concentration versus hydrogen ion concentration.
Figure 55:
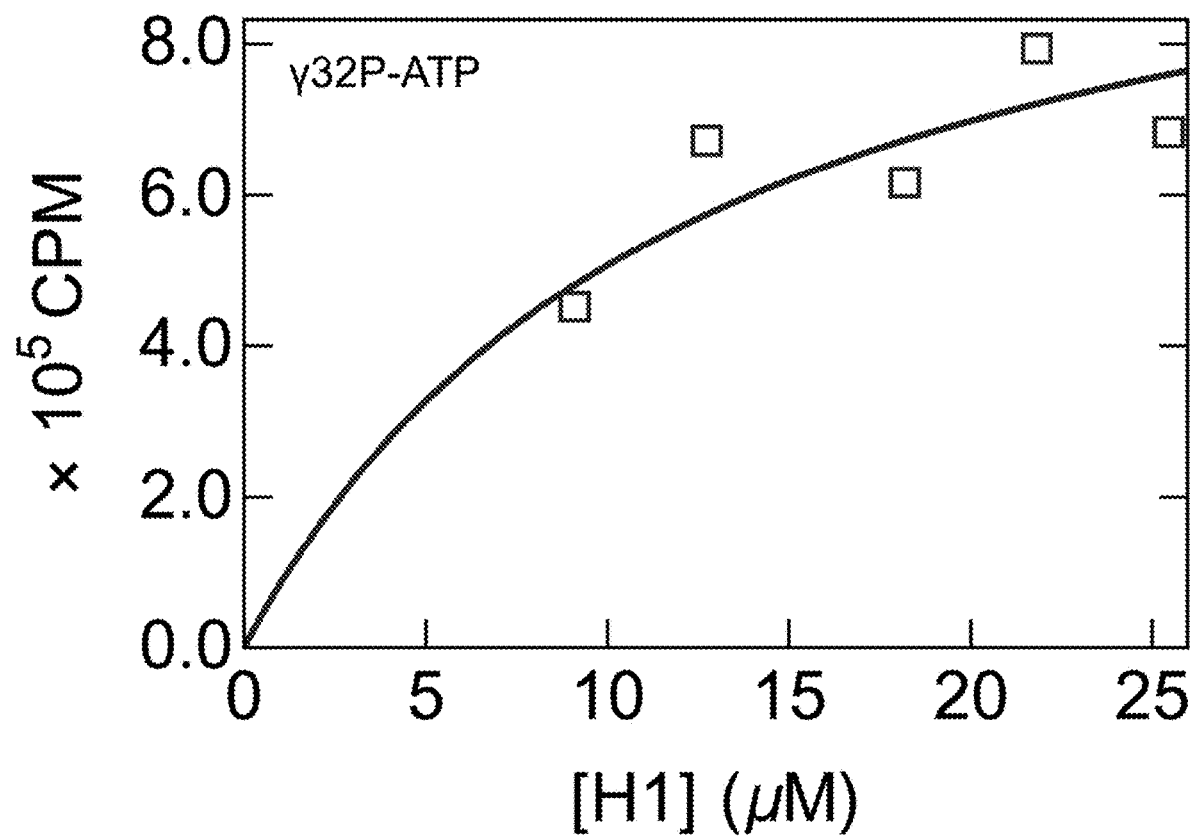
FIG. 55 shows a graph of protein versus radioactive ATP concentration.

FIG. 54 shows the change in $V_{t,BG}$ as a function of histone H1 concentration under steady-state conditions. In each case, $V_{t,BG}$ was estimated from an $I_D$-$V_{BG}$ plot. To account for instrument drift, each data point in the figure was measured differentially with a control sample that was identical to the measured vials except for the absence of ATP, thereby inhibiting the phosphorylation reaction. The kinase activity was then estimated using, $$s = \gamma \frac{[H1]}{k + [H1]},$$

where k is a constant, [H1] is the concentration of histone H1 and γ is a scaling constant. For the FET measurements in FIG. 54, we estimated k=17.5±1.3 µM from a non-linear regression of the model to the measured data, consistent with previously published activity measurements for the pathological Cdk5/p25 complex. We compared the measurements in FIG. 54 against enzyme activity measurements obtained from a radioactively labeled γ-$^{32}$P-ATP assay as shown in FIG. 55. The estimated value of k=12.1±2.3 µM from those measurements was found to be statistically consistent with the FET measurements with 95% confidence.

With reference to FIG. 53, FIG. 54, FIG. 55, and FIG. 56, ionic liquid-gate field-effect transistors (FET) were used for label-free enzyme activity and kinetics measurements. The proline directed kinase Cdk5 catalyzes the phosphorylation of substrate proteins (e.g., histone H1) in the presence of an activator (e.g., p25) and adenosine triphosphate (ATP). The hydrolysis of ATP results in the transfer of a single phosphate group to either a serine (Ser) or threonine (Thr) residue in the substrate protein and the release of a proton into solution, resulting in a change in solution pH. Moreover, ionic liquid-gate FETs measured change in solution pH as a function of the histone H1 concentration ([H1]) inferentially provide activity of Cdk5 under steady-state conditions. FET measurements were in quantitative agreement with a complementary assay that used radioactively labeled 32P-ATP as a reporter of Cdk5 activity. Time-series measurements of enzyme catalyzed phosphorylation as a function of [H1] (9.1 µM, Δ; 12.7 µM, □; 18.2 µM, ○) are shown and provide estimation of the reaction dynamics. The solid lines depict the reaction kinetics model that describes the time course of phosphorylation, while the dashed lines represent an estimate of the reaction velocity during the first 100 s after a change in the signal was detected.

We estimated the change in the solution pH for the FET measurements from $\Delta V_{t,BG}$ in FIG. 4b ($\alpha=159$). When [H1] was increased from 9.1 µM to 25.2 µM, we measured changes in the solution pH as small as 0.01 units. The expected change in the solution pH was estimated using the expression $$\frac{d[H^+]}{d\,\text{pH}} = -2.303 \frac{C_a K_a [H^+]}{(K_a + [H^+])^2},$$

where $C_\alpha$ is the buffer concentration, $K_\alpha$ is the acid dissociation constant and [H$^+$] is the proton concentration. The change in pH was consistent with ≈3 phosphorylation sites on the substrate protein, assuming an electrolyte solution buffered with $C_\alpha \times 250$ µM 3-(N-mopholino)propanesulfonic acid (MOPS).

Figure 56:
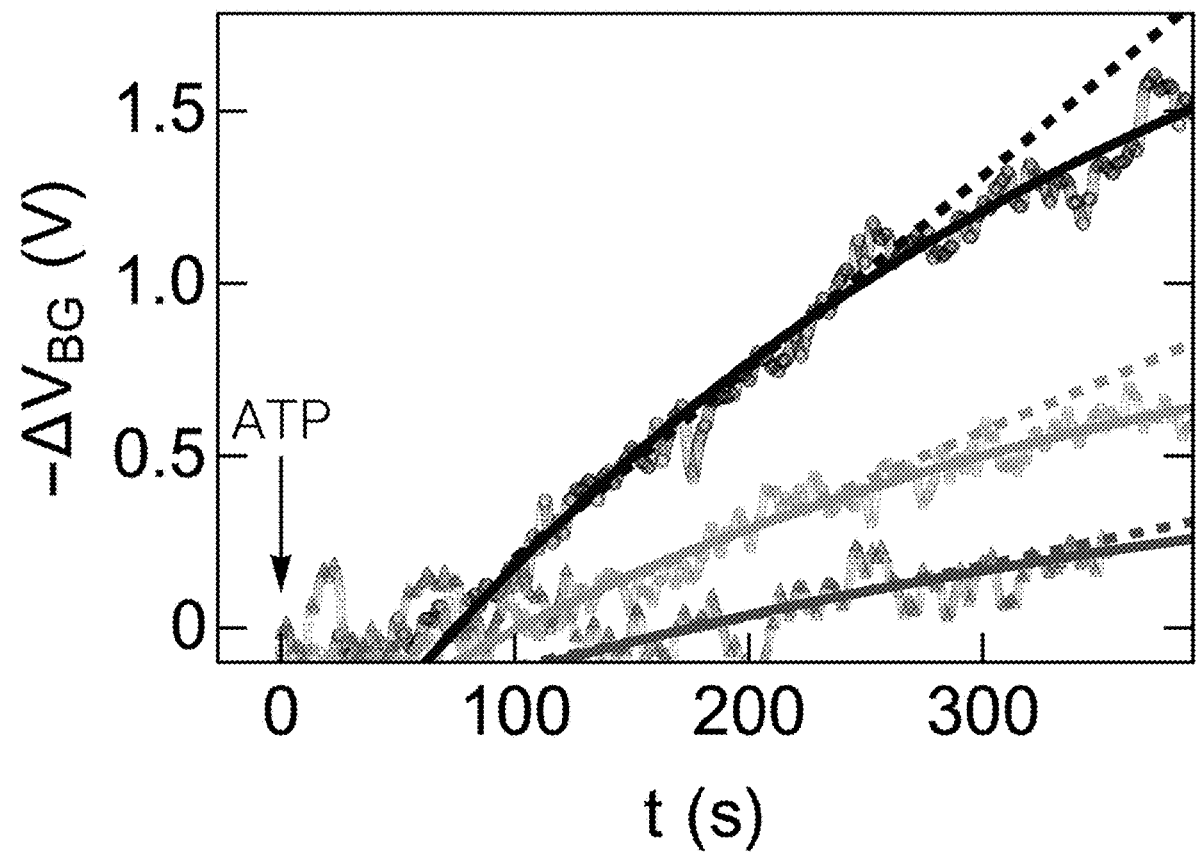
FIG. 56 shows a graph of change in voltage versus time.

The FET-based measurements have a response time that allows the direct estimation of reaction kinetics and velocities as seen from FIG. 56. The concentration of the Cdk5/p25 complex in these measurements was 3.8 µM (5-fold lower than the quantity used in FIG. 54 and FIG. 55). A control sample without histone showed no change in the measured potential upon addition of ATP (data not shown).

From FIG. 56, addition of ATP had a decrease in $V_{BG}$ after ≈2 min. The polarity of $V_{BG}$ is consistent with the release of protons into solution, which results in a positive change in $V_{LG}$. The initial reaction velocities were estimated from a linear regression of the first 100 s data after a change in $V_{BG}$ was detected and were found to increase monotonically with [H1]. Furthermore, the initial linear change in $V_{BG}$ is consistent with an enzyme limited reaction. Finally, the time-course of each reaction in FIG. 56 was fit with a first order rate law of the form, $V_{BG}=\beta(1-e^{-k_1 t})$, where $\beta$ is a scaling constant and $k_1$ is a rate constant. The rate constant was consistent with previously reported values and estimated to be $k_1=0.18\pm0.02$ per min, independent of the histone H1 concentration. FET-based measurements are in excellent quantitative agreement with existing techniques and provided results in minutes for rapid therapeutic screening.

Example 6. Operating Dual-Gated Field Effect Transistors at the Quantum Capacitance Limit for Ultrasensitive Biosensing We developed dual-gated field-effect transistors that operate at the quantum capacitance limit to allow ultrasensitive pH measurements for biophysics applications. The devices were fabricated with 2D transition metal dichalcogenide films exfoliated onto oxide substrates and top gated with an ionic liquid. The high ionic liquid polarizability allows strong coupling between the top gate (ionic liquid) and a back gate dielectric (substrate oxide) which enables amplification of a voltage applied to the ionic liquid gate by up to 200×. This amplification is limited by the intrinsic quantum capacitance of the semiconducting channel; thus, the devices operate near their theoretical limits. We leveraged the high performance of the devices to enable pH measurements with sensitivity that greatly exceeds the Nernst value of 59 mV/pH and is ≈100× higher than those previously reported. Furthermore, the signal-to-noise ratio (SNR) of the measurements are more than an order of magnitude higher than conventional ion sensitive field effect transistors (ISFET) allowing a low limit of detection of 0.001 pH units. The pH measurements provided rapid and quantitative estimation of the kinetics of enzymes implicated in Alzheimer's disease. These measurements can be used in therapeutics for numerous neurodegenerative conditions.

Figure 59:
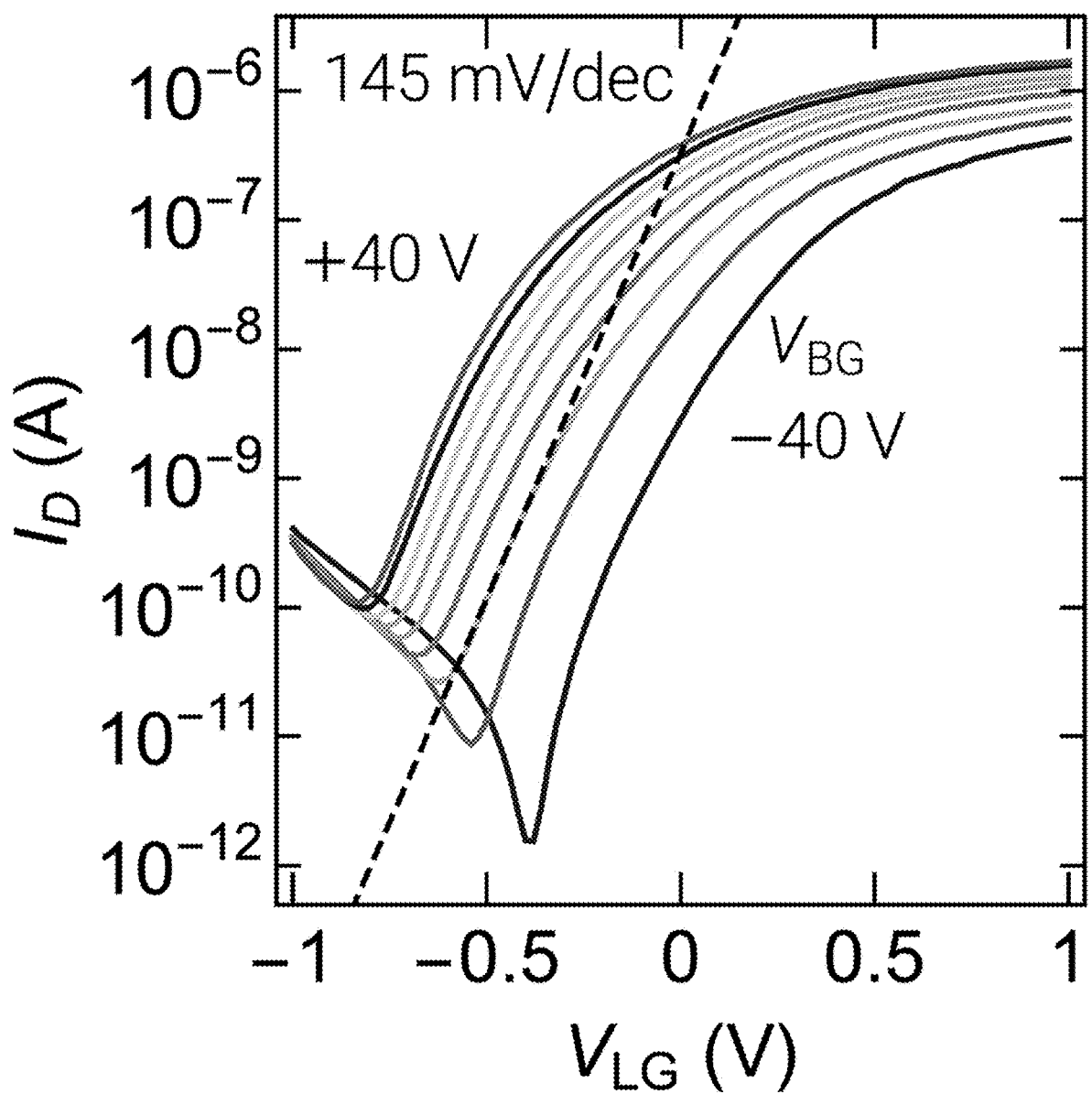
FIG. 59 shows a graph of current versus back gate voltage.

Characterization of the ionic liquid gated field effect transistor (FET) was performed using the set up in FIG. 57 and micrograph in FIG. 58. Constant voltage, $V_{DS}$, was applied to the drain and the drain current ($I_D$) was recorded as a function of the liquid gate potential ($V_{LG}$) to measure the transport characteristics of the device. The measurements were then repeated for different back gate voltages ($V_{BG}$) to estimate the coupling between the two gates as seen from FIG. 59 for a representative device fabricated with a 300 nm $SiO_2$ back gate. The transport curves in FIG. 59 show n-FET behavior for monolayer $MoS_2$ FETs. The devices exhibited a current dynamic range of S orders of magnitude with a subthreshold slope (SS) between 80 mV/dec and 145 mV/dec.

Figure 60:
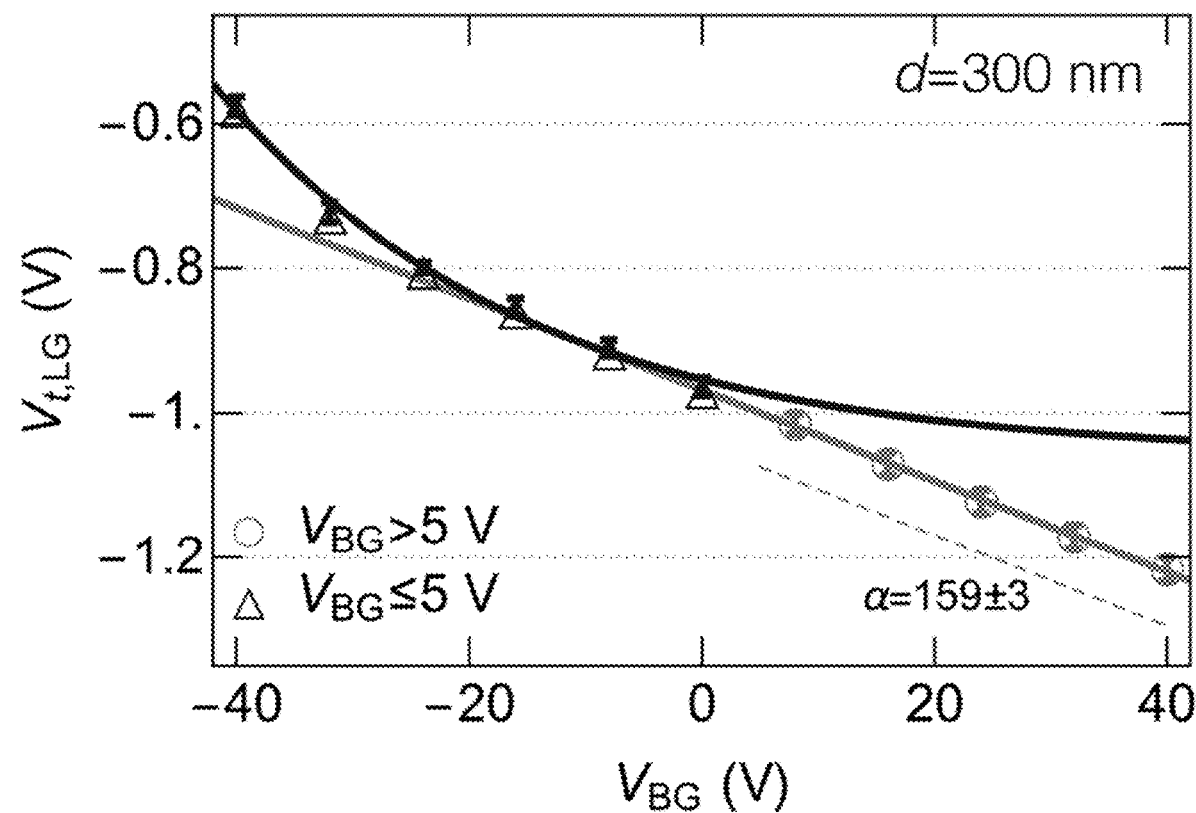
FIG. 60 shows a graph of change in threshold voltage of top gate voltage versus back gate voltage.
Figure 61:
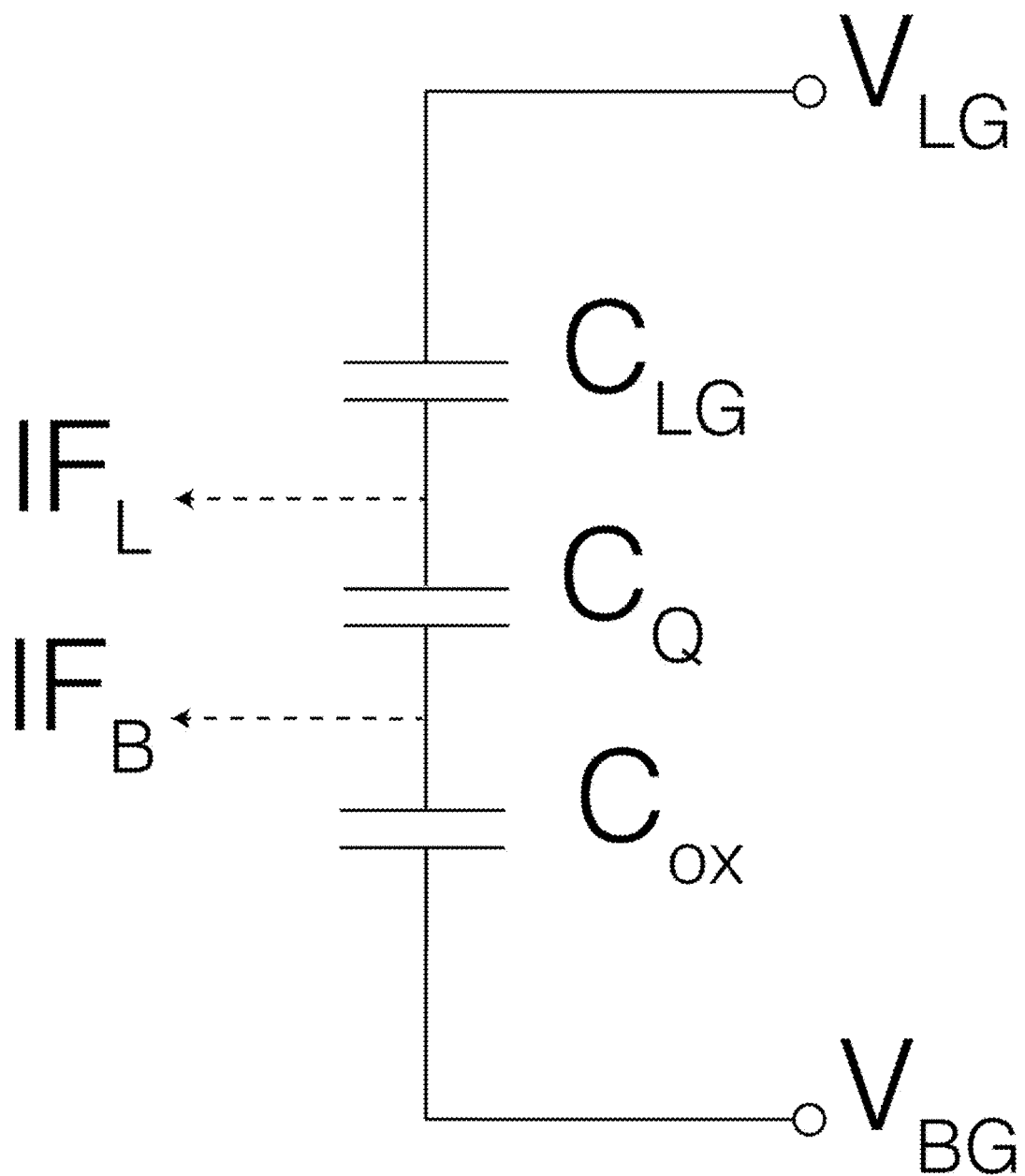
FIG. 61 shows an equivalent circuit diagram of a dual gate field effect transistor.
Figure 62:
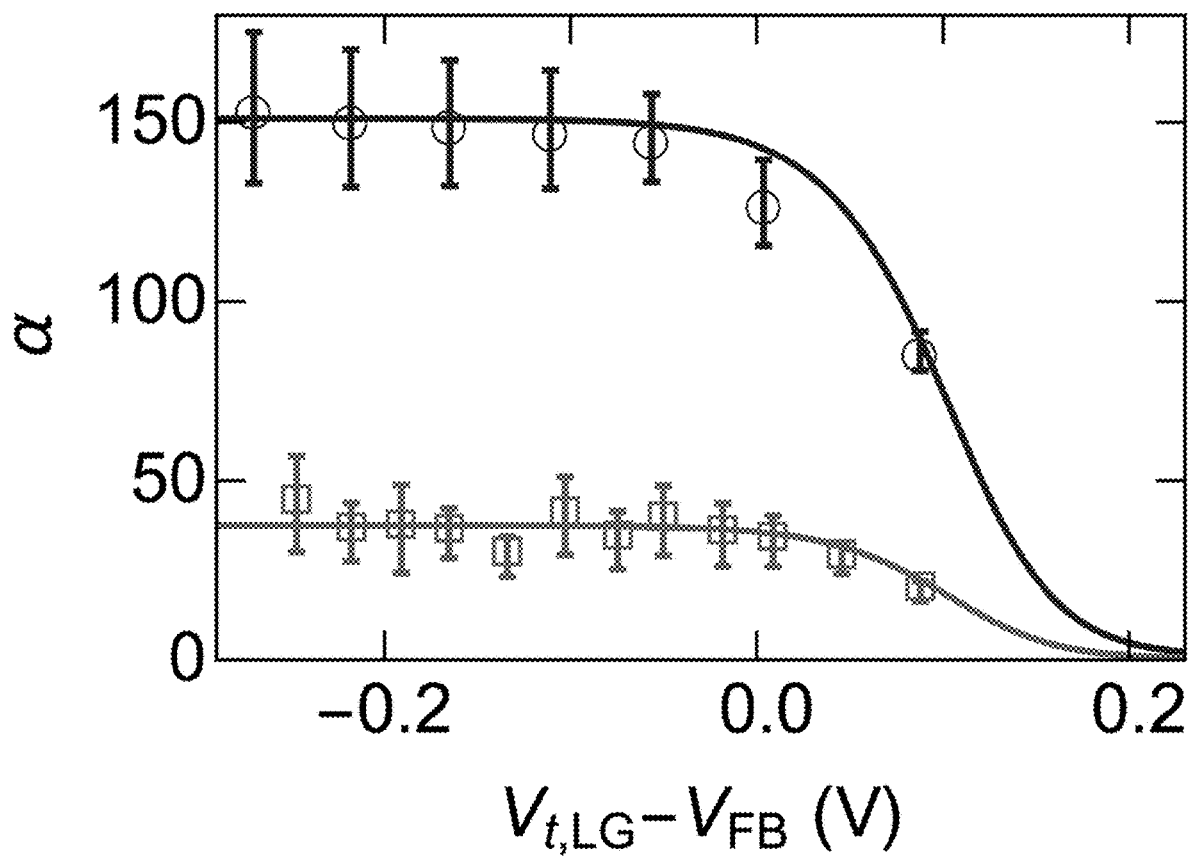
FIG. 62 shows a graph of signal amplification versus top gate voltage for a dual gate field effect transistor.

With reference to FIG. 57, FIG. 58, FIG. 59, FIG. 60, FIG. 61, and FIG. 62, electrical characterization of ionic liquid gate field effect transistors was performed in which a device schematic of an ionic liquid gated field effect transistor FET) for biosensing is included in FIG. 57. The voltage applied to the ionic liquid gate (VLG) can be switched between a voltage source for characterization and a sensing element for biophysical measurements. An array of ionic liquid gate FETs fabricated using the 2D semi-conducting transition metal dichalcogenide $MoS_2$ is shown in FIG. 58. The devices are dual gated, consisting of a back gate formed using the substrate's oxide and an ionic liquid to form the top gate. FIG. 59 shows transport characteristics showing drain current (ID) as a function of VLG for varying back gate voltages (VBG). Strong coupling between the liquid gate and the channel requires large changes to VBG to observe small changes in the liquid gate threshold voltage (Vt,LG). FIG. 60 shows shift in the liquid gate threshold voltage as a function of VBG. At high positive VBG, the amplification ($\alpha$) is linear and yields a device gain of >100× when using a 300 nm $SiO2$ gate oxide. FIG. 61 shows electrical model of a dual-gated 2D FET. The device can be modeled as three capacitors in series. The quantum capacitance (CQ) of the 2D channel controls the ratio of the capacitive coupling between the back (Cox) and liquid (CLG) gate interfaces with the channel. FIG. 62 shows a plot of $\alpha$ as a function of Vt,LG for two devices with back gate oxide thickness of 300 nm and 70 nm. The solid line shows the theoretical prediction for ideal device performance when CQ,max was assumed to be 2.2 μF/cm2.

When used as biosensor, the ionic liquid gate was used to sense an applied voltage. This voltage was amplified at the back gate by a factor $\alpha$ that is defined by $\Delta V_{BG}/\Delta V_{t,LG}$, The liquid gate threshold voltage ($V_{t,LG}$) was estimated using a linear extrapolation of the peak transconductance ($g_{m,peak}$). The estimation of $\alpha$ for a representative device are shown in FIG. 60 (t=300 nm) and Fig. S2b (t=70 nm). The curves in FIG. 60 show regimes for the $V_{t,LG}$ as a function of $V_{BG}$. When $V_{BG}>5V$, the change in $V_{t,LG}$ is linear and $\alpha$ was estimated to be 159±3 when t=300 nm and 40±4 when t=70 nm. The scaling of $\alpha$ with oxide thickness is consistent with the assumption with that the relationship between the liquid gate and the channel capacitances are invariant with the back gate oxide thickness. In the linear regime, the charge carrier density in the channel is controlled using a large and positive $V_{BG}$, and causes a negative shift in $V_{t,LG}$. On the other hand, when $V_{BG}<5V$, the carrier density in the channel decreases substantially, requiring a positive shift in $V_{t,LG}$ to maintain channel control. In this regime □□ decreased exponentially and can be quantitatively described using the quantum capacitance model below.

In a quantum capacitance model, a change in $\alpha$ with the channel carrier density ($n_{ch}$), and thereby $V_{t,LG}$ can be described by including the effects of the quantum capacitance ($C_Q$) of the 2D semiconducting channel as seen from the electrical model in FIG. 61. For ultra-thin-body dual-gated bioFET and ionic liquid gated few layer $MoS_2$, $\alpha$ is directly proportional to the ratio of the capacitive coupling between the top and bottom gates to the semiconducting channel, $\alpha \approx C_{TG}/C_{BG}$ where $C_{TG}$, $C_{BG}$ are top gate (ionic liquid) and back gate ($SiO_2$) dielectric capacitances respectively. For 2D semiconductors the two gate capacitances are in series with $C_Q$ and can be expressed as $C_{TG}=C_{LG}\times C_Q$ ($C_{LG}+C_Q$) and $C_{BG}=C_{ox}\times C_Q(C_{ox}+C_Q)$ where $C_{LG}$ and $C_{ox}$ are the ionic liquid gate and back gate oxide capacitances respectively.

Here, $C_Q$ depends on $n_{ch}$ and increases with an applied gate bias, approaching the theoretical limit ($C_{Q,max}$) for a large carrier density. For the measured devices, $C_Q \gg C_{ox}$ and therefore $C_{BG} \approx C_{ox}$. On the other hand, $C_{LG} > C_Q$ due to the large electrostatic capacitance of the ionic liquid, which results in $C_{TG}$ being dominated by $C_Q$. When the device is operated below its threshold voltage, $n_{ch}$ is low causing $C_Q$ and thereby $\alpha$ to increase exponentially at positive $\Delta V_{t,LG}$ as seen in FIG. 62. Above the channel threshold voltage $n_{ch}$ is large and $C_Q$ approaches $C_{Q,max}$ and remains constant.

Therefore, $\alpha=C_{TG}/C_{ox}$ is also constant and at a maximum as seen in FIG. 62 for negative $\Delta V_{t,LG}$. Using this electrical model, we observed quantitative agreement for measurements with two representative device types as seen from FIG. 62. In both cases, we assumed $C_{Q,max}=2.2$ µF/cm² or within 45% of the maximum theoretical value for monolayer MoS₂ to accurately predict the maximum value of □.

$$V_{GS} - V_{th} - V_{FB} = \frac{E_g}{2q} - \frac{k_BT}{q}\ln\left[\exp\left(\frac{n_{ch}}{g_{2D}k_BT}\right) - 1\right] + \frac{qn_{ch}}{C_{ox}}$$

$$V_{th} = V_{GS} - V_{FB} - \left\{\frac{E_g}{2q} - \frac{k_BT}{q}\ln\left[\exp\left(\frac{n_{ch}}{g_{2D}k_BT}\right) - 1\right] + \frac{qn_{ch}}{C_{ox}}\right\}$$

$$C_q = q^2 g_{2D}\left[1 + \frac{\exp\left(\frac{E_g}{2k_BT}\right)}{2\cosh\left(\frac{qV_{ch}}{k_BT}\right)}\right]^{-1}$$

Figure 9:
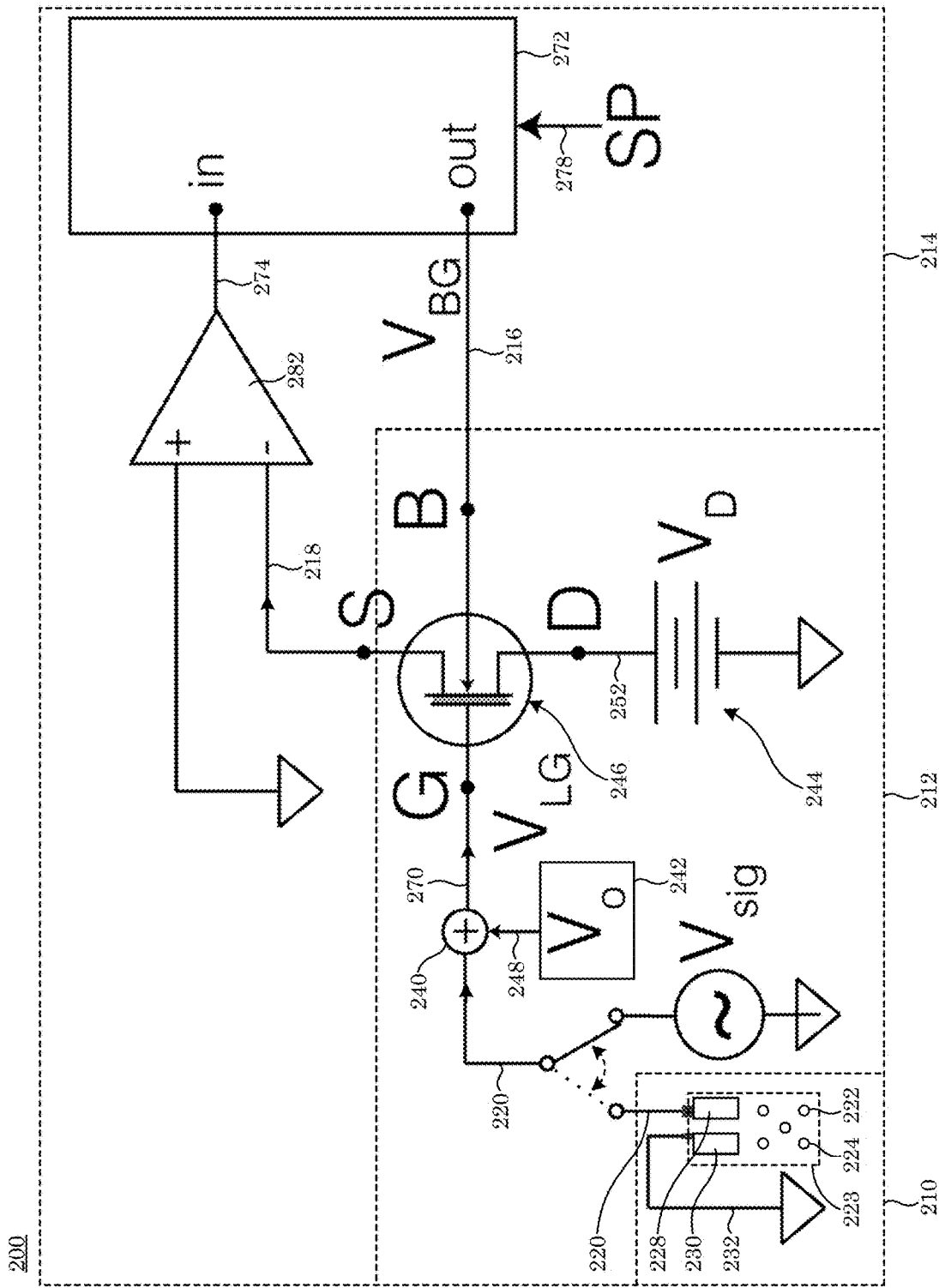
FIG. 9 shows a charge detector.
Figure 10:
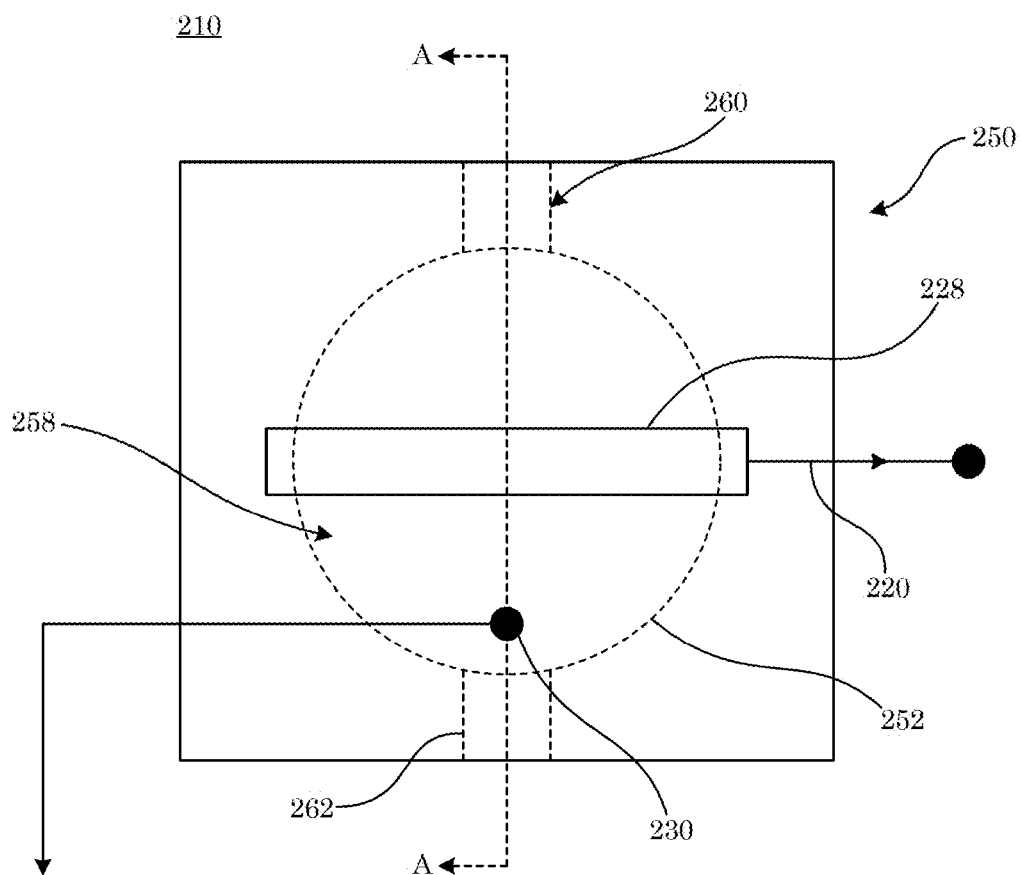
FIG. 10 shows a plan view of a charge sensor.
Figure 11:
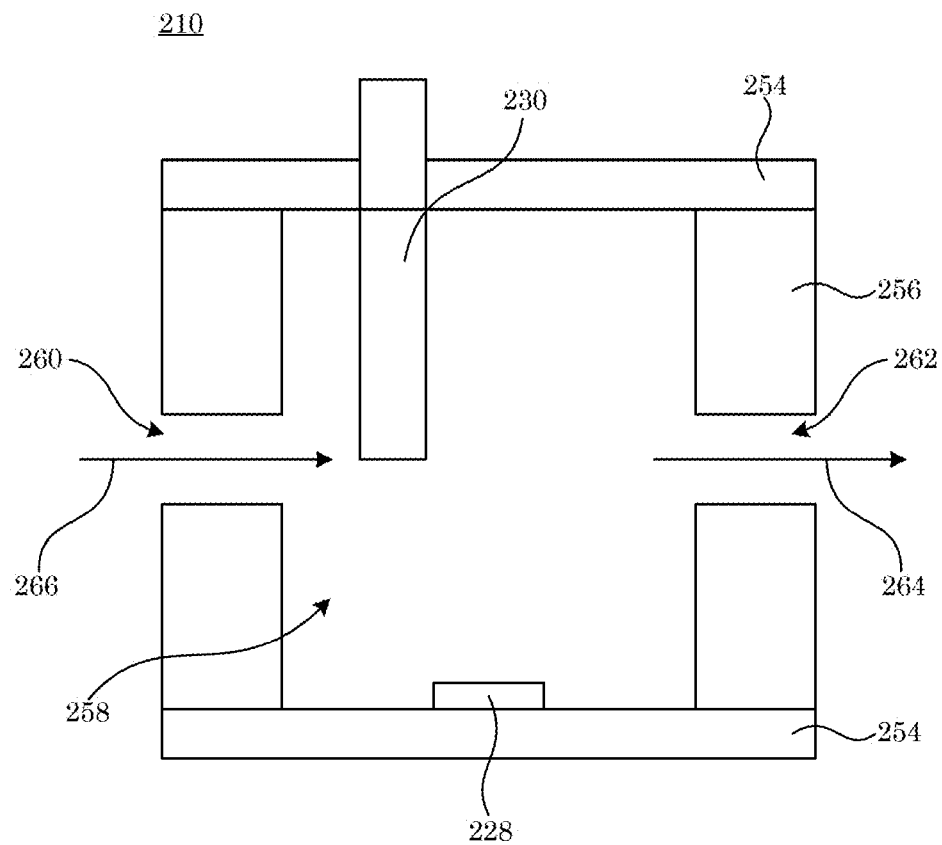
FIG. 11 shows a cross-section along line A-A of the charge sensor shown in FIG. 10.
Figure 12:
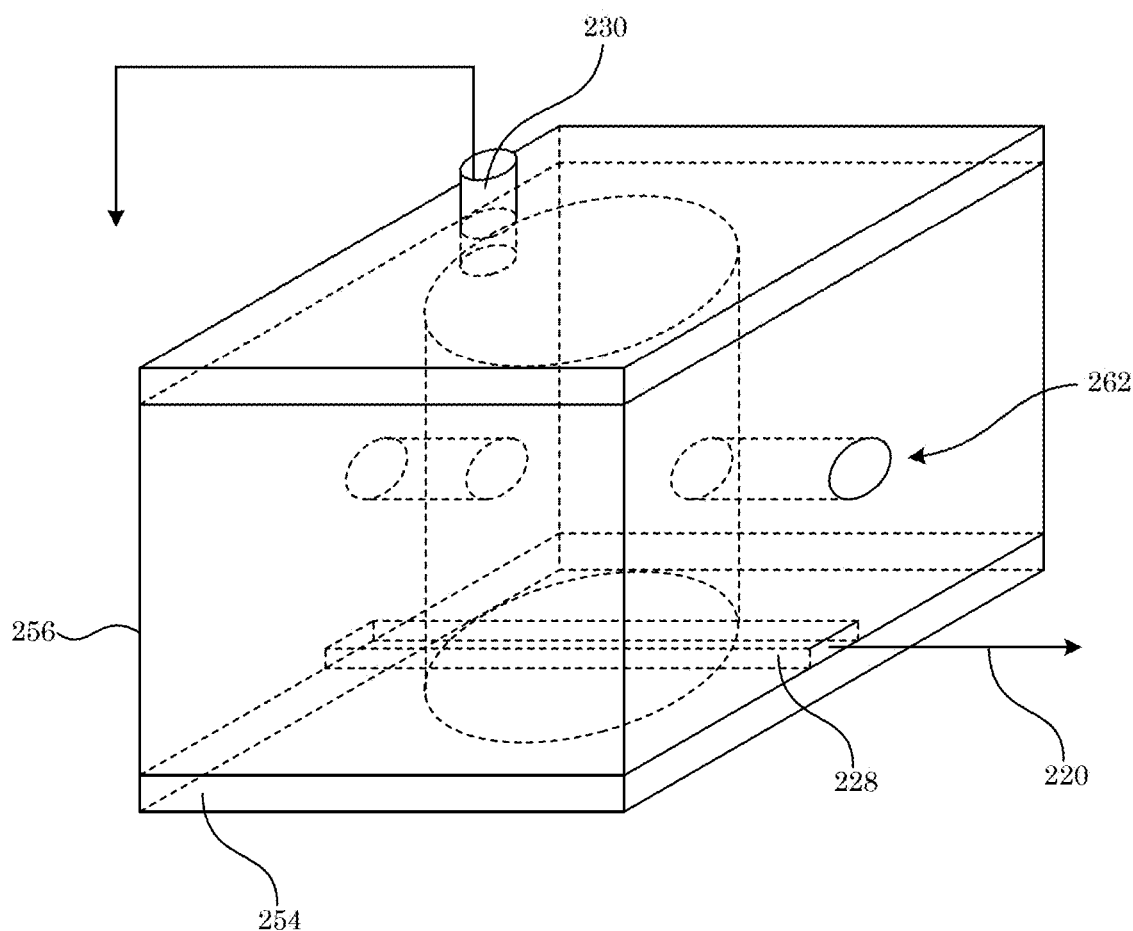
FIG. 12 shows a perspective view of the charge sensor shown in FIG. 10.
Figure 13:
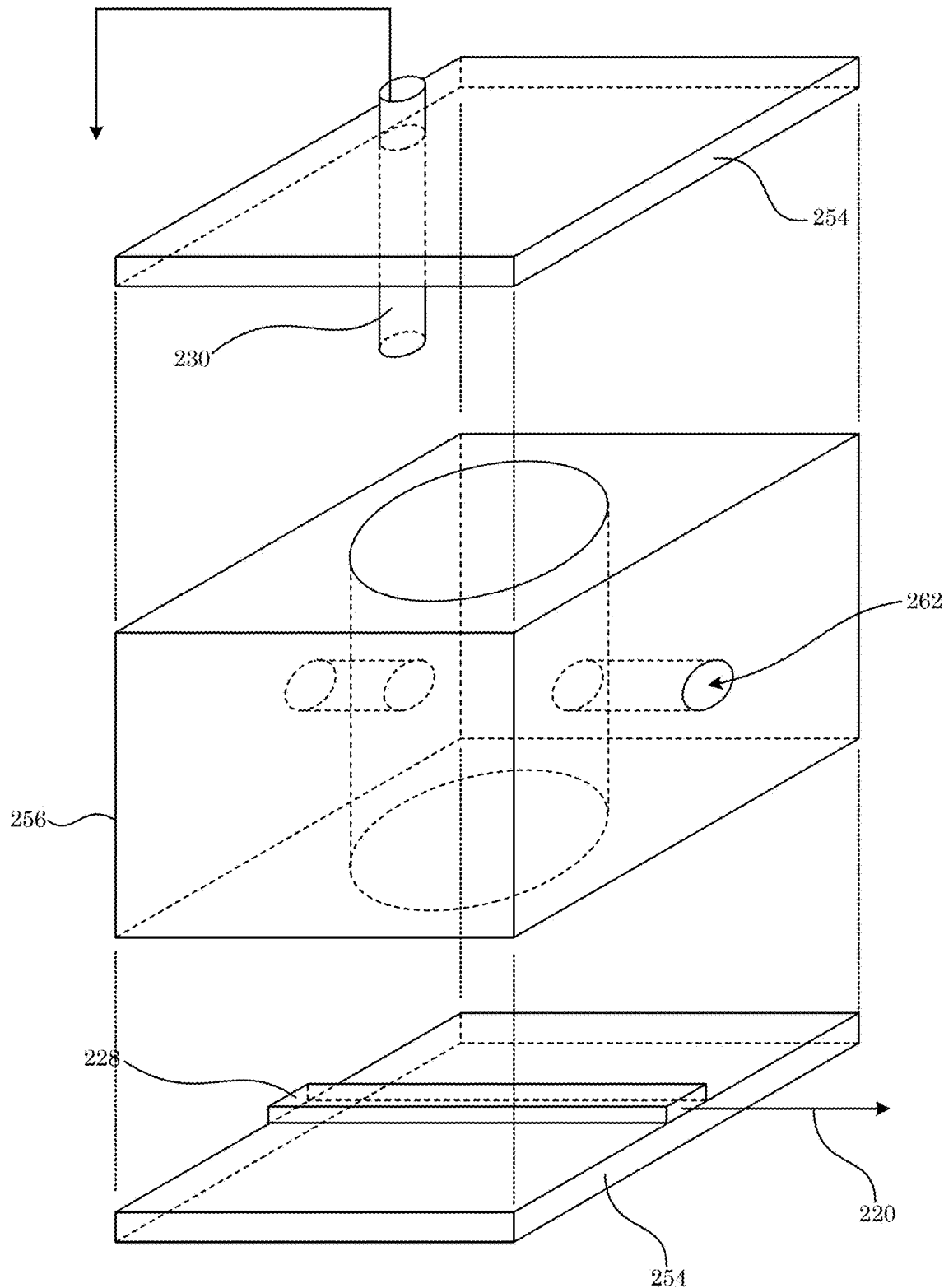
FIG. 13 shows an exploded view of the charge sensor shown in FIG. 10.
Figure 14:
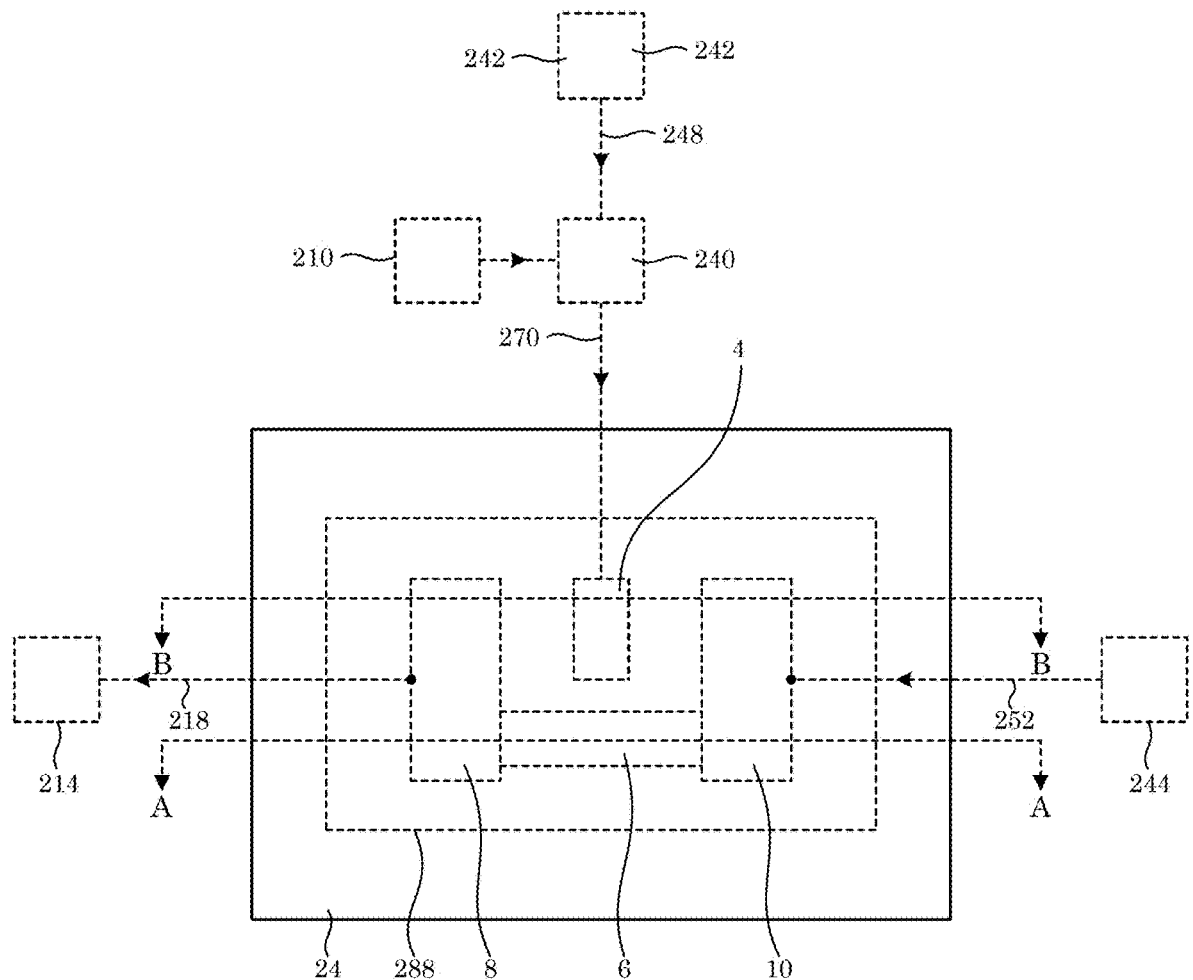
FIG. 14 shows a plan view of a dual gate field effect transistor.
Figure 15:
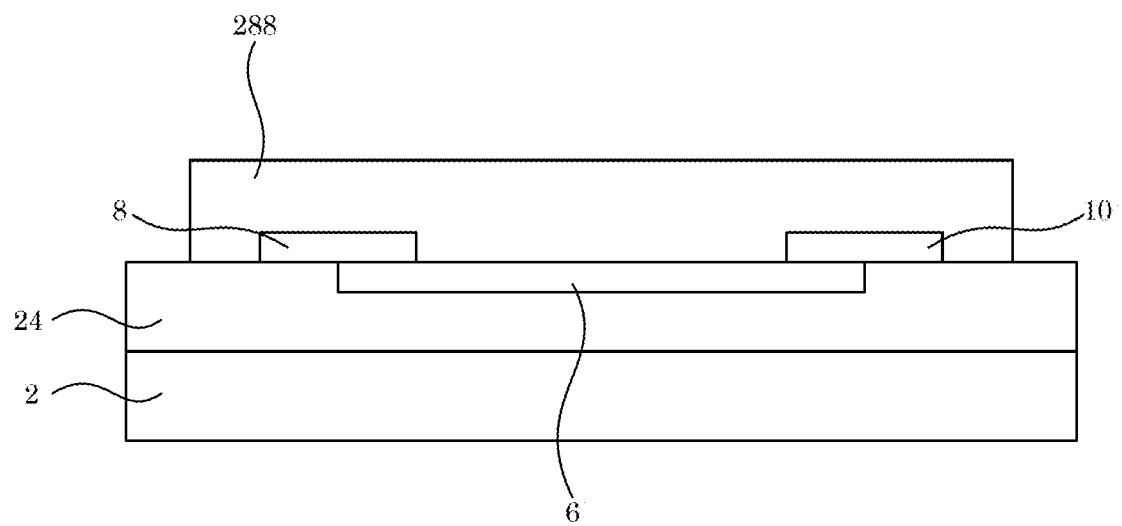
FIG. 15 shows a cross-section along line A-A of the dual gate field effect transistor shown in FIG. 14.
Figure 16:
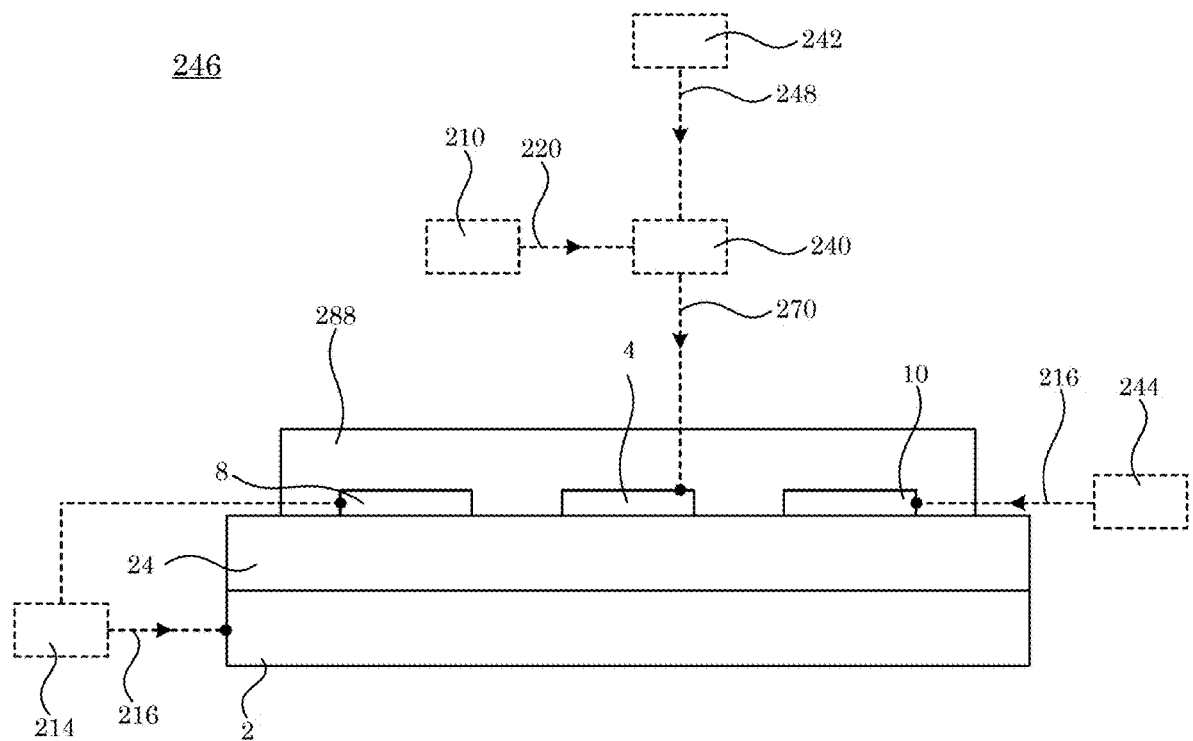
FIG. 16 shows a cross-section along line B-B of the dual gate field effect transistor shown in FIG. 14.
Figure 63:
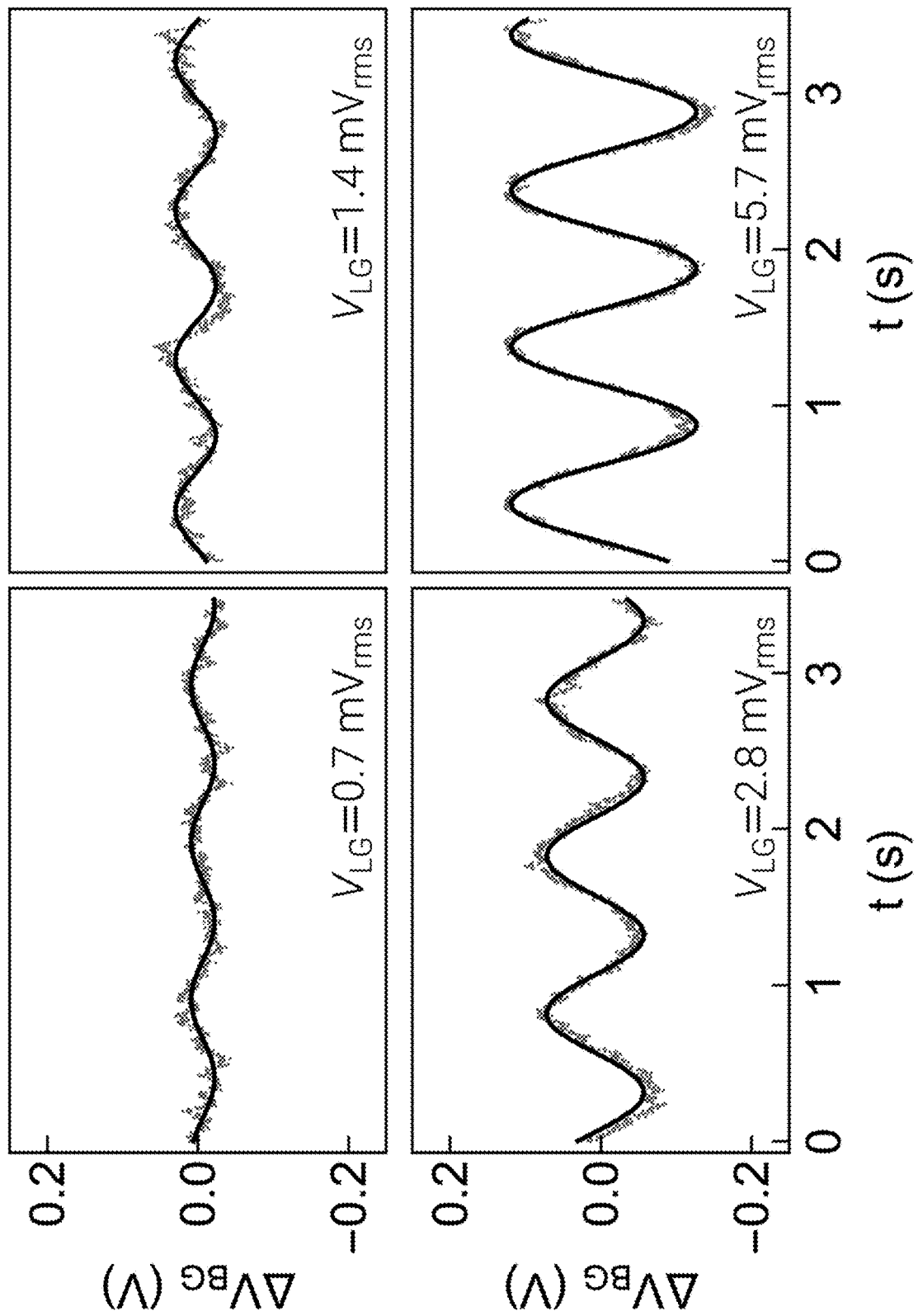
FIG. 63 shows a graphs of change of voltage versus time.
Figure 64:
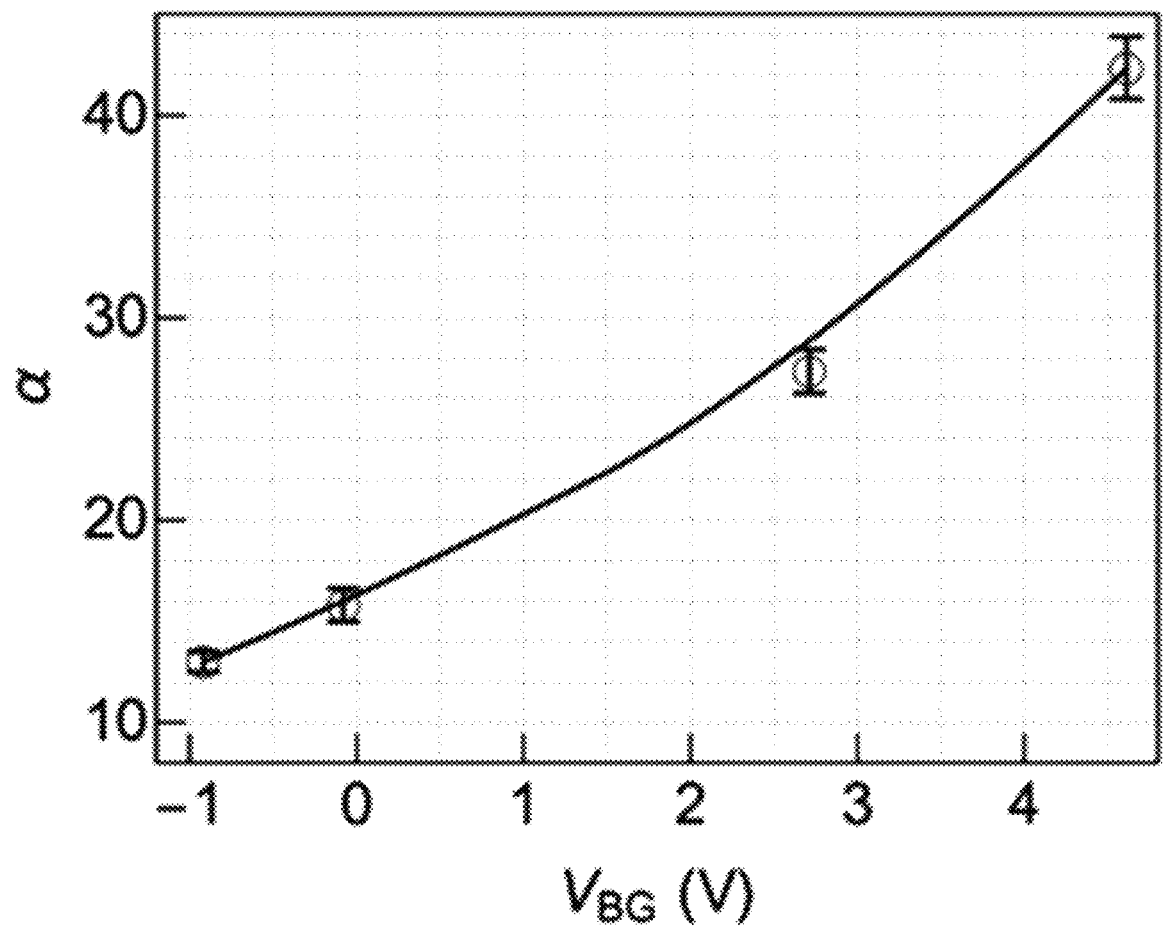
FIG. 64 shows a graph of change in signal amplification with back gate voltage of a dual gate field effect transistor.
Figure 65:
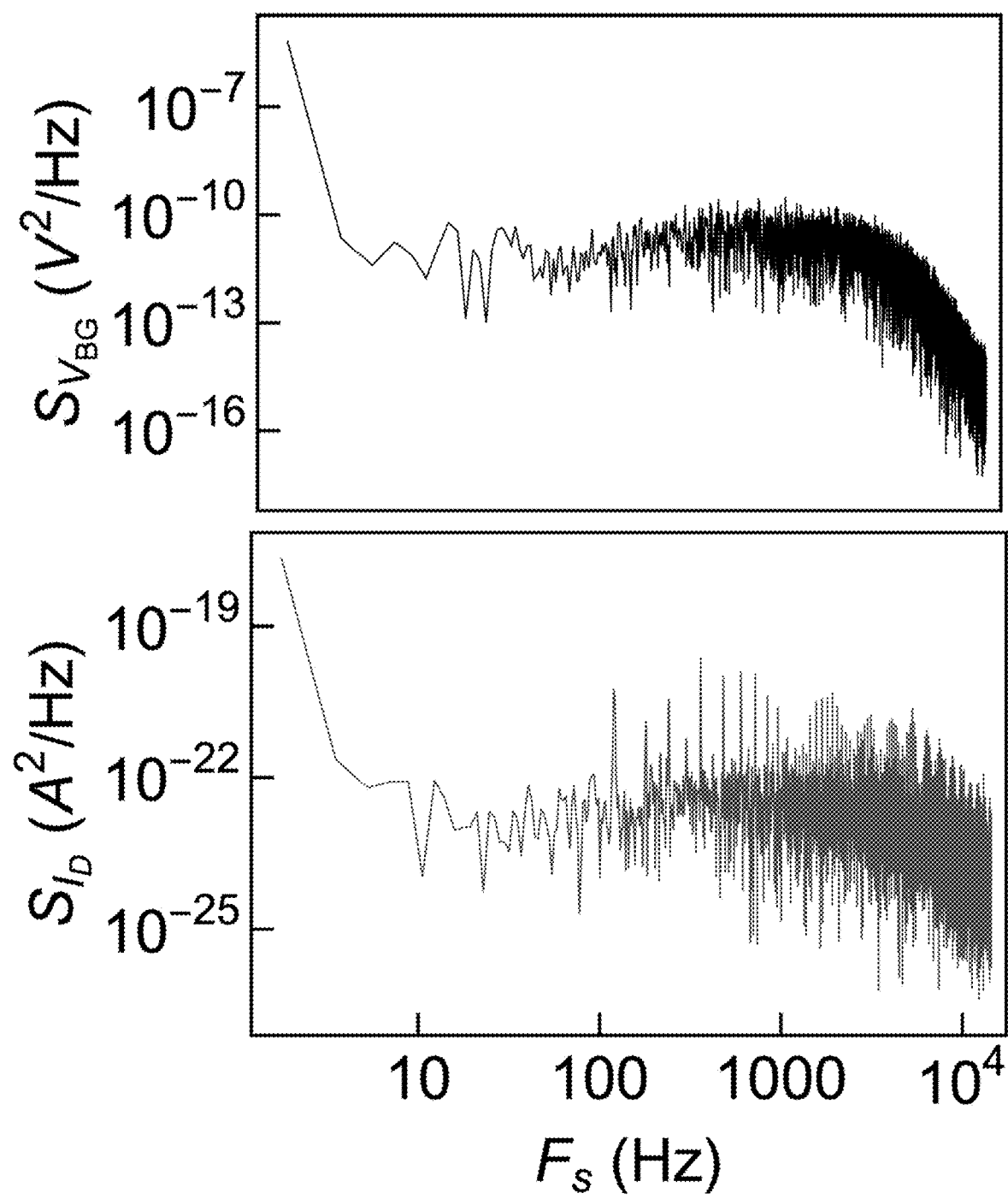
FIG. 65 shows graphs of noise versus frequency.
Figure 66:
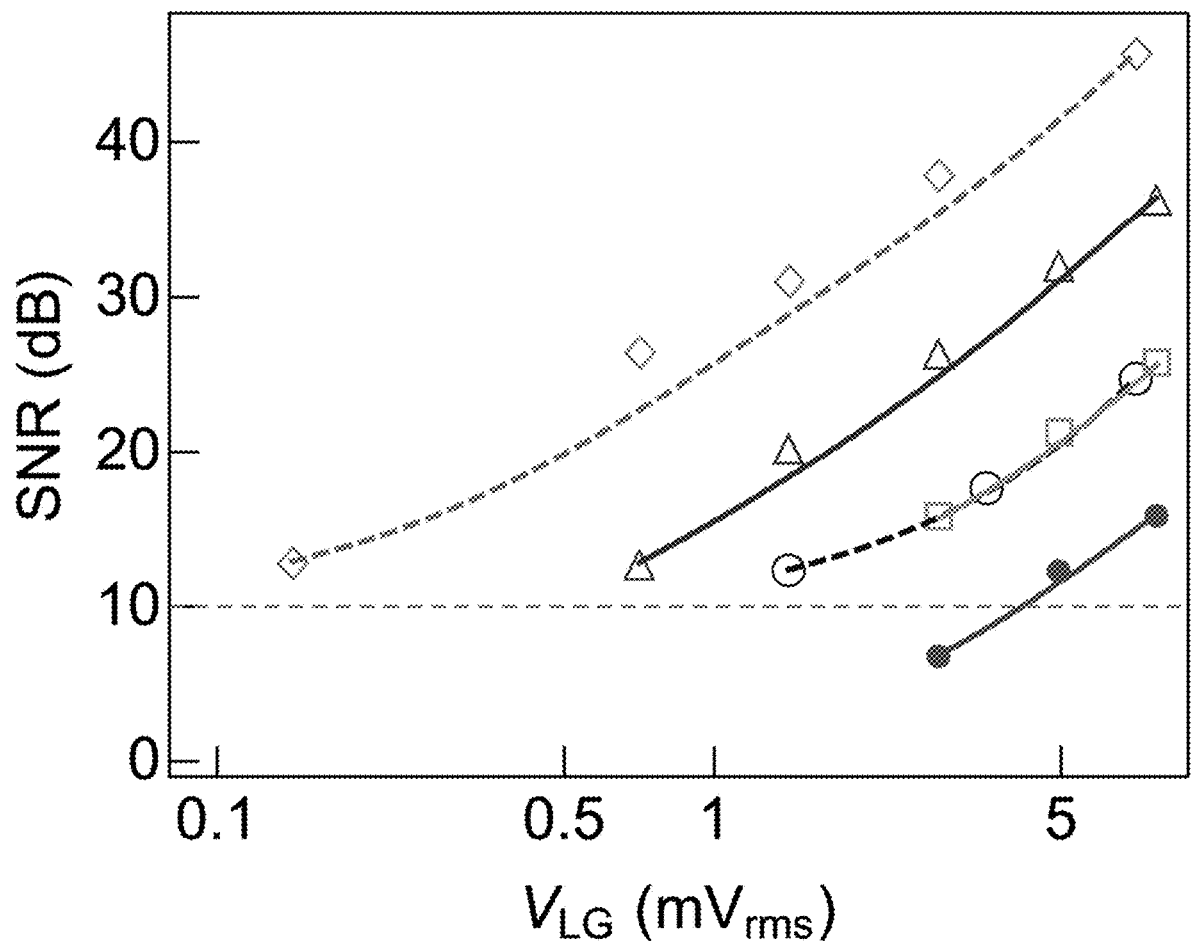
FIG. 66 shows a graph of signal-to-noise-reduction (SNR) versus voltage.

With reference to FIG. 9, FIG. 63, FIG. 64. FIG. 65, and FIG. 66, a constant current measurement of dual-gated ionic liquid gated field effect transistors (FET) was performed with the device shown in FIG. 9. The FETs were set up in a constant current mode using a proportional-integral-derivative (PID) controller. In this mode, ID was held constant by continually adjusting VBG in response to small changes in VLG. FIG. 63 shows response of VBG as a function of time is shown when a sine wave with a frequency of 1 Hz was applied to the ionic liquid gate under PID control. FIG. 64 shows amplification at the back gate (□) increased with the mean value of VBG, allowing the device gain to be smoothly tunable. FIG. 65 shows power spectral density of VBG under PD control and ID under open loop operation. FIG. 66 shows a comparison of the signal to noise ratio (SNR) as a function of VLG with varying sine wave amplitudes for devices operated under PID control and in open loop operation (solid grey line). Improvements in SNR under PID control were measured for devices fabricated with 300 nm SiO2 (solid lines) and 70 nm SiO2 (dashed lines).

Devices also were operated in a constant current closed-loop. Here, ionic liquid FETs were set up in a constant current mode using a proportional-integral-derivative (PID) controller as shown in FIG. 9. In this mode, $I_D$ was held constant by continually adjusting $V_{BG}$ in response to small changes in $V_{LG}$. PID performance was then compared with open loop operation where $I_D$ was recorded directly in response to changes in $V_{LG}$, and $V_{BG}$ connected to ground. The signal connected to the ionic liquid gate was switched between an arbitrary waveform generator to calibrate device performance and a biosensing element to measure pH. In both cases, a fixed DC offset voltage ($V_o$) was added to $V_{LG}$. A current preamplifier with a transimpedance gain of $10^6$ V/A was used to amplify $I_D$ prior to the controller input. The PID controller smoothly varied $V_{BG}$ to from −10 V to +10 V to maintain a root mean square (RMS) channel current of 100 nA and operate the device near peak transconductance ($g_{m,peak}$).

Device calibration was performed with a 1 Hz sine wave applied to the ionic liquid gate. FIG. 63 shows the change in $V_{BG}$ (1=300 nm) under PID control with $V_o$=−1.95 V for amplitudes of $V_{LG}$ ranging from 0.7 to 7.7 $mV_{rms}$, which resulted in $\alpha$=42. Tuning $V_o$ allowed sensitivity to be smoothly offset for dynamic range with the highest α realized when operating in the linear regime. The ability to change the device gain is shown in FIG. 64, where changing $V_o$ caused α to increase from 13±0.5 to 42±1.5 when t=300 nm or from 5±0.5 to 50±1.5 when t=70 nm. Thinner back gate oxides allow operation at lower voltages under PID control and enable the realization of α that approaches its theoretical limit. In the case of devices with t=300 nm, □□ can be increased even further up to 215 but involves high voltage operation.

To determine if the higher sensitivity, relative to dual-gate silicon devices, translates to an improved limit of detection, we measured the noise in $V_{BG}$ and $I_D$ as shown in FIG. 65. These measurements were then used to estimate the signal to noise ratio (SNR) of the FET in PID and open loop modes. FIG. 65 shows the power spectral density (PSD) of the back-gate voltage (top) under PID control (t=300 nm) and channel current (bottom) during open loop operation. The broadband noise was estimated by integrating the PSD from DC to the filter bandwidth of 5 kHz. Under PID control, $\delta V_{BG}=\sqrt{\int_{BW} S_{V_{BG}} df}$ was 5.8 $mV_{rms}$ (1=300 nm; FIG. 65 top) and 1.8 $mV_{rms}$ (t=70 nm) for the measured devices, decreasing as expected with the back gate oxide thickness. Channel current noise in the open loop case, $\delta I_D=\sqrt{\int_{BW} S_{I_D} df}$ was 700 $pA_{rms}$ (FIG. 65 bottom). The SNR was estimated with 20 $\log_{10}(V_{BG}/\delta V_{BG})$ under PID control and 20 $\log_{10}(I_d/\delta I_d)$ in open loop mode and is shown in FIG. 2e for devices with t=300 nm (solid lines) and t=70 nm (dashed lines). As seen from FIG. 66, SNR is considerably improved under PID control, from ≈3× (blue; α=13, t=300 nm) to ≈30× (green; α=50, t=70 nm) higher than open loop operation (gray). The order of magnitude improvement is in sharp contrast with silicon-based dual-gated FETs[1] where the change in SNR was invariant with α and can be attributed in part to the increased screening provided by the ionic liquid gate and due to suppression of low frequency noise by the PID controller. Back gate noise, $\delta V_{BG}$, for devices with t=300 nm and t=70 nm was found to scale by the ratio of their gate capacitances as is evident from FIG. 2e where the SNR for a FET with α=13 (t=300 nm) is comparable to that with α=5 (t=70 nm).

Figure 67:
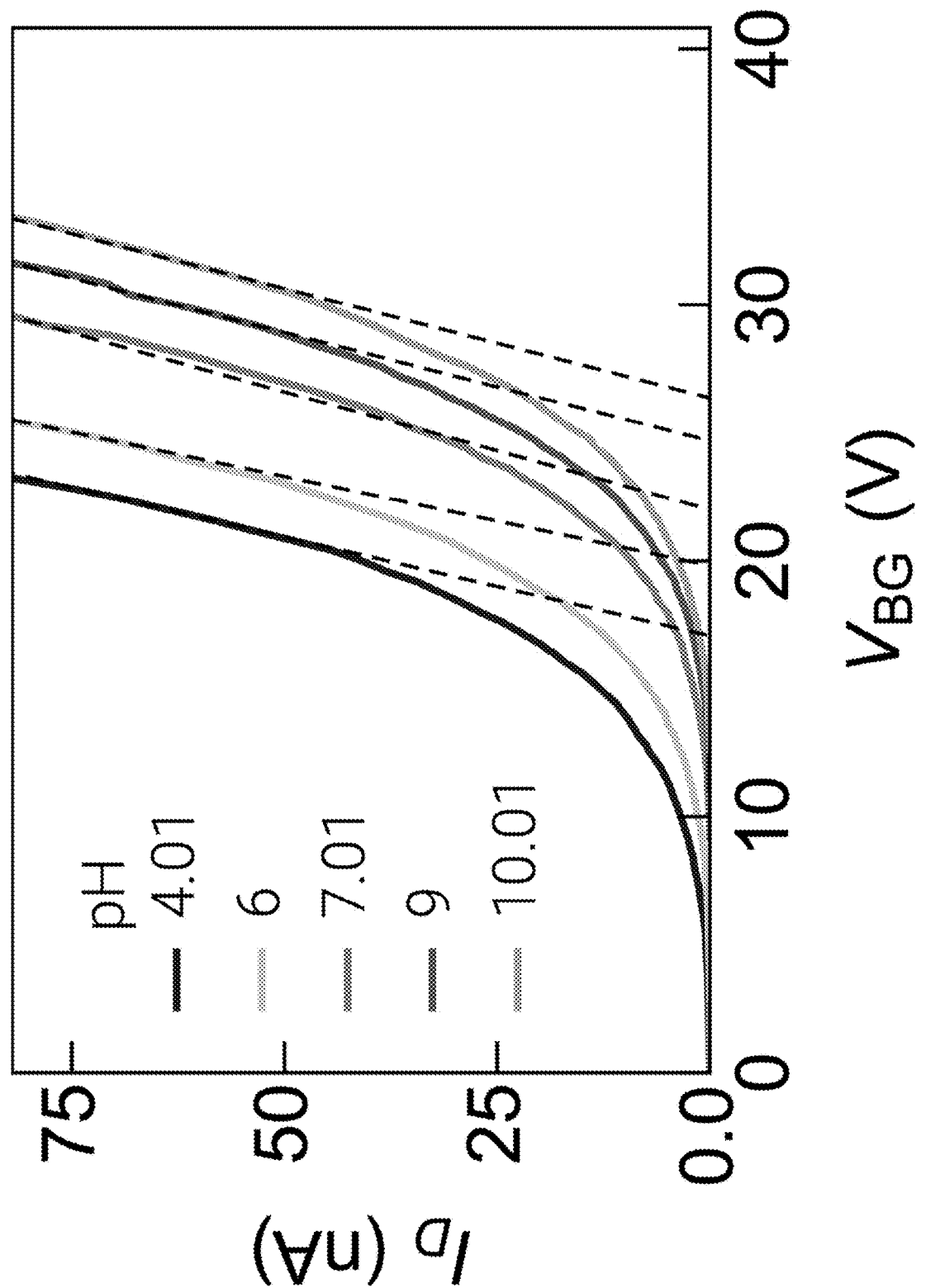
FIG. 67 shows a graph of current versus voltage.

With regard to ultrasensitive pH measurements, measurement of pH of buffered solution with high sensitivity was performed. FIG. 67 shows the effect of buffered standard pH solutions on $V_{t,BG}$ when measured with a sensor connected to the ionic liquid gate. Changes in $V_{LG}$ from the connected sensor resulted in large changes in $V_{t,BG}$ (FIG. 67) in a manner analogous to the electrical measurements described for FIG. 62. Using this behavior to sequentially measure standard buffer solutions resulted in a linear change in $V_{t,BG}$ as a function of the solution pH as seen from the FIG. 68. The measurements were repeated with two devices (t=300 n), each with a different intrinsic maximum α. Using a linear least-squares regression we estimated a sensitivity of 1.5 V/pH (FIG. 68), or ≈25× higher than the Nernst limit of 59 mV/pH at room temperature for the first device, and 4.4 V/pH, or ≈75× higher than the Nernst limit (FIG. 68) for the second. The measured sensitivity in each case was more than an order of magnitude higher than measurements with conventional nanowire FETs or asymmetric dual gated silicon FETs, allowing super Nernstian operation.

Figure 68:
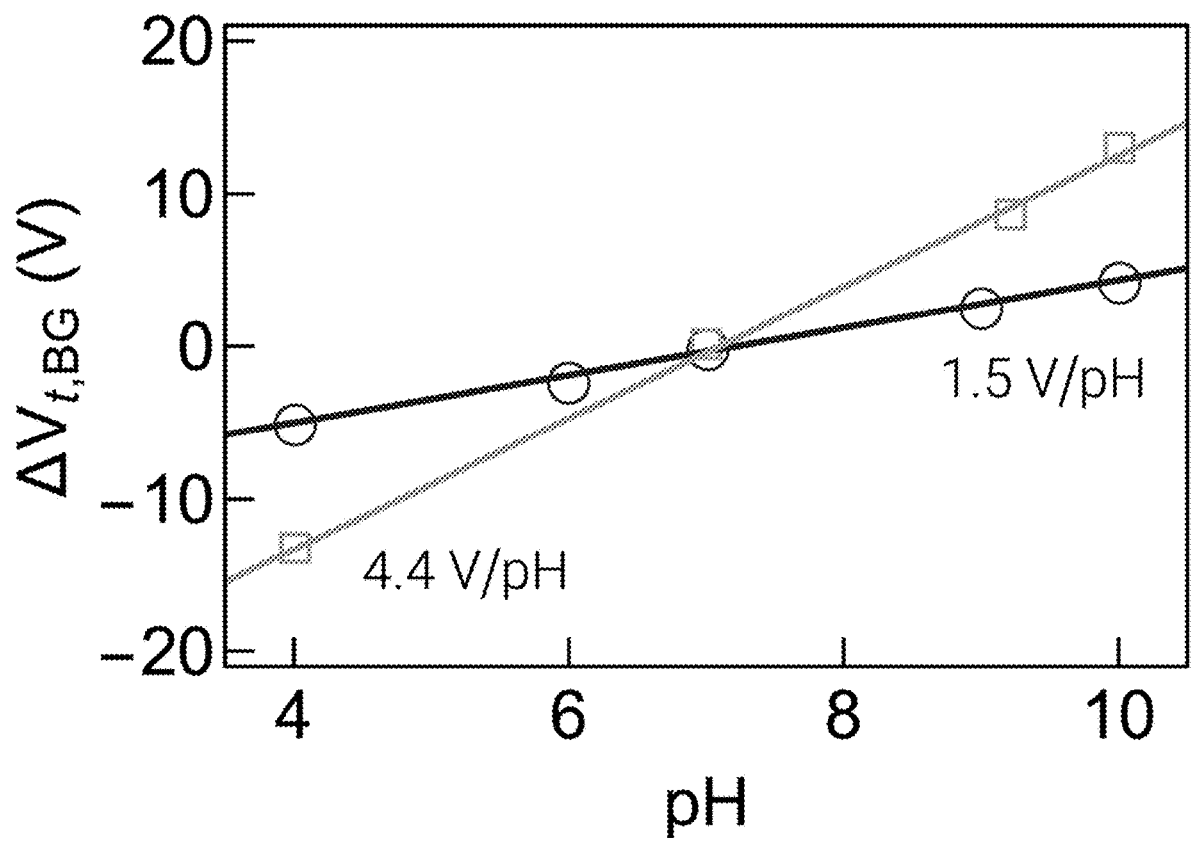
FIG. 68 shows a graph of change in voltage versus pH.
Figure 69:
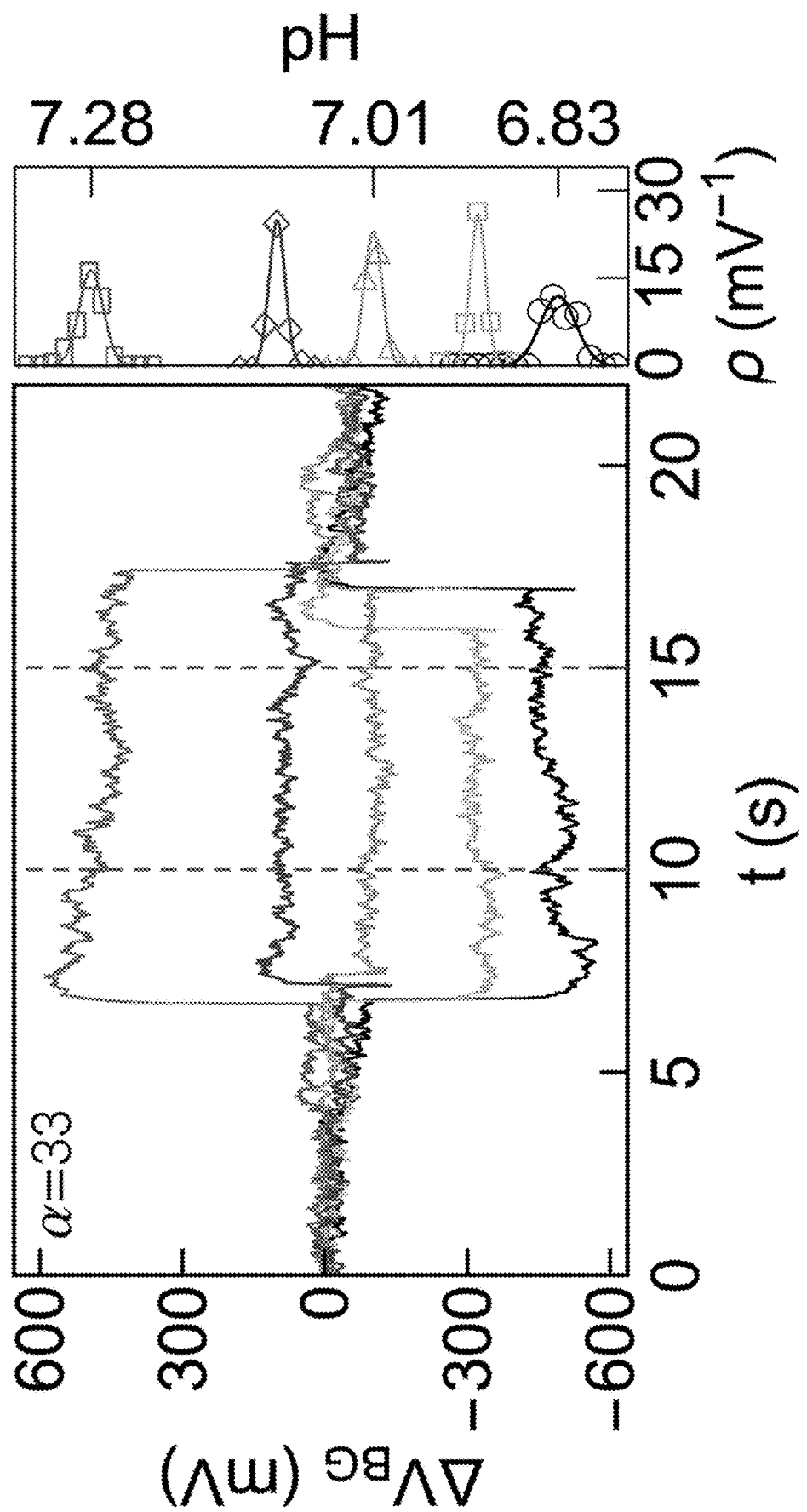
FIG. 69 shows a graph of change in voltage versus time.
Figure 70:
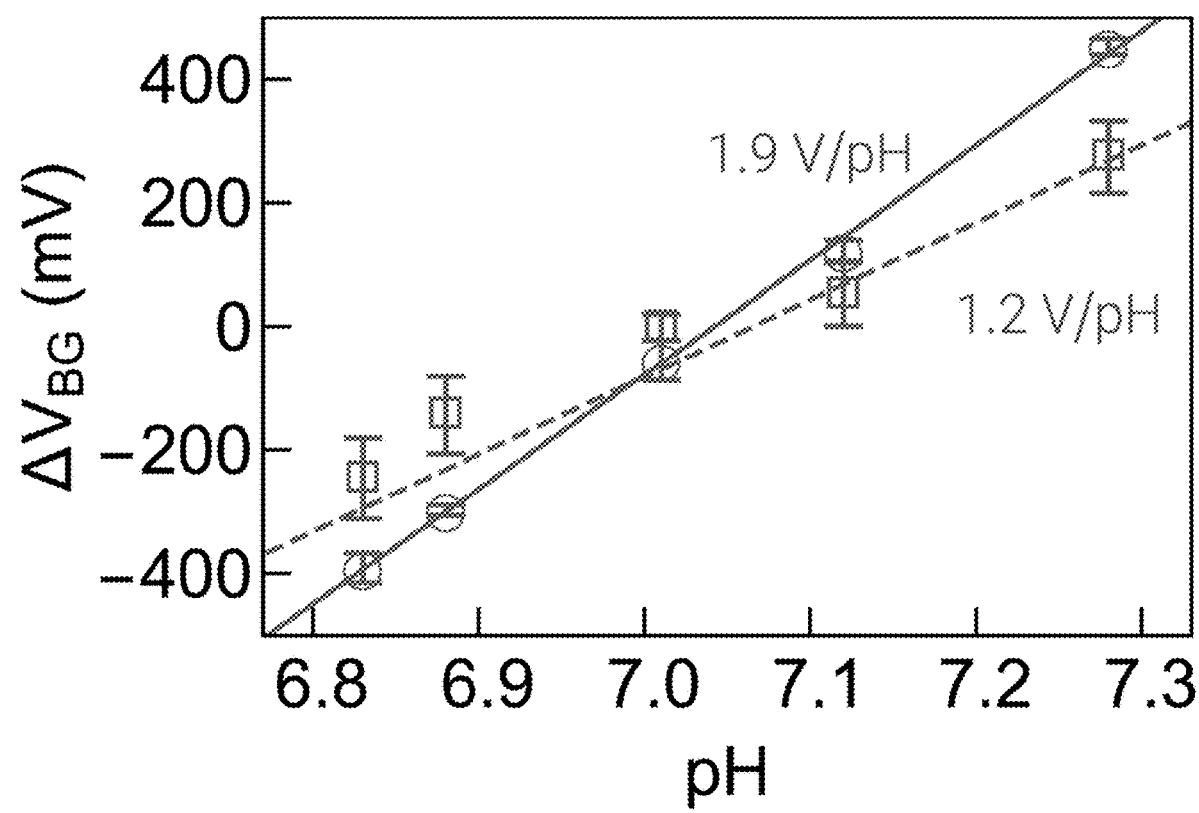
FIG. 70 shows a graph of change in voltage versus pH.
Figure 71:
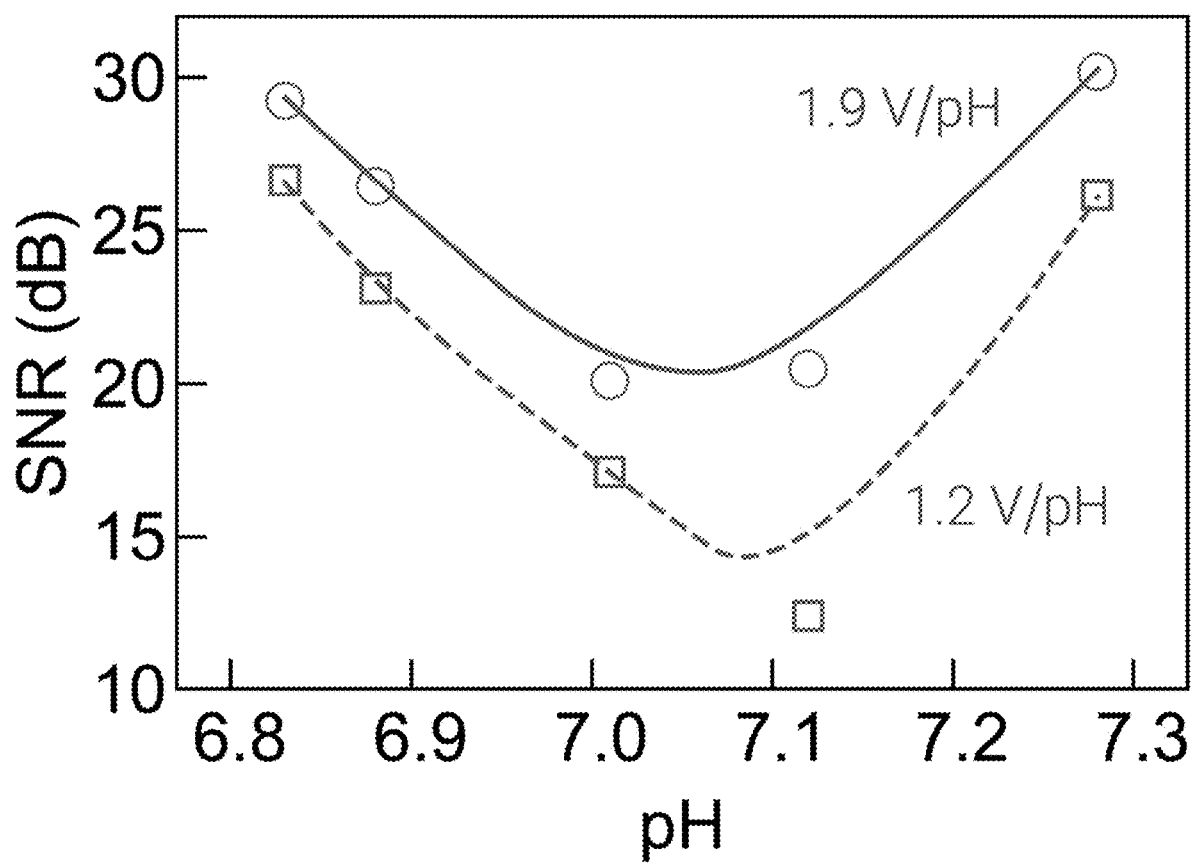
FIG. 71 shows a graph of signal-to-noise-reduction (SNR) versus voltage.

Ionic liquid transistor response to buffered pH solutions was measured. FIG. 67 shows a shift in the back gate threshold voltage was measured when the ionic liquid gate was used to sense the pH of a buffered electrolyte solution. Measurements were performed over a wide range of solution pH from 4.01 to 10.01. FIG. 68 shows a shift in the back gate threshold voltage (ΔVt,BG) against the solution pH showed a linear response. When using a 300 nm SiO2 back gate, the pH sensitivity was found to be as high as 4.4 V/pH. FIG. 69 shows at time-series measurement of the back-gate voltage (VBG) response to measurements of buffered pH solutions. The measurements were made by switching the liquid gate voltage (VBG) between ground and the pH buffer. FIG. 70 shows device response to varying pH buffer solutions for $\alpha=33$ (solid line) and $\alpha=20$ (dashed line) resulting in a sensitivity of 1.9 V/pH and 1.2 V/pH respectively. FIG. 71 shows SNR in each case was found to be lowest near neutral pH ($\approx 7$) and increased with $\alpha$.

Further, pH measurements were made under PID Control. The solution pH was also measured under PID control by setting $\alpha=33$ ($V_o=-1.5$ V). FIG. 69 (left) shows the time-series measurements of PBS buffer solutions with their pH adjusted between 6.83 and 7.28. A switch was used to alternatively connect the ionic liquid gate to the PBS solution and to ground. Relative to ground, the change in $V_{BG}$ was $-472\pm70$, $-313\pm30$, $-103\pm36$, $+88\pm32$ and $+459\pm48$ mV for pH values of 6.83, 6.88, 7.01, 7.12 and 7.28 respectively. A histogram was calculated using the time series as seen in FIG. 69 (right) to highlight the measurement resolution. Peak positions are reported with an expanded uncertainty, k=2. Measurement resolution was estimated from FIG. 69 (right) to be 0.01 pH units. An order of magnitude improvement in resolution over conventional results to 0.002 pH units was obtained when $\square$=50 (t=70 nm).

The sensitivity of the pH measurements under PID control was comparable to values obtained by estimating $V_{t,BG}$ in FIG. 68. FIG. 70 shows change in $V_{BG}$ as a function of the solution pH to estimate sensitivity. Measurements were made relative to pH 7 ($V_{LG}=0$ V); acidic pH resulted in $V_{LG}>0$ V and basic pH in $V_{LG}<0$ V. A linear least-squares fit to the data resulted in a sensitivity of 1.9 V/pH when $\square$=33. Similar to the calibration measurements, sensitivity can be tuned by varying $V_o$ and thereby alter $\square$. When $\square\square$ was set at 23 we obtained 1.2 V/pH (FIG. 70, dashed), which could allow measurements over a larger range. Contrary to previously reported measurements with dual-gate FETs, the higher sensitivity was accompanied by a lower overall limit of detection, which can be inferred from the SNR in FIG. 71. The broadband noise was estimated to be 5 $mV_{rms}$ from DC to 5 kHz (PSD not shown). The measurement SNR exhibited a minima near pH 7 as seen from FIG. 71 for both the high sensitivity (1.9 V/pH) and low sensitivity (1.2 V/pH) measurements. As seen from the figure, the measured SNR was lowest at pH 7.01 pH units, relative to 7, and found to be >20 dB (1.9 V/pH) and $\approx$17 dB (1.2 V/pH). The limit of detection is much lower at 0.003 pH units at 10 dB or an order of magnitude better than conventional devices.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

Reference throughout this specification to "one embodiment," "particular embodiment," "certain embodiment," "an embodiment," or the like means that a particular feature, structure, or characteristic described in connection with the embodiment is included in at least one embodiment. Thus, appearances of these phrases (e.g., "in one embodiment" or "in an embodiment") throughout this specification are not necessarily all referring to the same embodiment, but may. Furthermore, particular features, structures, or characteristics may be combined in any suitable manner, as would be apparent to one of ordinary skill in the art from this disclosure, in one or more embodiments.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." Further, the conjunction "or" is used to link objects of a list or alternatives and is not disjunctive; rather the elements can be used separately or can be combined together under appropriate circumstances. It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

What is claimed is:

1. A process for sensing a charged analyte with a charge detector, the process comprising:
    contacting a charge sensor of the charge detector with the charged analyte;
    producing, by the charge sensor, a charge signal;
    communicating the charge signal from the charge sensor to a transducer of the charge detector;
    receiving, by the transducer, the charge signal from the charge sensor;
    receiving, by the transducer, a feedback control signal from a sensitivity controller of the transducer;
    producing, by the transducer, a transduction signal in response to receipt of the charge signal;
    receiving, by the sensitivity controller, the transduction signal from the transducer;
    producing, by the sensitivity controller, a charge readout in response to receipt of the transduction signal;
    receiving the charge signal by an adder of the charge detector;
    receiving a gate voltage by the adder;
    producing a sum voltage from the charge signal and the gate voltage;
    receiving, by a dual gate field effect transistor of the charge detector, the sum voltage from the adder;
    receiving a drain voltage by the dual gate field effect transistor;

receiving, by the dual gate field effect transistor, the feedback control signal from the sensitivity controller;

producing, by the dual gate field effect transistor, the transduction signal from the sum voltage based on the feedback control signal;

receiving the transduction signal by a current preamplifier of the charge detector;

producing a process signal by the current preamplifier from the transduction signal;

receiving, by a control loop feedback device of the charge detector, the process signal;

receiving, by the control loop feedback device, a hold signal;

producing, by the control loop feedback device, the feedback control signal, based on the process signal and the hold signal;

producing, by the control loop feedback device, the charge readout based on the charge signal produced from contact by the charged analyte with a sensing electrode of the charge detector; and receiving, by the dual gate field effect transistor, the feedback control signal from the control loop feedback device to sense the charged analyte.

2. The process for sensing a charged analyte of claim 1, further comprising:
receiving the transduction signal by a phase-sensitive detector;
producing a process signal by the phase-sensitive detector from the transduction signal;
producing a phase signal by the phase-sensitive detector;
receiving, by a control loop feedback device, the process signal from the phase-sensitive detector and a hold signal;
producing, by the control loop feedback device, a controller signal from the process signal and the hold signal;
receiving, by an adder, the phase signal and the controller signal;
producing, the adder, the feedback control signal from the phase signal and the controller signal; and
receiving, by the dual gate field effect transistor, the feedback control signal from the adder.

3. The process for sensing a charged analyte of claim 1, further comprising:
disposing an ionic liquid on a control gate of a dual gate field effect transistor of the transducer.

4. A charge detector for operating a dual gate field effect transistor at a quantum capacitance limit to perform ultrasensitive biosensing, the charge detector comprising:
a charge sensor that senses a charged analyte and produces a charge signal in response to contact with the charged analyte, the charge sensor comprising an electrical circuit that comprises:
a sensing electrode in communication with a transducer and that produces the charge signal; and
a reference electrode by which sensing electrode is electrically referenced and that receives a reference potential;
the transducer in electrical communication with the charge sensor and that:
receives the charge signal from the charge sensor;
receives a feedback control signal; and
produces a transduction signal in response to receipt of the charge signal and the feedback control signal, the transducer comprising:
an adder in electrical communication with the charge sensor and that: receives the charge signal; receives a gate voltage; and produces a sum voltage from the charge signal and the gate voltage; and
the dual gate field effect transistor in electrical communication with the adder and that: receives the sum voltage from the adder; receives a drain voltage; receives the feedback control signal from a sensitivity controller; and produces the transduction signal from the sum voltage, the drain voltage, and the feedback control signal;
the dual gate field effect transistor comprising:
an analyte gate;
a two-dimensional active layer disposed on the analyte gate;
a source electrode disposed on the two-dimensional active layer and in electrical communication with the two-dimensional active layer;
a drain electrode disposed on the two-dimensional active layer and in electrical communication with the two-dimensional active layer and in electrical communication with the source electrode via the two-dimensional active layer; and
a control gate disposed on the two-dimensional active layer and controlling the communication of electrical current in the two-dimensional active layer between the source electrode and the drain electrode,
such that the sensing electrode and the reference electrode of the charge sensor are different structural elements than the analyte gate, the two-dimensional active layer, the source electrode, the drain electrode, and the control gate of the dual gate field effect transistor,
wherein the electrical current communicated in the two-dimensional active layer is changed in response to a change the sum voltage due to a change in a presence of the charged analyte at the sensing electrode; and
the sensitivity controller in electrical communication with the transducer and that:
receives the transduction signal from the transducer;
produces the feedback control signal in response to receipt of the transduction signal from the transducer; and
produces a charge readout in response to receipt of the transduction signal from the transducer.

5. The charge detector of claim 4, wherein the charge sensor further comprises:
a high impedance amplifier in communication with sensing electrode and the transducer and that:
receives the charge signal from the sensing electrode;
produces the charge signal; and
communicates the charge signal to the transducer.

6. The charge detector of claim 4, wherein the charge sensor further comprises:
a microfluidic chamber in which the sensing electrode and the reference electrode are disposed and that comprises:
a chamber wall that bounds a microfluidic well in which an inlet port and an outlet port are disposed such that microfluidic chamber receives a microfluidic flow of the charged analyte.

7. The charge detector of claim 4, wherein the transducer further comprises:
a gate voltage source that produces the gate voltage that is communicated to the adder; and
a drain voltage source that produces the drain voltage.

8. The charge detector of claim 4, wherein the dual gate field effect transistor further comprises:

an ionic liquid in electrical communication with the source electrode, the control gate, and the drain electrode, wherein the ionic liquid is disposed on the source electrode, the control gate, and the drain electrode.

9. The charge detector of claim 4, wherein the sensitivity controller comprises:
a control loop feedback device in electrical communication with a dual gate field effect transistor of the transducer and that:
receives a process signal that is based on the transduction signal;
receives a hold signal;
produces the feedback control signal based on the process signal and the hold signal; and
produces the charge readout from the transduction signal based on the process signal.

10. The charge detector of claim 9, wherein the sensitivity controller further comprises:
a phase-sensitive detector in electrical communication with the transducer and the control loop feedback device and electrically interposed between the transducer and the control loop feedback device and that:
receives the transduction signal;
produces the process signal from the transduction signal; and
produces a phase signal; and
an adder in electrical communication with the phase-sensitive detector and that receives the phase signal from the phase-sensitive detector.

11. The charge detector of claim 10, wherein the adder is in electrical communication with the dual gate field effect transistor of the transducer and in electrical communication with the control loop feedback device, and
the adder produces the feedback control signal from the phase signal and from a controller signal received from the control loop feedback device and communicates the feedback control signal to the transducer.

12. The charge detector of claim 10, wherein the adder is in electrical communication with the dual gate field effect transistor of the transducer and in electrical communication with the control loop feedback device, and
the adder produces the feedback control signal from the phase signal and from a controller signal received from the control loop feedback device and communicates the feedback control signal to the transducer.

13. The charge detector of claim 9, wherein the sensitivity controller further comprises:
a phase-sensitive detector in electrical communication with the transducer and the control loop feedback device and electrically interposed between the transducer and the control loop feedback device and that:
receives the transduction signal;
produces the process signal from the transduction signal; and
produces a phase signal; and
wherein the transducer further comprises an adder in electrical communication with the phase-sensitive detector and that:
receives the phase signal from the phase-sensitive detector; and
produces a drain voltage from the phase signal.

14. The charge detector of claim 4, wherein the two-dimensional active layer of the dual gate field effect transistor comprises a transition metal dichalcogenide, black phosphorous, graphene oxide, indium selenide, or silecene.

\* \* \* \* \*